US010115681B1

(12) United States Patent
Ariyoshi

(10) Patent No.: US 10,115,681 B1
(45) Date of Patent: Oct. 30, 2018

(54) COMPACT THREE-DIMENSIONAL MEMORY DEVICE HAVING A SEAL RING AND METHODS OF MANUFACTURING THE SAME

(71) Applicant: SANDISK TECHNOLOGIES LLC, Plano, TX (US)

(72) Inventor: Junichi Ariyoshi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/928,337

(22) Filed: Mar. 22, 2018

(51) Int. Cl.
| | |
|---|---|
| H01L 23/00 | (2006.01) |
| H01L 27/11524 | (2017.01) |
| H01L 27/11556 | (2017.01) |
| H01L 27/11529 | (2017.01) |
| H01L 27/1157 | (2017.01) |
| H01L 21/768 | (2006.01) |
| H01L 27/11573 | (2017.01) |

(Continued)

(52) U.S. Cl.
CPC ...... H01L 23/564 (2013.01); H01L 21/76816 (2013.01); H01L 21/76877 (2013.01); H01L 23/528 (2013.01); H01L 23/5226 (2013.01); H01L 23/585 (2013.01); H01L 27/1157 (2013.01); H01L 27/11524 (2013.01); H01L 27/11529 (2013.01); H01L 27/11556 (2013.01); H01L 27/11573 (2013.01); H01L 27/11582 (2013.01)

(58) Field of Classification Search
CPC .............. H01L 23/564; H01L 21/76877; H01L 23/585; H01L 23/5226; H01L 23/528; H01L 27/11582; H01L 21/76816; H01L 27/1157; H01L 27/11529; H01L 27/11556; H01L 27/11524; H01L 27/11573

See application file for complete search history.

(56) References Cited

U.S. PATENT DOCUMENTS

| | | | |
|---|---|---|---|
| 5,915,167 A | 6/1999 | Leedy | |
| 8,933,502 B2 * | 1/2015 | Higashitani | ....... H01L 27/11519 257/326 |

(Continued)

OTHER PUBLICATIONS

International Application No. PCT/US2017/017403, International Search Report and Written Opinion, dated Jul. 20, 2017, 22pgs.

(Continued)

*Primary Examiner* — William Coleman
(74) *Attorney, Agent, or Firm* — The Marbury Law Group PLLC

(57) ABSTRACT

A semiconductor die includes a pair of first alternating stacks of first portions of insulating layers and electrically conductive layers located over a semiconductor substrate, groups of memory stack structures vertically extending through a respective one of the pair of the first alternating stacks, a pair of second alternating stacks of second portions of the insulating layers and dielectric material layers laterally adjoined to a respective one of the first alternating stacks, such that each second portion of the insulating layers is connected to a respective one of the first portions of the insulating layers, and at least one seal ring structure laterally enclosing, and laterally spaced from, the pair of first alternating stacks, and contacting at least a first sidewall of each of the pair of second alternating stacks.

20 Claims, 57 Drawing Sheets

(51) Int. Cl.
*H01L 23/528* (2006.01)
*H01L 23/522* (2006.01)
*H01L 23/58* (2006.01)
*H01L 27/11582* (2017.01)

(56) References Cited

U.S. PATENT DOCUMENTS

| | | |
|---|---|---|
| 9,224,747 B2 | 12/2015 | Mizutani et al. |
| 9,230,987 B2 * | 1/2016 | Pachamuthu ..... H01L 27/11582 |
| 9,236,392 B1 | 1/2016 | Izumi et al. |
| 9,589,981 B2 | 3/2017 | Nishikawa et al. |
| 9,646,981 B2 | 5/2017 | Nishikawa et al. |
| 9,799,670 B2 | 10/2017 | Nishikawa et al. |
| 9,831,266 B2 | 11/2017 | Kai et al. |
| 9,917,100 B2 | 3/2018 | Zhang et al. |
| 10,014,292 B2 * | 7/2018 | Or-Bach ............. H01L 27/0688 |
| 2011/0312174 A1 | 12/2011 | Lee et al. |
| 2011/0316072 A1 | 12/2011 | Lee |
| 2012/0168858 A1 | 7/2012 | Hong |
| 2013/0056816 A1 | 3/2013 | Iwase et al. |
| 2014/0061748 A1 | 3/2014 | Lee |
| 2015/0236038 A1 | 8/2015 | Pachamuthu et al. |
| 2015/0372000 A1 | 12/2015 | Jee et al. |
| 2017/0236746 A1 | 8/2017 | Yu et al. |
| 2017/0236835 A1 | 8/2017 | Nakamura et al. |

OTHER PUBLICATIONS

U.S. Appl. No. 15/458,200, filed Mar. 14, 2017, SanDisk Technologies LLC.
U.S. Appl. No. 15/458,269, filed Mar. 14, 2017, SanDisk Technologies LLC.
U.S. Appl. No. 15/458,272, filed Mar. 14, 2017, SanDisk Technologies LLC.
U.S. Appl. No. 15/581,575, filed Apr. 28, 2017, SanDisk Technologies LLC.
U.S. Appl. No. 15/605,204, filed May 25, 2017, SanDisk Technologies LLC.
U.S. Appl. No. 15/626,444, filed Jun. 19, 2017, SanDisk Technologies LLC.
U.S. Appl. No. 15/633,131, filed Jun. 26, 2017, SanDisk Technologies LLC.
U.S. Appl. No. 15/638,672, filed Jun. 30, 2017, SanDisk Technologies LLC.
U.S. Appl. No. 15/669,243, filed Aug. 4, 2017, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.

* cited by examiner

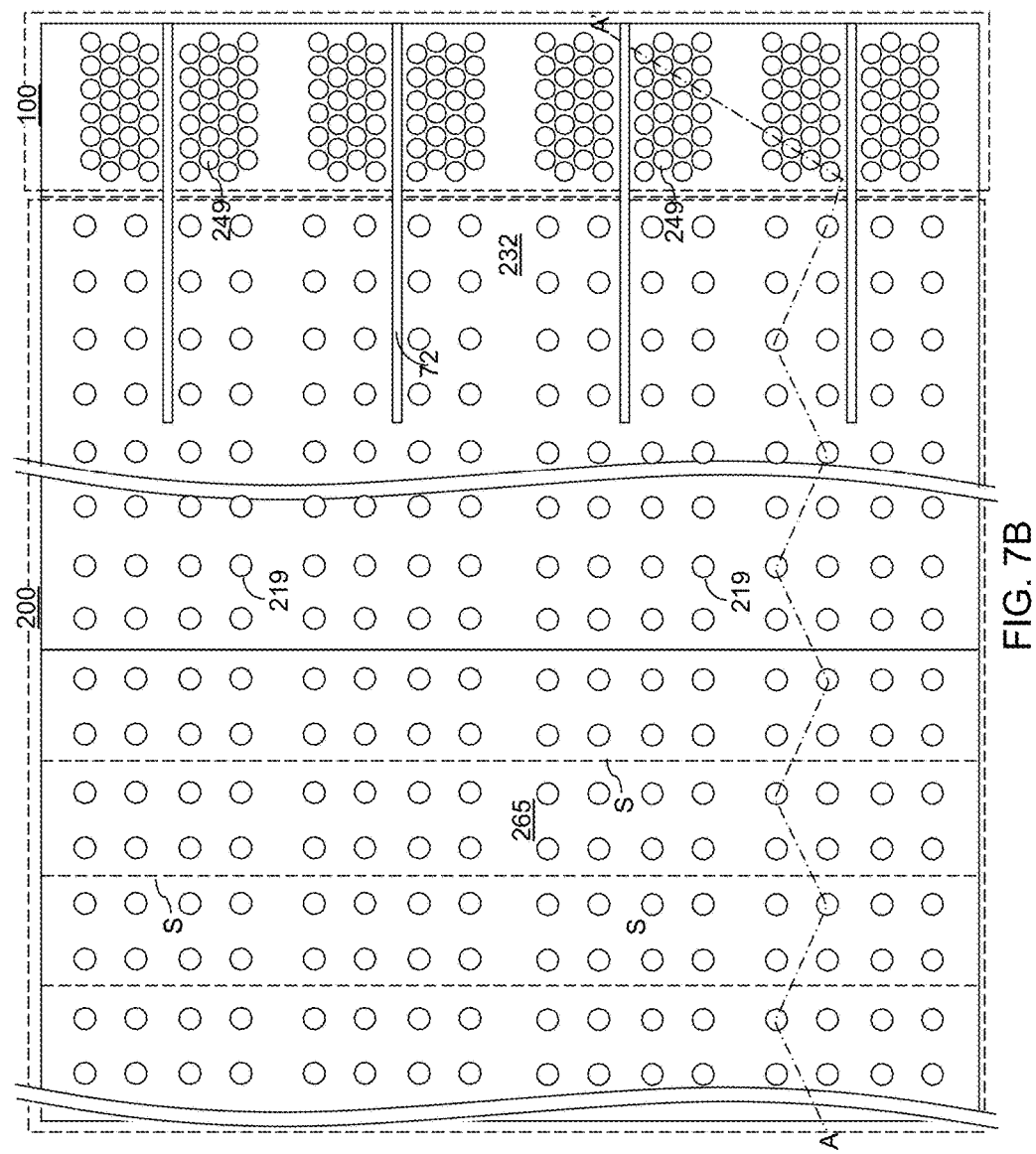

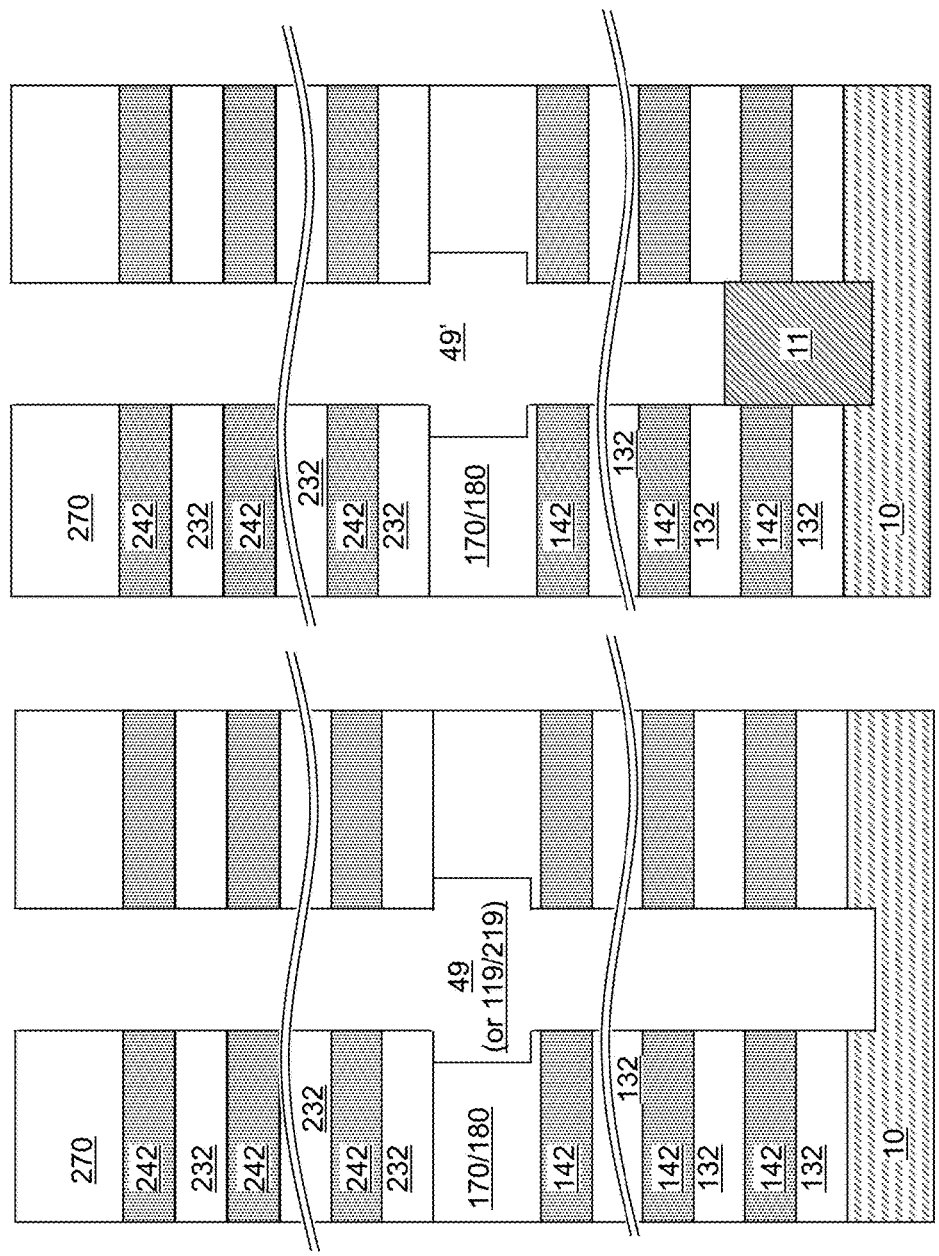

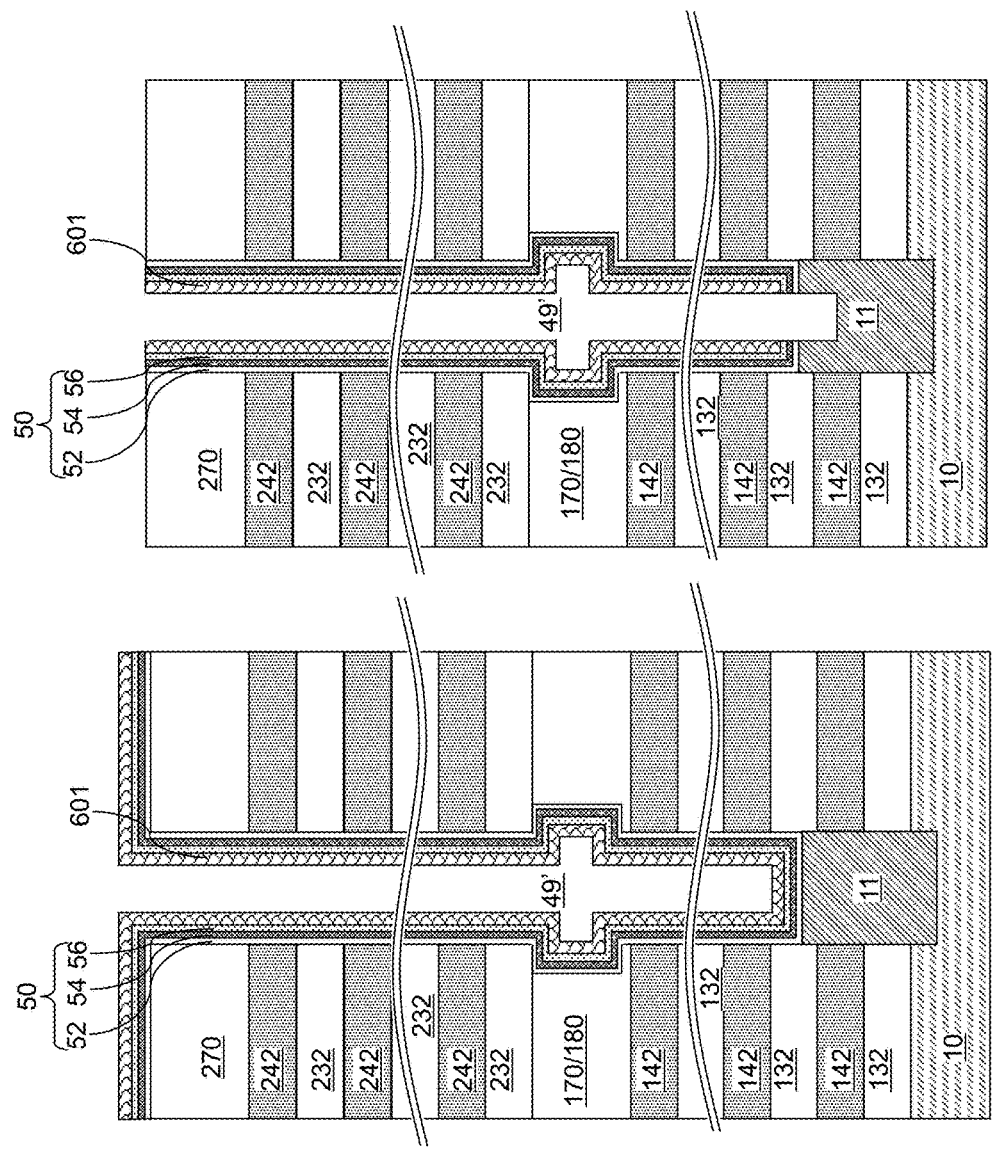

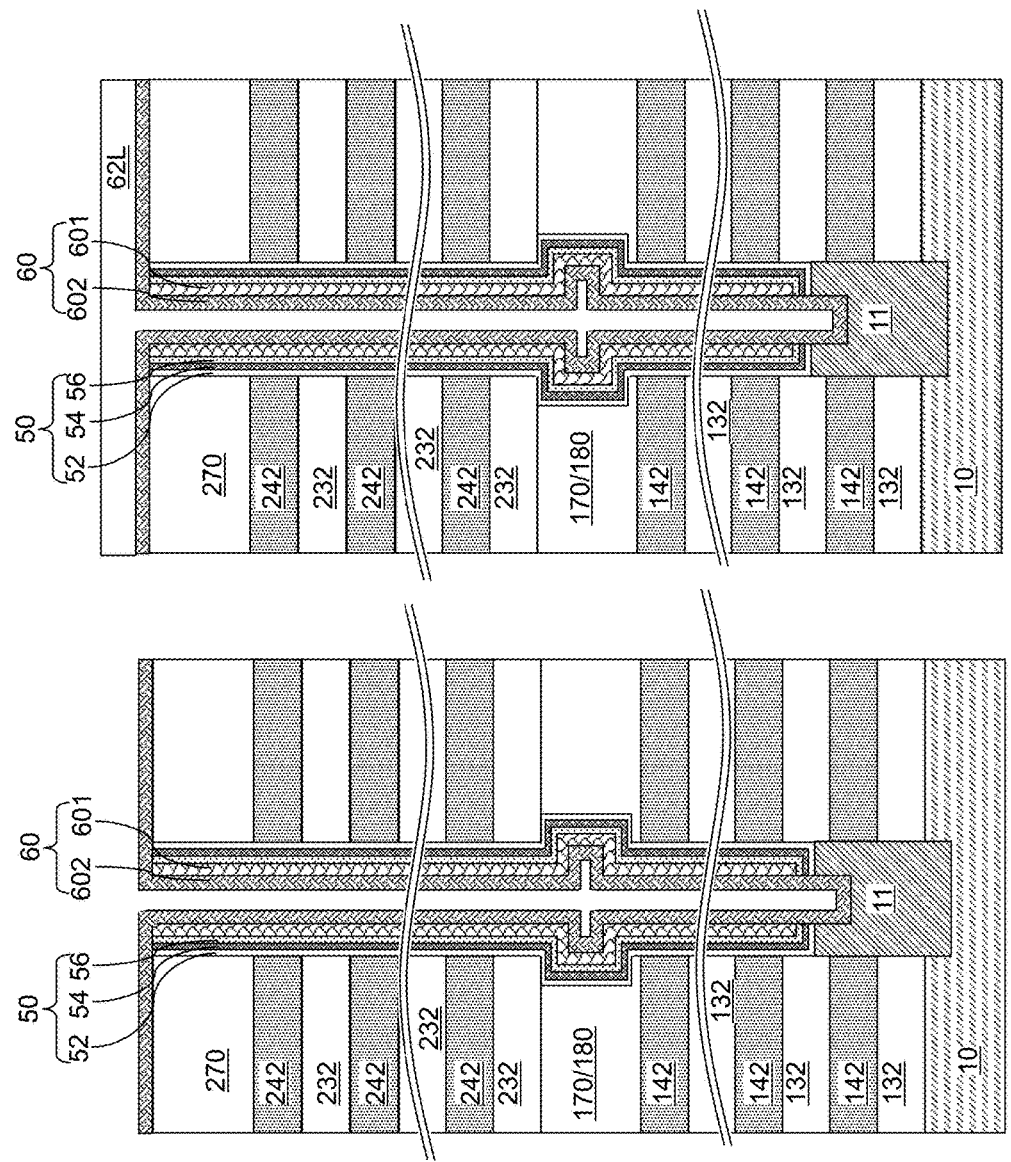

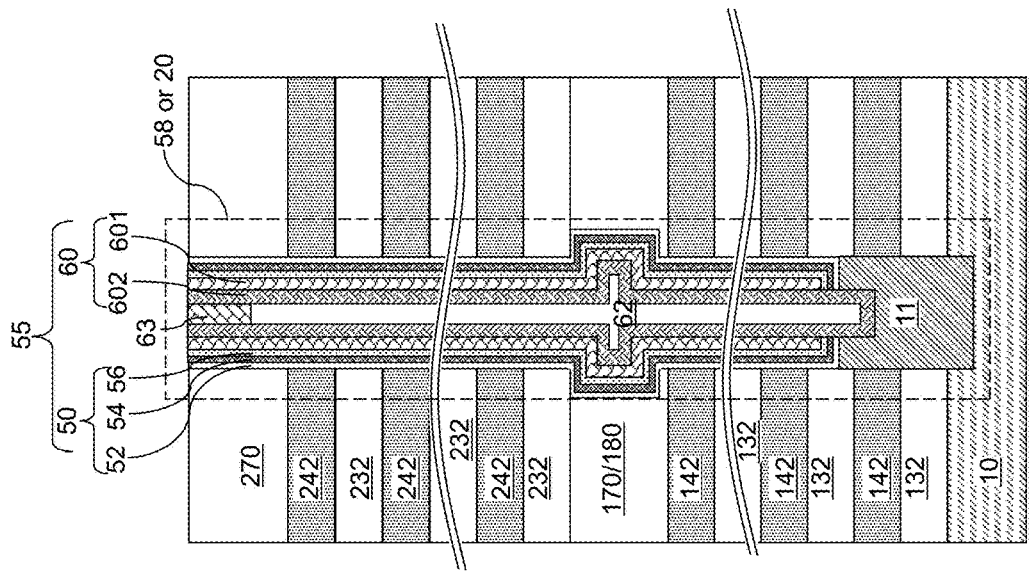
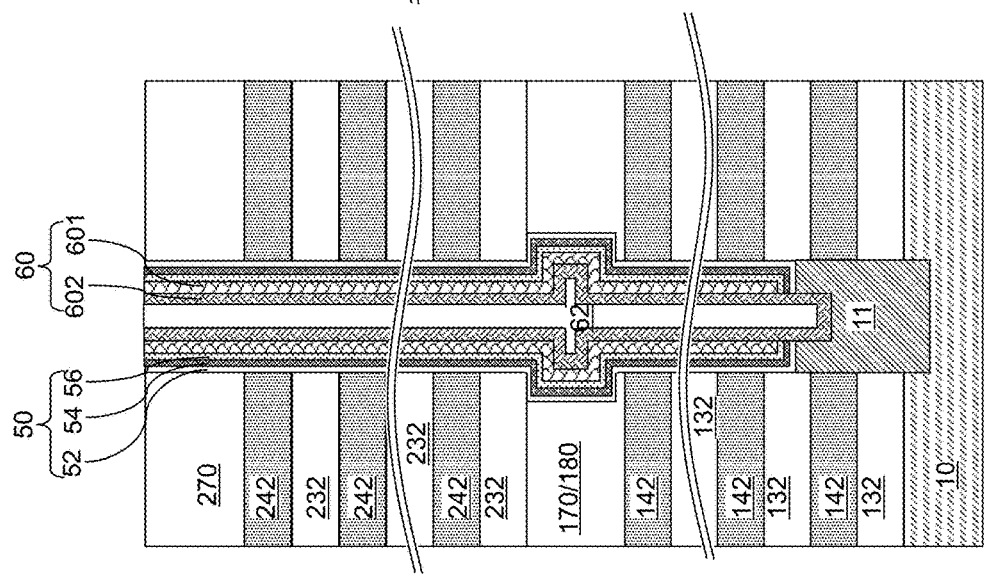

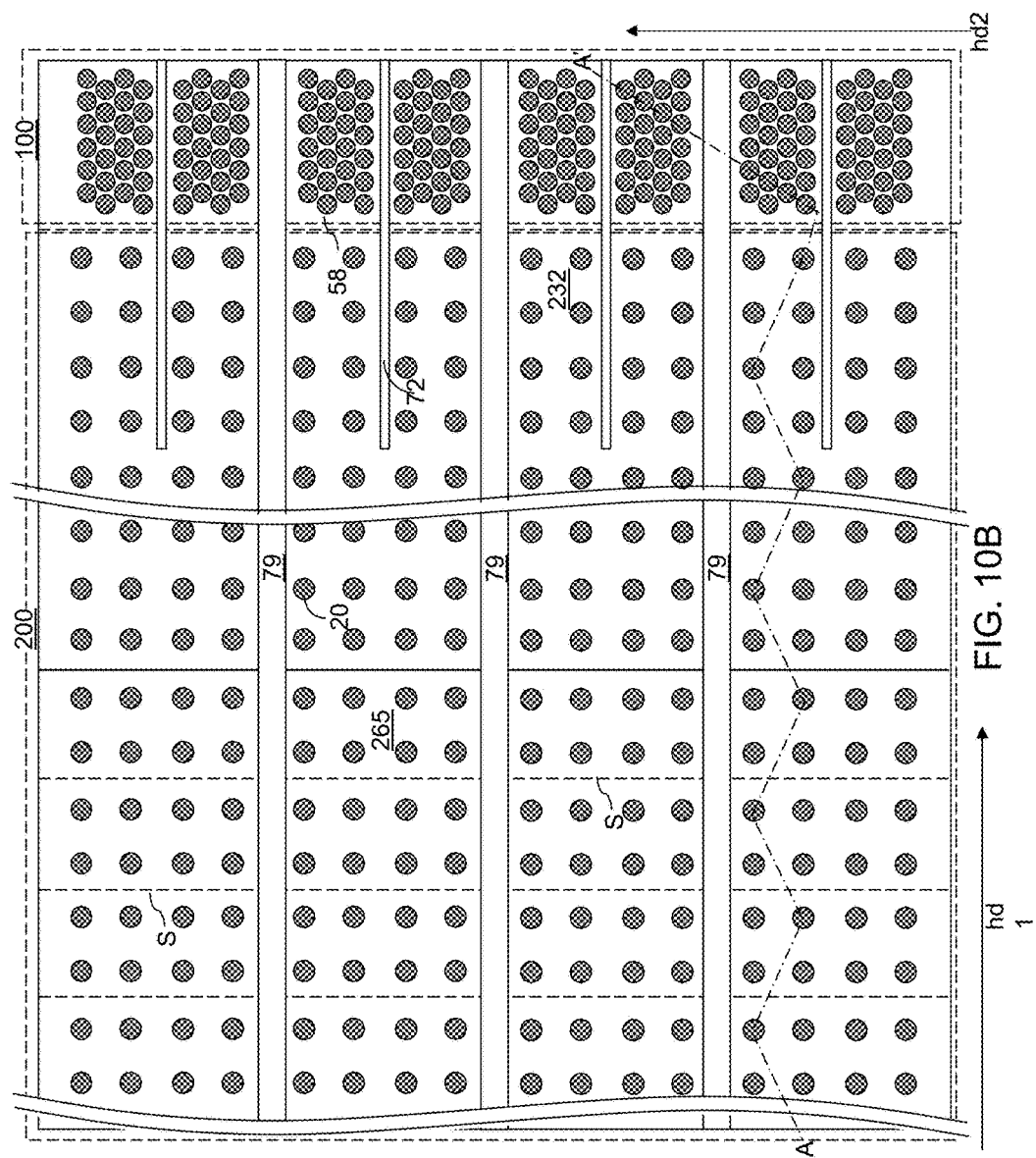

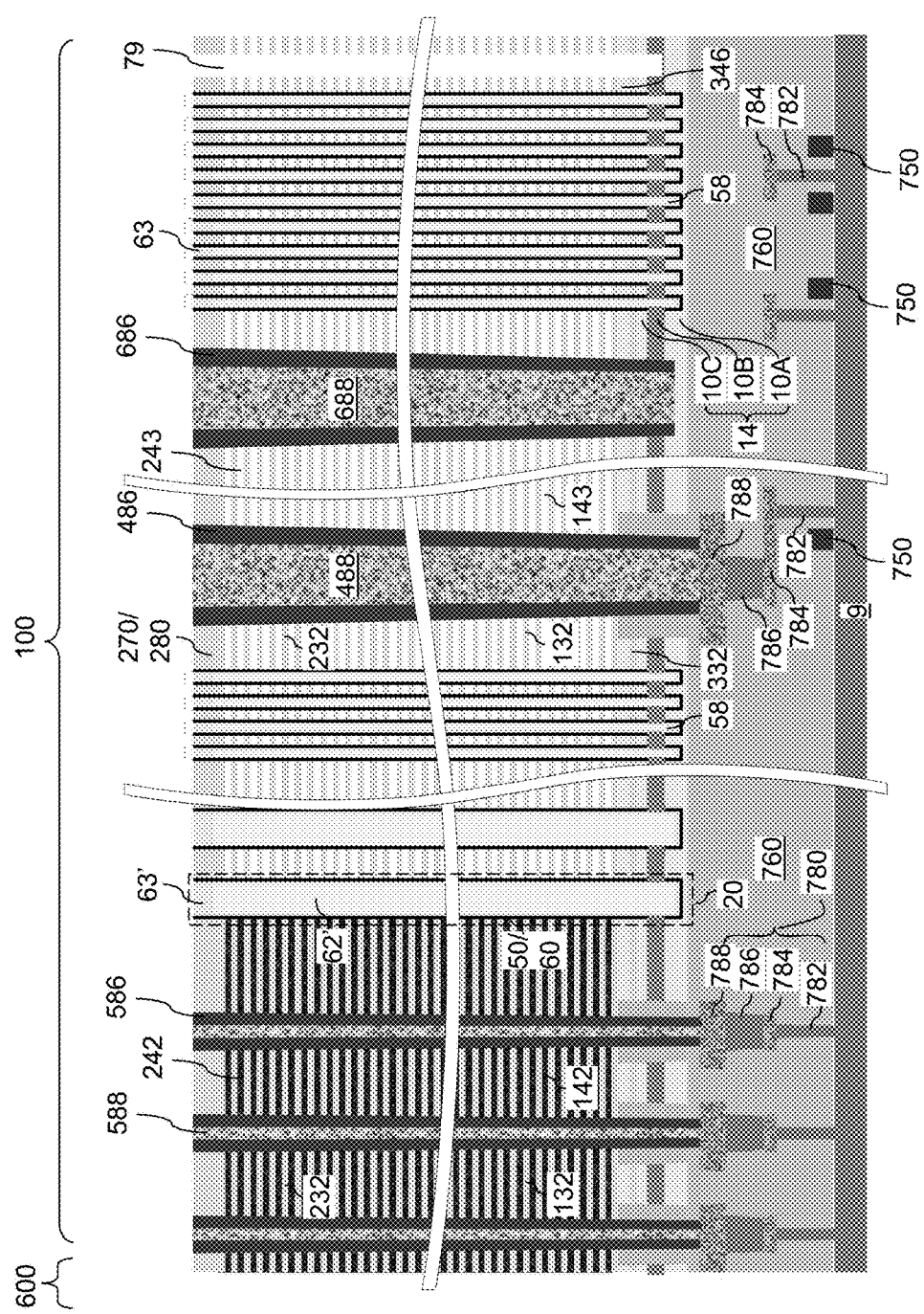

COMPACT THREE-DIMENSIONAL MEMORY DEVICE HAVING A SEAL RING AND METHODS OF MANUFACTURING THE SAME

FIELD

The present disclosure relates generally to the field of semiconductor devices and specifically to a three-dimensional memory device containing a seal ring and methods of manufacturing the same.

BACKGROUND

Recently, ultra high density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a semiconductor die includes a pair of first alternating stacks of first portions of insulating layers and electrically conductive layers located over a semiconductor substrate, groups of memory stack structures comprising a semiconductor channel and a memory film vertically extending through a respective one of the pair of the first alternating stacks, a pair of second alternating stacks of second portions of the insulating layers and dielectric material layers laterally adjoined to a respective one of the first alternating stacks, such that each second portion of the insulating layers is connected to a respective one of the first portions of the insulating layers, and at least one seal ring structure laterally enclosing, and laterally spaced from, the pair of first alternating stacks, and contacting at least a first sidewall of each of the pair of second alternating stacks.

According to another aspect of the present disclosure, a method of manufacturing a semiconductor die comprises forming a vertically alternating sequence of continuous insulating layers and continuous dielectric material layers having a different composition than the continuous insulating layers over a semiconductor substrate, patterning the vertically alternating sequence such that patterned portions of the vertically alternating sequence comprise a pair of in-process alternating stacks of insulating layers and dielectric material layers and such that stepped surfaces of layers of the pair of in-process alternating stacks are provided in a respective terrace region, forming a set of contiguous dielectric material portions between the pair of in-process alternating stacks and over the stepped surfaces of the pair of first alternating stacks, forming groups of memory stack structures vertically extending through the pair of in-process alternating stacks, wherein each of the memory stack structures comprises a memory film and a vertical semiconductor channel laterally surrounded by the memory film, replacing portions of the dielectric material layers in the pair of in-process alternating stacks with electrically conductive layers, wherein the pair of in-process alternating stacks is converted into a pair of first alternating stacks of first portions of the insulating layers and the electrically conductive layers and including respective stepped surfaces in the terrace regions, and a pair of second alternating stacks of second portions of the insulating layers and remaining portions of dielectric material layers laterally adjoined to a respective one of the first alternating stacks, wherein each second portion of the insulating layers is connected to a respective one of the first portions of the insulating layers, and forming at least one seal ring structure through the pair of second alternating stacks, and surrounding of the pair of first alternating stacks.

BRIEF DESCRIPTION OF THE DRAWINGS

FIG. 7B is a horizontal cross-sectional view of the first exemplary structure along the horizontal plane B-B' in FIG. 7A. The zig-zag vertical plane A-A' corresponds to the plane of the vertical cross-sectional view of FIG. 7A.

FIGS. 9A-9H are sequential vertical cross-sectional views of an inter-tier memory opening during formation of a pillar channel portion, a memory stack structure, a dielectric core, and a drain region according to an embodiment of the present disclosure.

FIG. 10B is a horizontal cross-sectional view of the first exemplary structure along the horizontal plane B-B' in FIG. 10A. The zig-zag vertical plane A-A' corresponds to the plane of the vertical cross-sectional view of FIG. 10A.

FIG. 25A is a vertical cross-sectional view of the second exemplary structure after removal of portions of dielectric material layers selective to insulating layers by an isotropic etch to form backside recesses according to an embodiment of the present disclosure.

DETAILED DESCRIPTION

Figure 1:
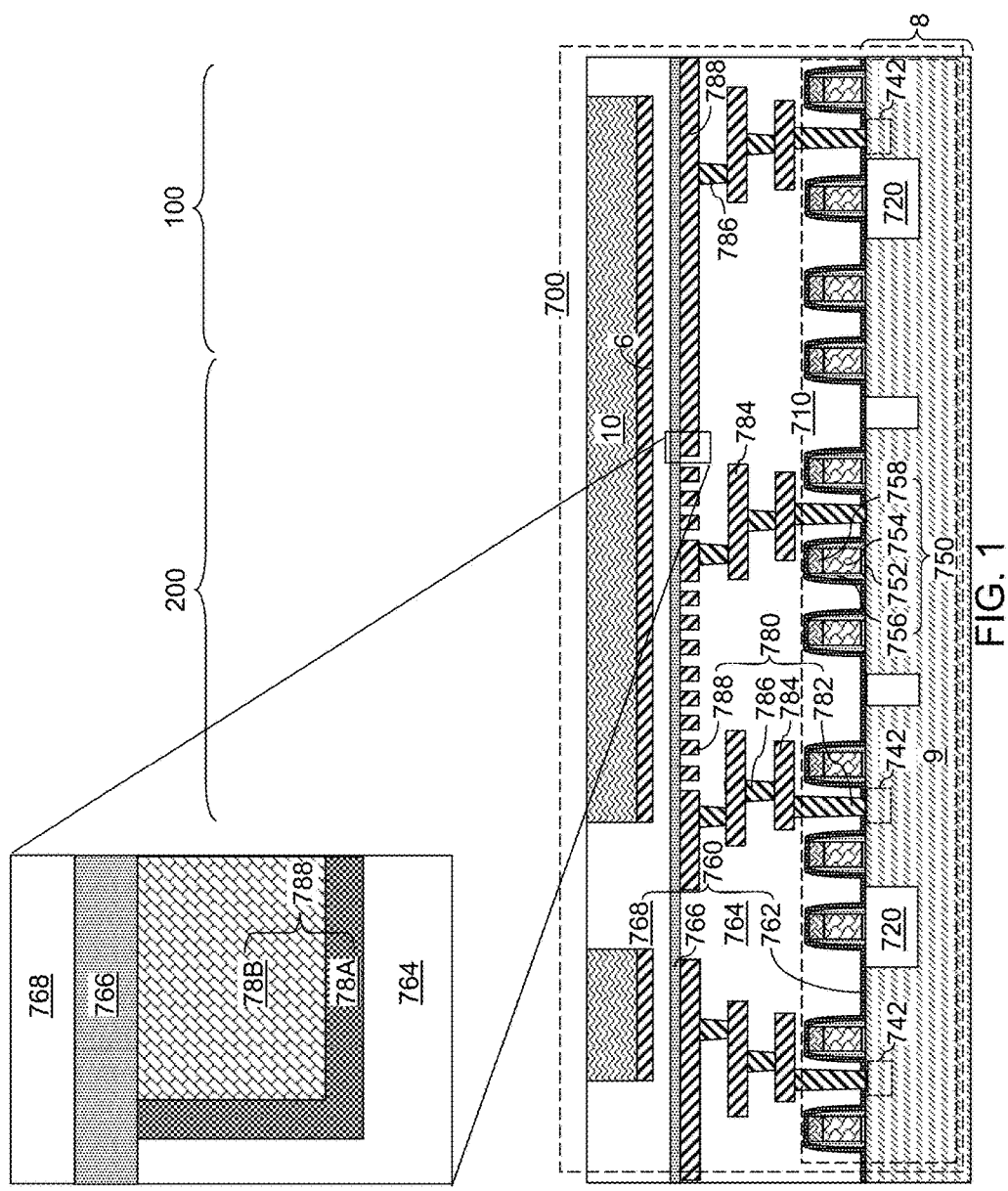
FIG. 1 is a vertical cross-sectional view of a first exemplary structure after formation of semiconductor devices, lower level dielectric layers including a silicon nitride layer, lower metal interconnect structures, and a planar semiconductor material layer on a semiconductor substrate according to a first embodiment of the present disclosure.

A semiconductor chip including a three-dimensional memory device should be laterally sealed to provide protection from the ambient and contaminants. Conventional seal ring structures employ a field region that is free of any alternating stacks of word lines and insulating layers around an entire periphery of the semiconductor chip. This field region includes a dedicated area extending around an entire periphery of a semiconductor chip, which increases the total footprint of the semiconductor chip.

Embodiments of the present disclosure are directed to a three-dimensional memory device employing a seal ring configuration that provides a compact chip footprint and methods of manufacturing the same, the various aspect of which are described herein in detail. The embodiments of the present disclosure can be employed to form various semiconductor devices such as three-dimensional monolithic memory array devices comprising a plurality of NAND memory strings. An exemplary three-dimensional memory device is employed to provide an illustrative example of semiconductor devices that can be enclosed in a seal ring in a semiconductor die. It should be understood that the seal ring configuration of the present disclosure can also be embodied on numerous variations of the exemplary three-dimensional memory device illustrated herein to provide the same benefit. As such, the illustrated configurations of the three-dimensional memory device serve merely as examples of implementation of the present disclosure.

The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Referring to FIG. 1, a first exemplary structure according to an embodiment of the present disclosure is illustrated. The first exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower level dielectric layers 760. The lower level dielectric layers 760 constitute a dielectric layer stack in which each lower level dielectric layer 760 overlies or underlies other lower level dielectric layers 760. The lower level dielectric layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer 766 (e.g., hydrogen diffusion barrier) 766 that overlies the dielectric material layer 764, and at least one second dielectric layer 768.

The dielectric layer stack including the lower level dielectric layers 760 functions as a matrix for lower metal interconnect structures 780 that provide electrical wiring among the various nodes of the semiconductor devices and landing pads for through-memory-level contact via structures to be subsequently formed. The lower metal interconnect structures 780 are embedded within the dielectric layer stack of the lower level dielectric layers 760, and comprise a lower metal line structure located under and optionally contacting a bottom surface of the silicon nitride layer 766.

For example, the lower metal interconnect structures 780 can be embedded within the at least one first dielectric material layer 764. The at least one first dielectric material layer 764 may be a plurality of dielectric material layers in which various elements of the lower metal interconnect structures 780 are sequentially embedded. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The lower metal interconnect structures 780 can include various device contact via structures 782 (e.g., source and drain electrodes which contact the respective source and drain nodes of the device or gate electrode contacts), intermediate lower metal line structures 784, lower metal via structures 786, and topmost lower metal line structures 788 that are configured to function as landing pads for through-memory-level contact via structures to be subsequently formed. In this case, the at least one first dielectric material layer 764 may be a plurality of dielectric material layers that are formed level by level while incorporating components of the lower metal interconnect structures 780 within each respective level. For example, single damascene processes may be employed to form the lower metal interconnect structures 780, and each level of the lower metal via structures 786 may be embedded within a respective via level dielectric material layer and each level of the lower level metal line structures (784, 788) may be embedded within a respective line level dielectric material layer. Alternatively, a dual damascene process may be employed to form integrated line and via structures, each of which includes a lower metal line structure and at least one lower metal via structure.

The topmost lower metal line structures 788 can be formed within a topmost dielectric material layer of the at least one first dielectric material layer 764 (which can be a plurality of dielectric material layers). Each of the lower metal interconnect structures 780 can include a metallic nitride liner 78A and a metal fill portion 78B. Each metallic nitride liner 78A can include a conductive metallic nitride material such as TiN, TaN, and/or WN. Each metal fill portion 78B can include an elemental metal (such as Cu, W, Al, Co, Ru) or an intermetallic alloy of at least two metals. Top surfaces of the topmost lower metal line structures 788 and the topmost surface of the at least one first dielectric material layer 764 may be planarized by a planarization process, such as chemical mechanical planarization. In this case, the top surfaces of the topmost lower metal line structures 788 and the topmost surface of the at least one first dielectric material layer 764 may be within a horizontal plane that is parallel to the top surface of the substrate 8.

The silicon nitride layer 766 can be formed directly on the top surfaces of the topmost lower metal line structures 788 and the topmost surface of the at least one first dielectric material layer 764. Alternatively, a portion of the first dielectric material layer 764 can be located on the top surfaces of the topmost lower metal line structures 788 below the silicon nitride layer 766. In one embodiment, the silicon nitride layer 766 is a substantially stoichiometric silicon nitride layer which has a composition of $Si_3N_4$. A silicon nitride material formed by thermal decomposition of a silicon nitride precursor is preferred for the purpose of blocking hydrogen diffusion. In one embodiment, the silicon nitride layer 766 can be deposited by a low pressure chemical vapor deposition (LPCVD) employing dichlorosilane ($SiH_2Cl_2$) and ammonia ($NH_3$) as precursor gases. The temperature of the LPCVD process may be in a range from 750 degrees Celsius to 825 degrees Celsius, although lesser and greater deposition temperatures can also be employed. The sum of the partial pressures of dichlorosilane and ammonia may be in a range from 50 mTorr to 500 mTorr, although lesser and greater pressures can also be employed. The thickness of the silicon nitride layer 766 is selected such that the silicon nitride layer 766 functions as a sufficiently robust hydrogen diffusion barrier for subsequent thermal processes. For example, the thickness of the silicon nitride layer 766 can be in a range from 6 nm to 100 nm, although lesser and greater thicknesses may also be employed.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and a planar semiconductor material layer 10. The optional planar conductive material layer 6, if present, provides a high conductivity conduction path for electrical current that flows into, or out of, the planar semiconductor material layer 10. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can include horizontal semiconductor channels and/or source regions for a three-dimensional array of memory devices to be subsequently formed. The optional planar conductive material layer 6 can include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses can also be employed. The planar semiconductor material layer 10 includes a polycrystalline semiconductor material such as polysilicon or a polycrystalline silicon-germanium alloy. The thickness of the planar semiconductor material layer 10 may be in a range from 30 nm to 300 nm, although lesser and greater thicknesses can also be employed.

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate semiconductor layer 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

The optional planar conductive material layer 6 and the planar semiconductor material layer 10 may be patterned to provide openings in areas in which through-memory-level contact via structures are to be subsequently formed. In one embodiment, the openings in the optional planar conductive material layer 6 and the planar semiconductor material layer 10 can be formed within the area of a memory array region 100, in which a three-dimensional memory array including memory stack structures is to be subsequently formed. Further, additional openings in the optional planar conductive material layer 6 and the planar semiconductor material layer 10 can be formed within the area of a word line contact region 200 in which contact via structures contacting word line electrically conductive layers are to be subsequently formed.

The region of the semiconductor devices 710 and the combination of the lower level dielectric layers 760 and the lower metal interconnect structures 780 is herein referred to an underlying peripheral device region 700, which is located underneath a memory-level assembly to be subsequently formed and includes peripheral devices for the memory-level assembly. The lower metal interconnect structures 780 are embedded in the lower level dielectric layers 760.

The lower metal interconnect structures 780 can be electrically shorted to active nodes (e.g., transistor active regions 742 or gate electrodes 750) of the semiconductor devices 710 (e.g., CMOS devices), and are located at the level of the lower level dielectric layers 760. Only a subset of the active nodes is illustrated in FIG. 1 for clarity. In one embodiment, the pattern of the lower metal interconnect structures 780 can be selected such that the topmost lower metal line structures 788 (which are a subset of the lower metal interconnect structures 780 located at the topmost portion of the lower metal interconnect structures 780) can provide landing pad structures for the through-memory-level contact via structures to be subsequently formed.

Figure 2:
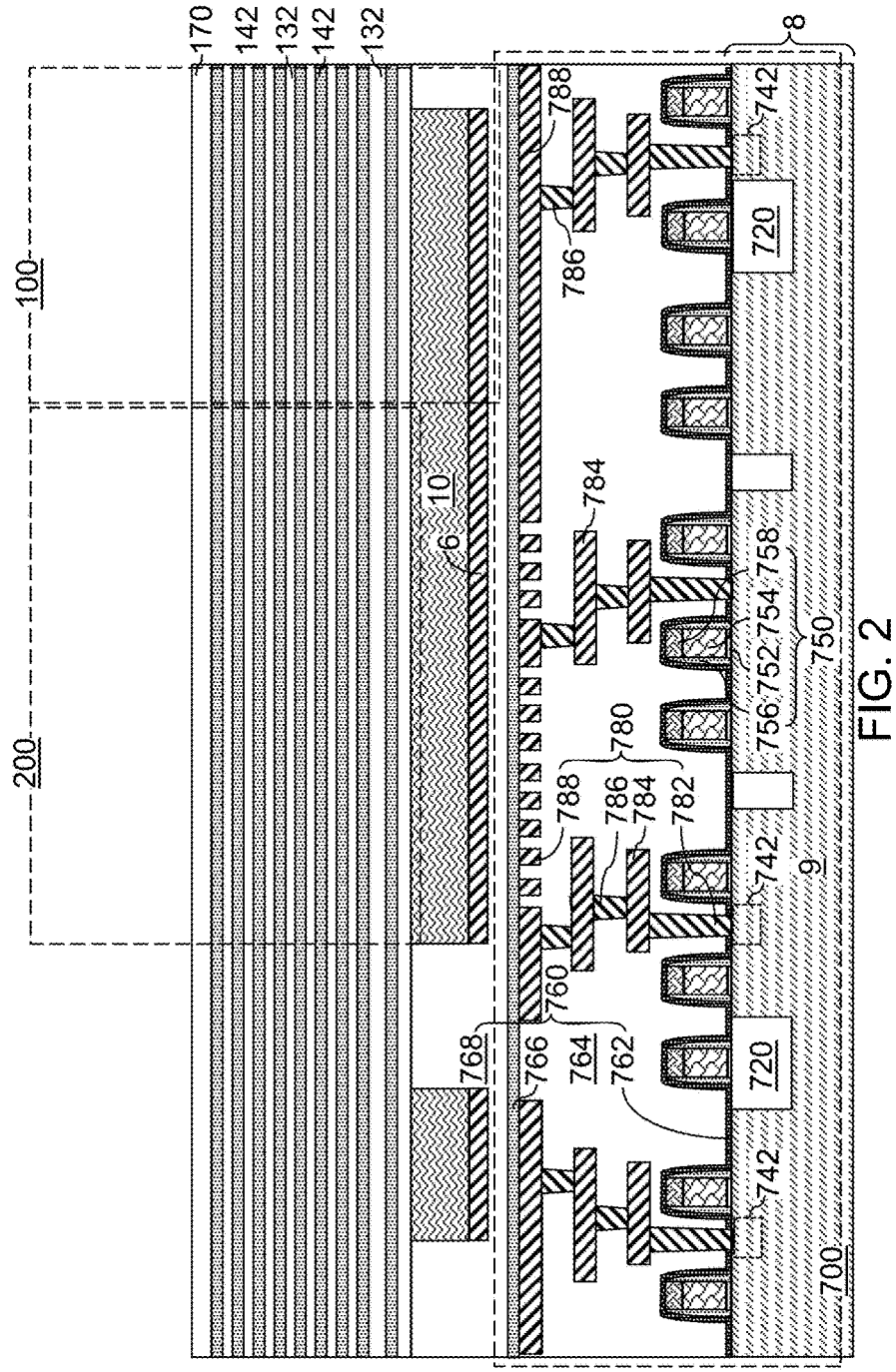
FIG. 2 is a vertical cross-sectional view of the first exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3:
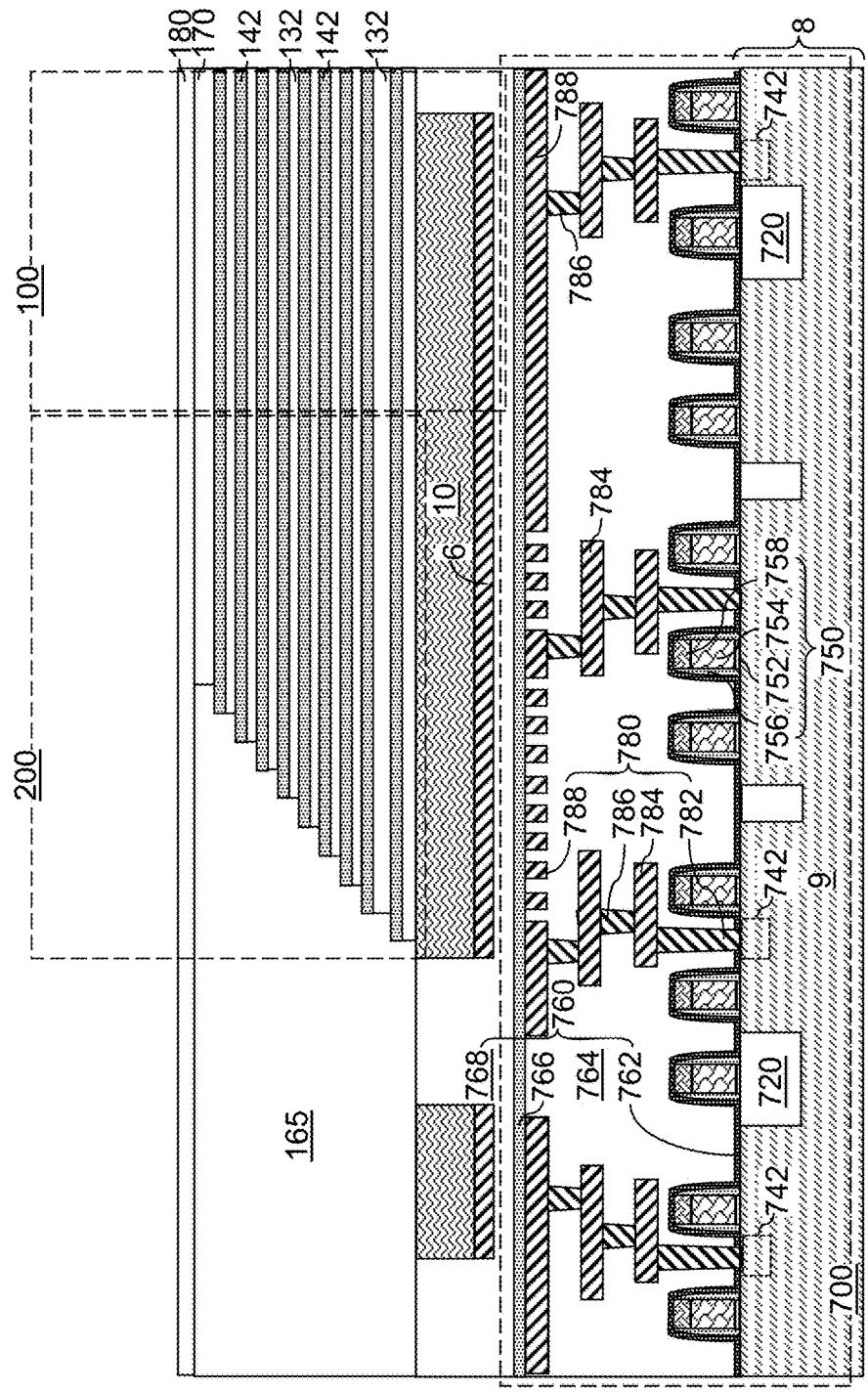
FIG. 3 is a vertical cross-sectional view of the first exemplary structure after patterning first-tier staircase regions on the first-tier alternating stack and forming a first-tier retro-stepped dielectric material portion according to an embodiment of the present disclosure.

Referring to FIG. 3, the first insulating cap layer 170 and the first-tier alternating stack (132, 142) can be patterned to form first stepped surfaces in the word line word line contact region 200. The word line word line contact region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first-tier structure, which is an in-process structure that is subsequently modified.

Figure 4A:
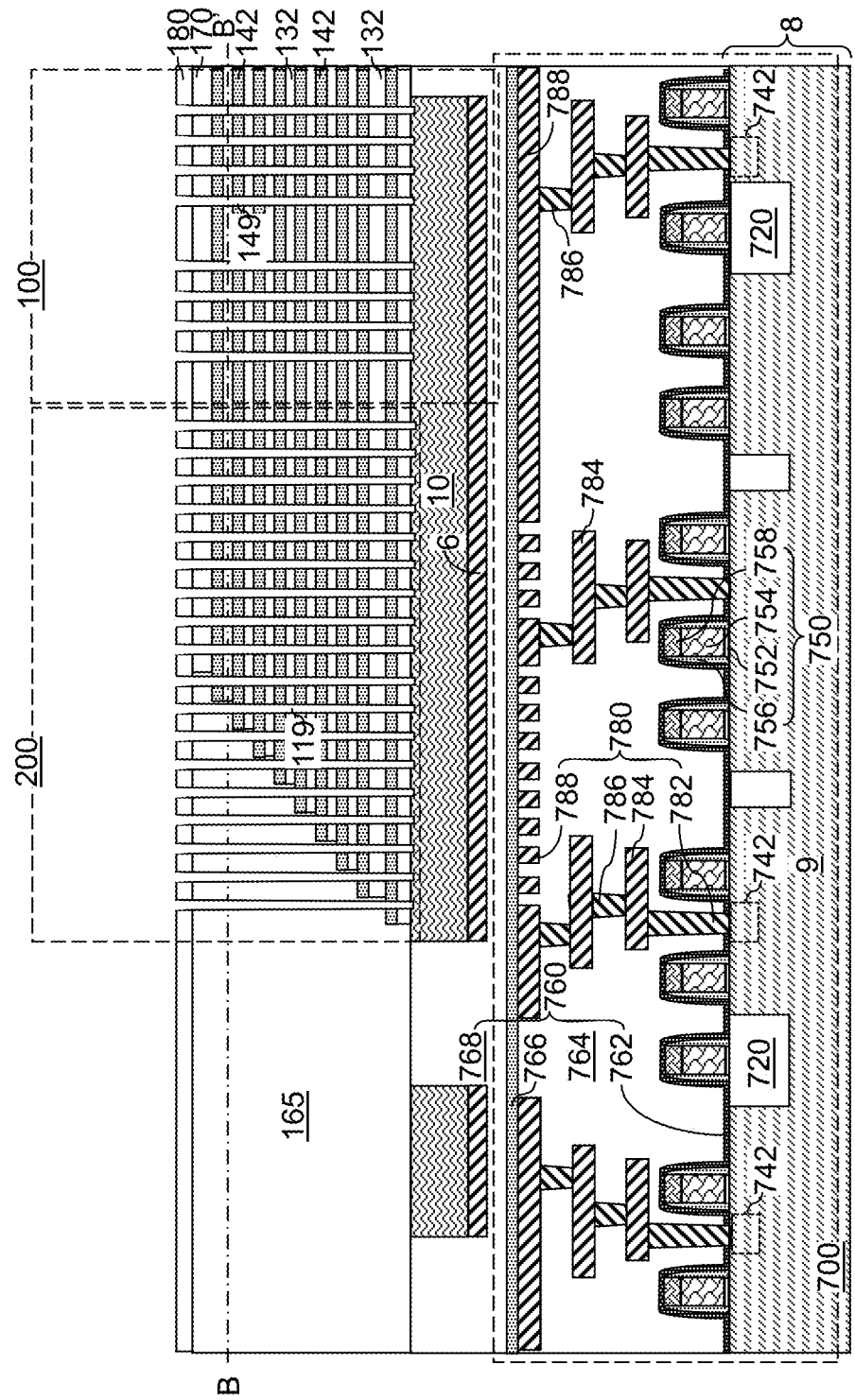
FIG. 4A is a vertical cross-sectional view of the first exemplary structure after formation of first-tier memory openings and first-tier support openings according to an embodiment of the present disclosure.
Figure 4B:
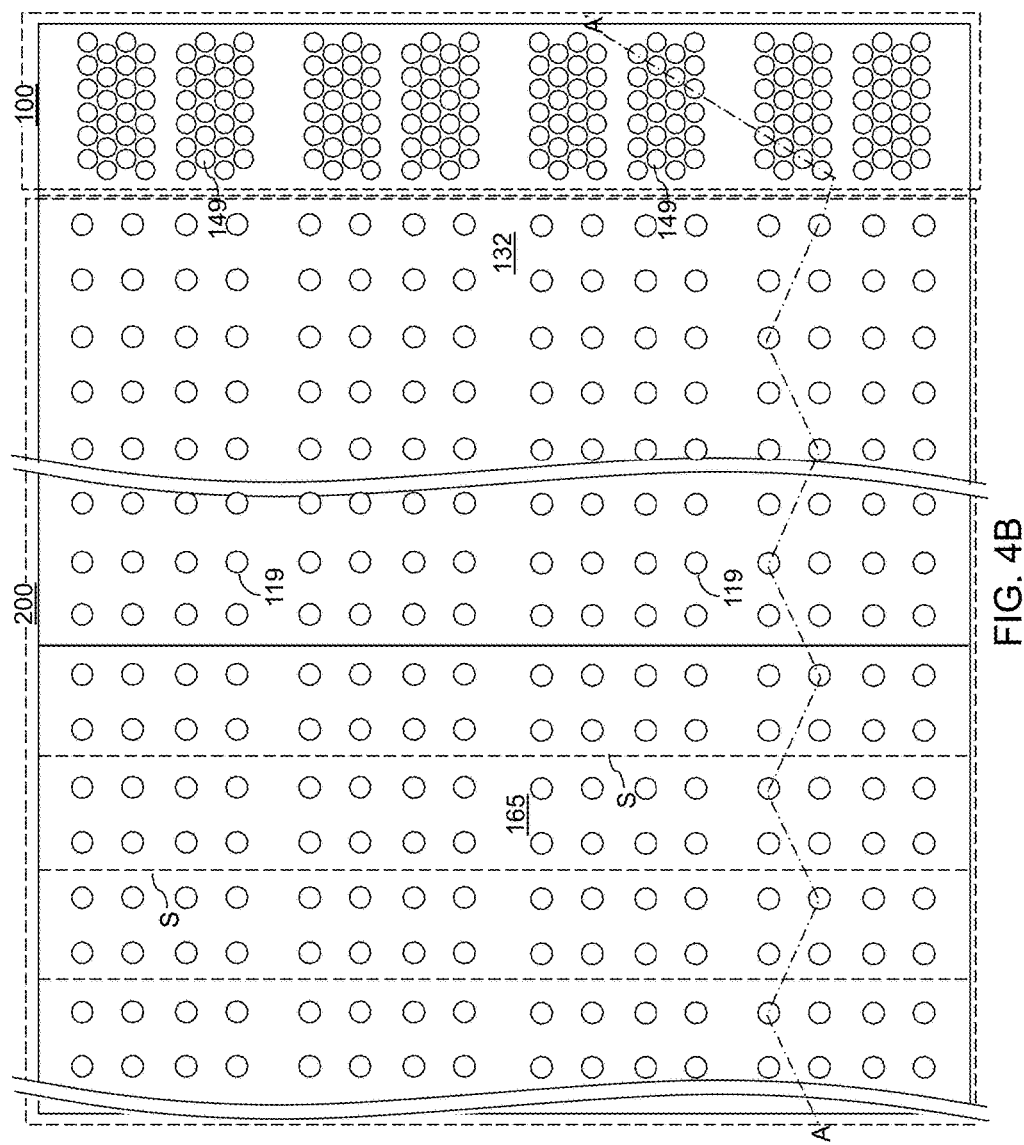
FIG. 4B is a horizontal cross-sectional view of the first exemplary structure along the horizontal plane B-B' in FIG. 4A. The zig-zag vertical plane A-A' corresponds to the plane of the vertical cross-sectional view of FIG. 4A.

Referring to FIGS. 4A and 4B, an inter-tier dielectric layer 180 may be optionally deposited over the first-tier structure (132, 142, 165, 170). The inter-tier dielectric layer 180 includes a dielectric material such as silicon oxide. The thickness of the inter-tier dielectric layer 180 can be in a range from 30 nm to 300 nm, although lesser and greater thicknesses can also be employed. Locations of steps S in the first-tier alternating stack (132, 142) are illustrated as dotted lines.

First-tier memory openings 149 and first-tier support openings 119 can be formed. The first-tier memory openings 149 and the first-tier support openings 119 extend through the first-tier alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line word line contact region 200. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that employs the patterned lithographic material stack as an etch mask. Portions of the first insulating cap layer 170 (and the optional inter-tier dielectric layer 180), and the first-tier alternating stack (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first-tier alternating stack (132, 142) forms the first-tier memory openings 149 and the first-tier support openings 119.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 and the support openings 119 can be substantially vertical, or can be tapered. Subsequently, the patterned lithographic material stack can be subsequently removed, for example, by ashing.

Optionally, the portions of the first-tier memory openings 149 and the first-tier support openings 119 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. The portions of the first-tier memory openings 149 (and the first-tier support openings 119) located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
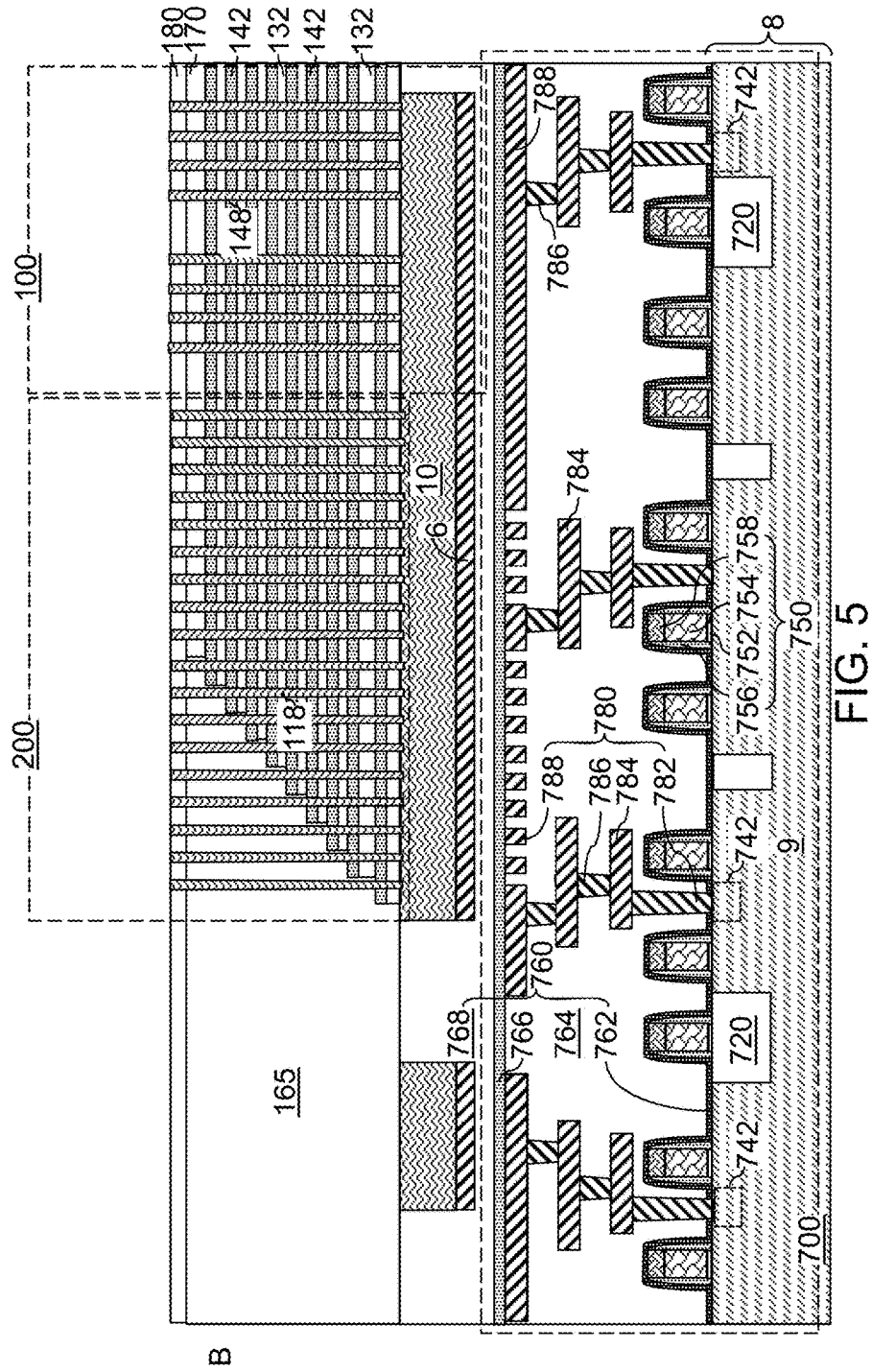
FIG. 5 is a vertical cross-sectional view of the first exemplary structure after formation of sacrificial memory opening fill portions and sacrificial support opening fill portions according to an embodiment of the present disclosure.

Referring to FIG. 5, sacrificial memory opening fill portions 148 can be formed in the first-tier memory openings 149, and sacrificial support opening fill portions 118 can be formed in the first-tier support openings 119. For example, a sacrificial fill material layer is deposited in the first-tier memory openings 149 and the first-tier support openings 119. The sacrificial fill material layer includes a sacrificial material which can be subsequently removed selective to the materials of the first insulator layers 132 and the first sacrificial material layers 142. In one embodiment, the sacrificial fill material layer can include amorphous silicon, germanium, a silicon-germanium alloy, carbon, borosilicate glass (which provides higher etch rate relative to undoped silicate glass), porous or non-porous organosilicate glass, organic polymer, or inorganic polymer. Optionally, a thin liner layer (such as a silicon oxide layer having a thickness in a range from 1 nm to 3 nm) may be employed prior to depositing the sacrificial fill material layer. If an etch stop layer is employed, then polysilicon may be employed as the sacrificial fill material. The sacrificial fill material layer may be formed by a non-conformal deposition or a conformal deposition method.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating layer 170 (and optionally layer 180 if present) can be employed as an etch stop layer or a planarization stop layer. Each remaining portion of the sacrificial material in a first-tier memory opening 149 constitutes a sacrificial memory opening fill portion 148. Each remaining portion of the sacrificial material in a first-tier support opening 119 constitutes a sacrificial support opening fill portion 118. The top surfaces of the sacrificial memory opening fill portions 148 and the sacrificial support opening fill portions 118 can be coplanar with the top surface of the inter-tier dielectric layer 180 (or the first insulating cap layer 170 if the inter-tier dielectric layer 180 is not present). The sacrificial memory opening fill portion 148 and the sacrificial support opening fill portions 118 may, or may not, include cavities therein.

Figure 6:
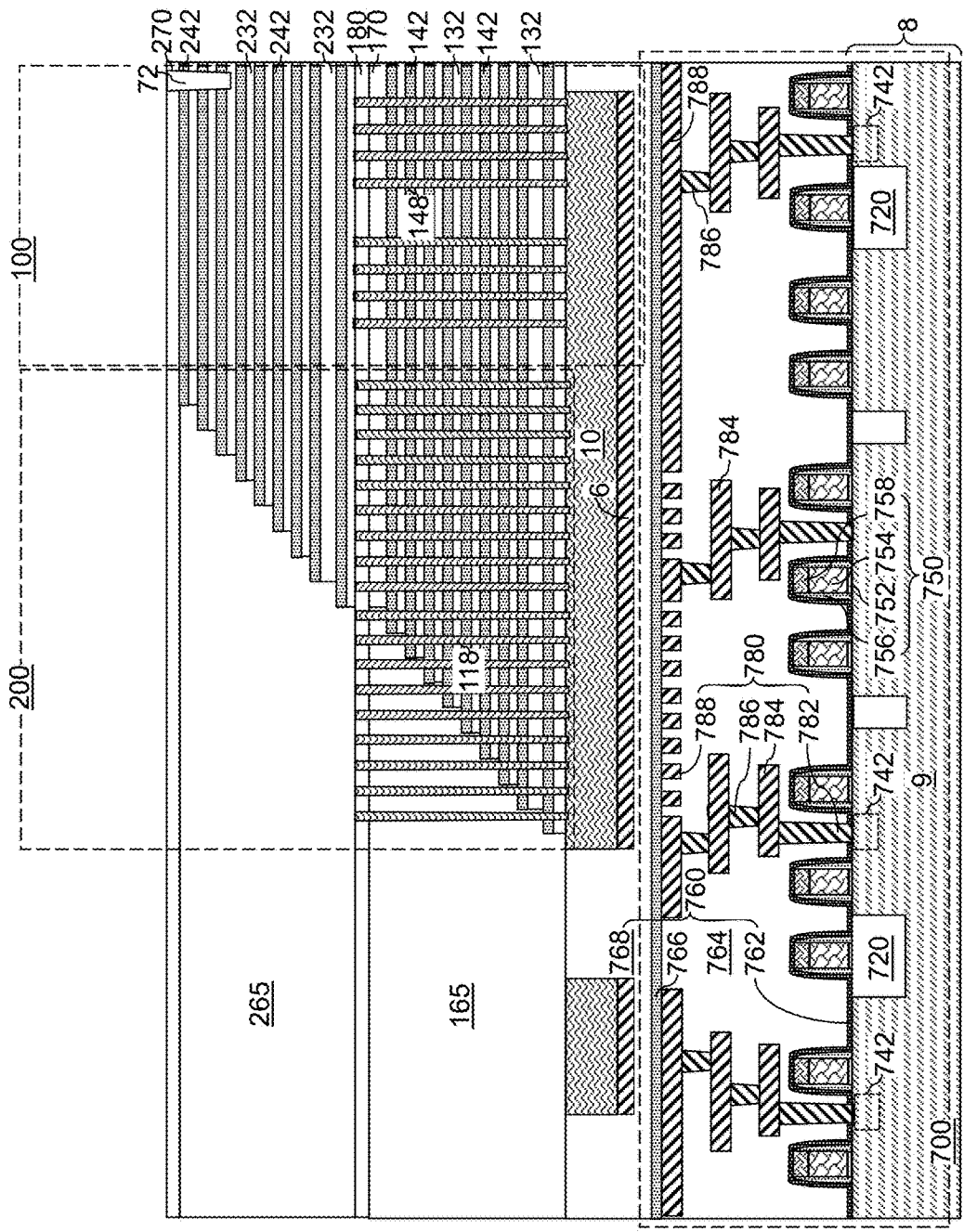
FIG. 6 is a vertical cross-sectional view of the first exemplary structure after formation of a second-tier alternating stack of second insulating layers and second spacer material layers, a second-tier retro-stepped dielectric material portion, and a second insulating cap layer according to an embodiment of the present disclosure.

Referring to FIG. 6, a second-tier structure can be formed over the first-tier structure (132, 142, 170, 148, 118). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the word line word line contact region 200 employing a same set of processing steps as the processing steps employed to form the first stepped surfaces in the first stepped area with suitable adjustment to the pattern of at least one masking layer. A second-tier retro-stepped dielectric material portion 265 can be formed over the second stepped surfaces in the word line word line contact region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 7A:
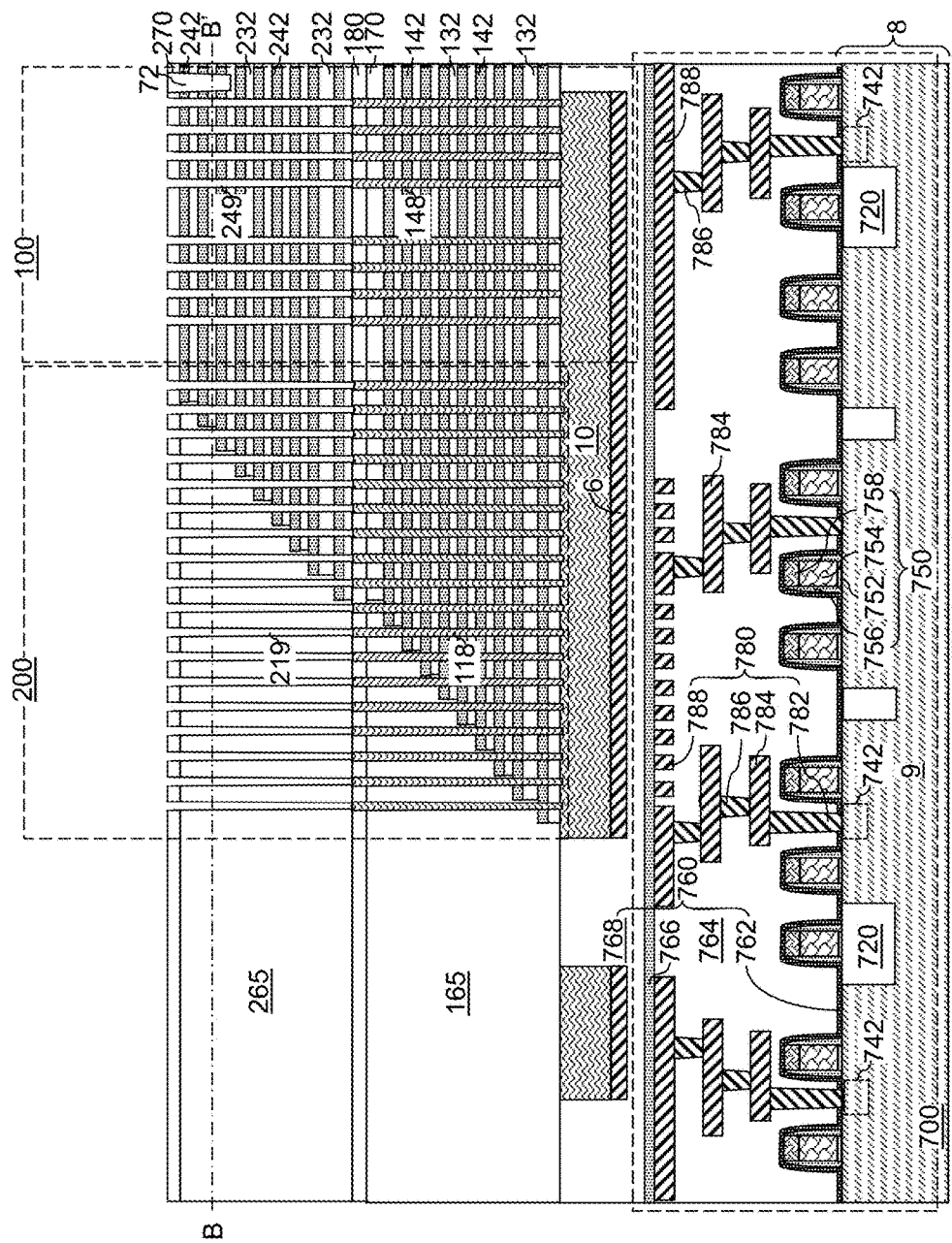
FIG. 7A is a vertical cross-sectional view of the first exemplary structure after formation of inter-tier memory openings and inter-tier support openings according to an embodiment of the present disclosure.

Referring to FIGS. 7A and 7B, second-tier memory openings 249 and second-tier support openings 219 extending through the second-tier structure (232, 242, 270, 265) are formed in areas overlying the sacrificial memory opening fill portions 148. A photoresist layer can be applied over the second-tier structure (232, 242, 270, 265), and can be lithographically patterned to form a same pattern as the pattern of the sacrificial memory opening fill portions 148 and the sacrificial support opening fill portions 118, i.e., the pattern of the first-tier memory openings 149 and the first-tier support openings 119. Thus, the lithographic mask employed to pattern the first-tier memory openings 149 and the first-tier support openings 119 can be employed to pattern the second-tier memory openings 249 and the second-tier support openings 219. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying sacrificial support opening fill portion 118 can be physically exposed at the bottom of each second-tier support opening 219. After the top surfaces of the sacrificial memory opening fill portions 148 and the sacrificial support opening fill portions 118 are physically exposed, an etch process can be performed, which removes the sacrificial material of the sacrificial memory opening fill portions 148 and the sacrificial support opening fill portions 118 selective to the materials of the second-tier alternating stack (232, 242) and the first-tier alternating stack (132, 142) (e.g., $C_4F_8/O_2/Ar$ etch).

Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). Likewise, upon removal of the sacrificial support opening fill portions 118, each vertically adjoining pair of a second-tier support opening 219 and a first-tier support opening 119 forms a continuous cavity that extends through the first-tier alternating stack (132, 142) and the second-tier alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first-tier alternating stack (132, 142) and the second-tier alternating stack (232, 242) are illustrated as dotted lines.

Figure 8:
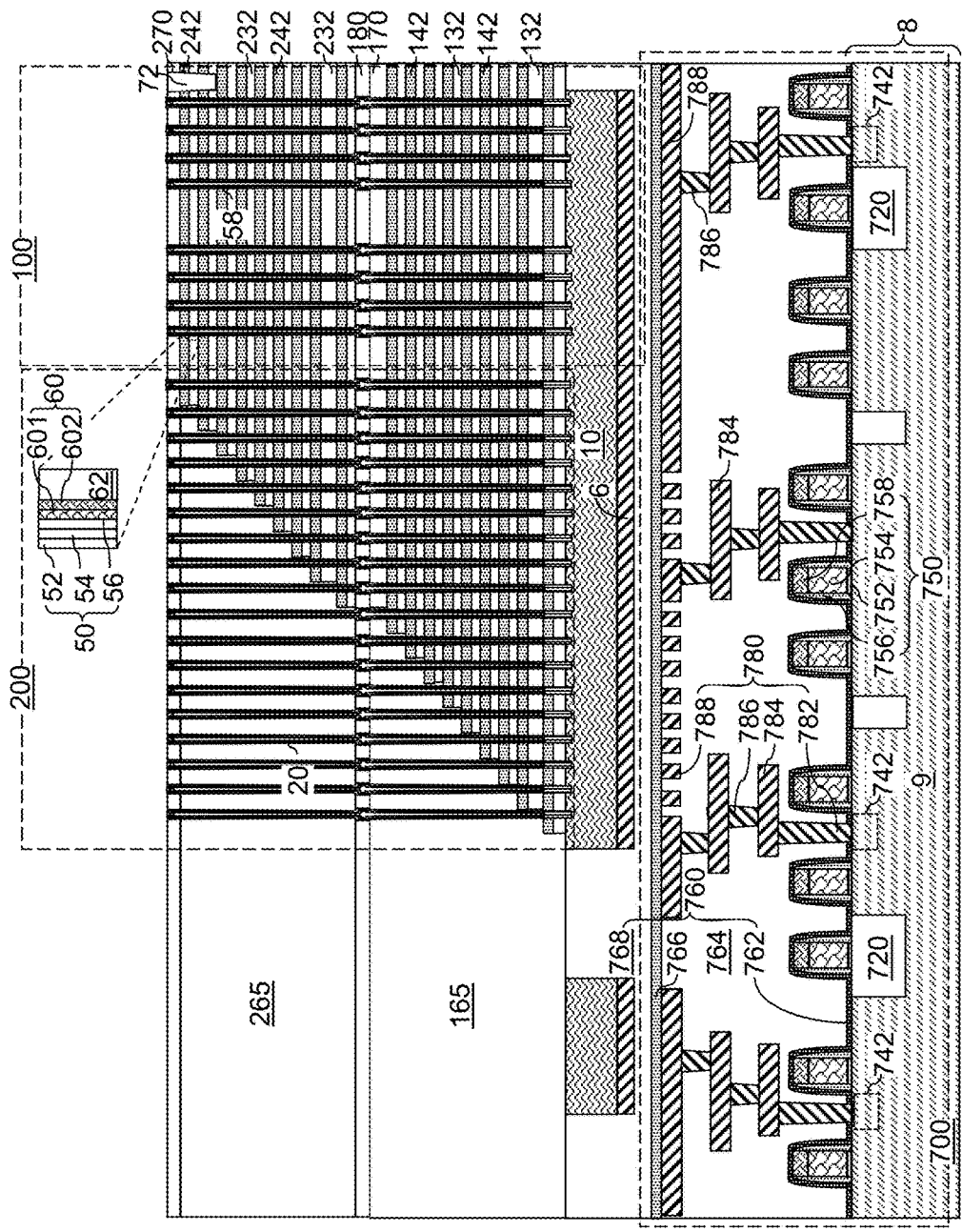
FIG. 8 is a vertical cross-sectional view of the first exemplary structure after formation of memory stack structures according to an embodiment of the present disclosure.

Referring to FIG. 8, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 9A-9H provide sequential cross-sectional views of a memory opening 49 or a support opening (119, 219) during formation of a memory opening fill structure 58 or a support pillar structure 20. While a structural change in a memory opening 49 is illustrated in FIGS. 9A-9H, it is understood that the same structural change occurs in each memory openings 49 and in each of the support openings (119, 219) during the same set of processing steps.

Referring to FIG. 9A, a memory opening 49 in the exemplary device structure of FIG. 12 is illustrated. The memory opening 49 extends through the first-tier structure and the second-tier structure. Likewise, each support opening (119, 219) extends through the first-tier structure and the second-tier structure.

Referring to FIG. 9B, an optional pedestal channel portion (e.g., an epitaxial pedestal) 11 can be formed at the bottom portion of each memory opening 49 and each support openings (119, 219), for example, by a selective semiconductor deposition process. In one embodiment, the pedestal channel portion 11 can be doped with electrical dopants of the same conductivity type as the planar semiconductor material layer 10. In one embodiment, at least one source select gate electrode can be subsequently formed by replacing each sacrificial material layer 42 located below the horizontal plane including the top surfaces of the pedestal channel portions 11 with a respective conductive material layer. A cavity 49' is present in the unfilled portion of the memory opening 49 (or of the support opening) above the pedestal channel portion 11. In one embodiment, the pedestal channel portion 11 can comprise single crystalline silicon. In one embodiment, the pedestal channel portion 11 can have a doping of the same as the conductivity type of the planar semiconductor material layer 10.

Referring to FIG. 9C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 9D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the planar semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 9E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 9G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening (119, 219).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 9H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first-tier structure (132, 142, 170, 165), the second-tier structure (232, 242, 270, 265), the inter-tier dielectric layer 180, the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Figure 10A:
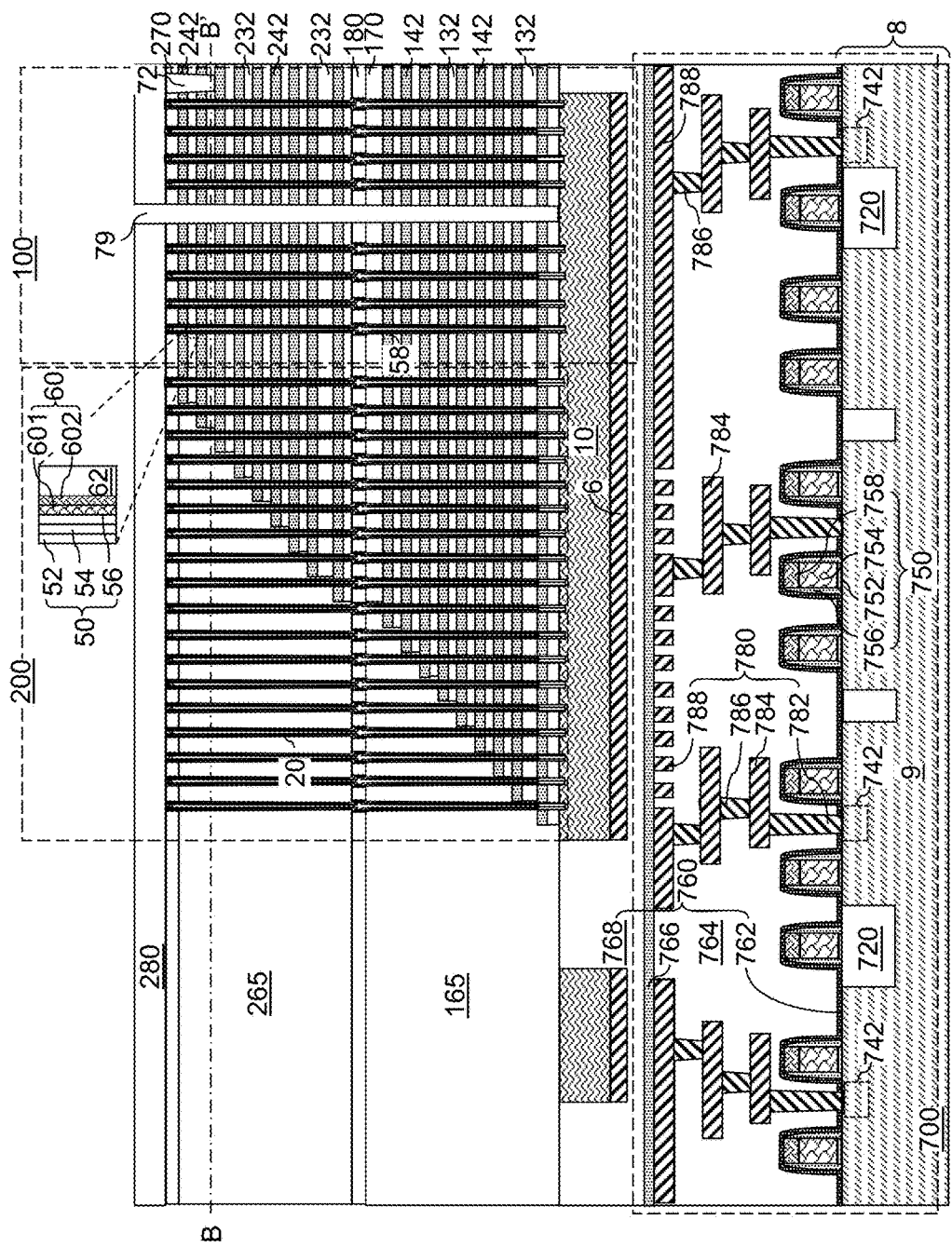
FIG. 10A is a vertical cross-sectional view of the first exemplary structure after formation of backside contact trenches according to an embodiment of the present disclosure.

Referring to FIGS. 10A and 10B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced among one another along a second horizontal direction hd2, which can be perpendicular to the first horizontal direction hd1. The backside contact trenches 79 can extend through the memory array region (e.g., a memory plane) 100 and the word line word line contact region 200. The first subset of the backside contact trenches 79 laterally divides the memory-level assembly (e.g., into memory blocks).

Figure 11A:
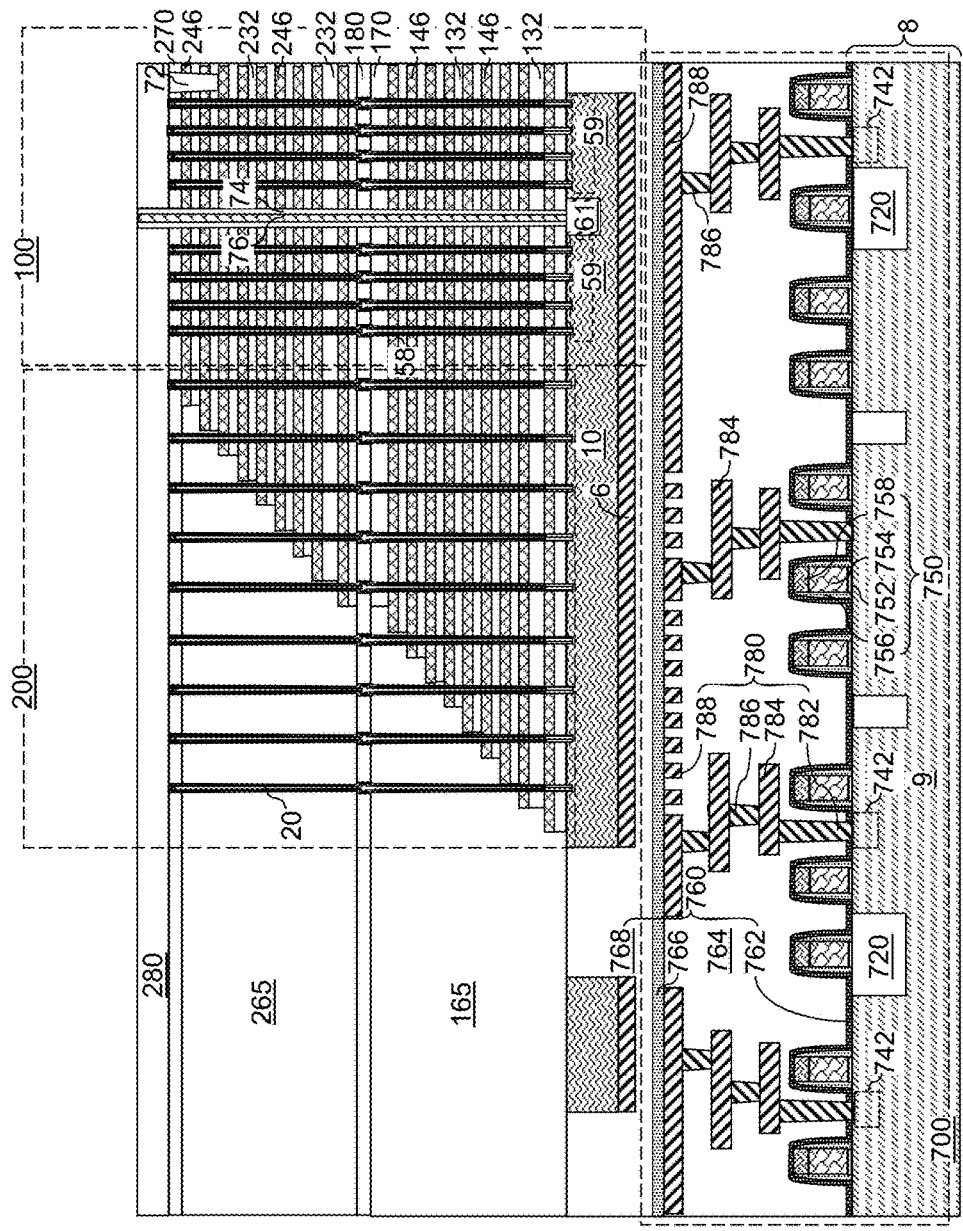
FIG. 11A is a vertical cross-sectional view of the first exemplary structure after replacement of sacrificial material layers with electrically conductive layers and formation of insulating spacers and backside contact via structures according to an embodiment of the present disclosure.
Figure 11B:
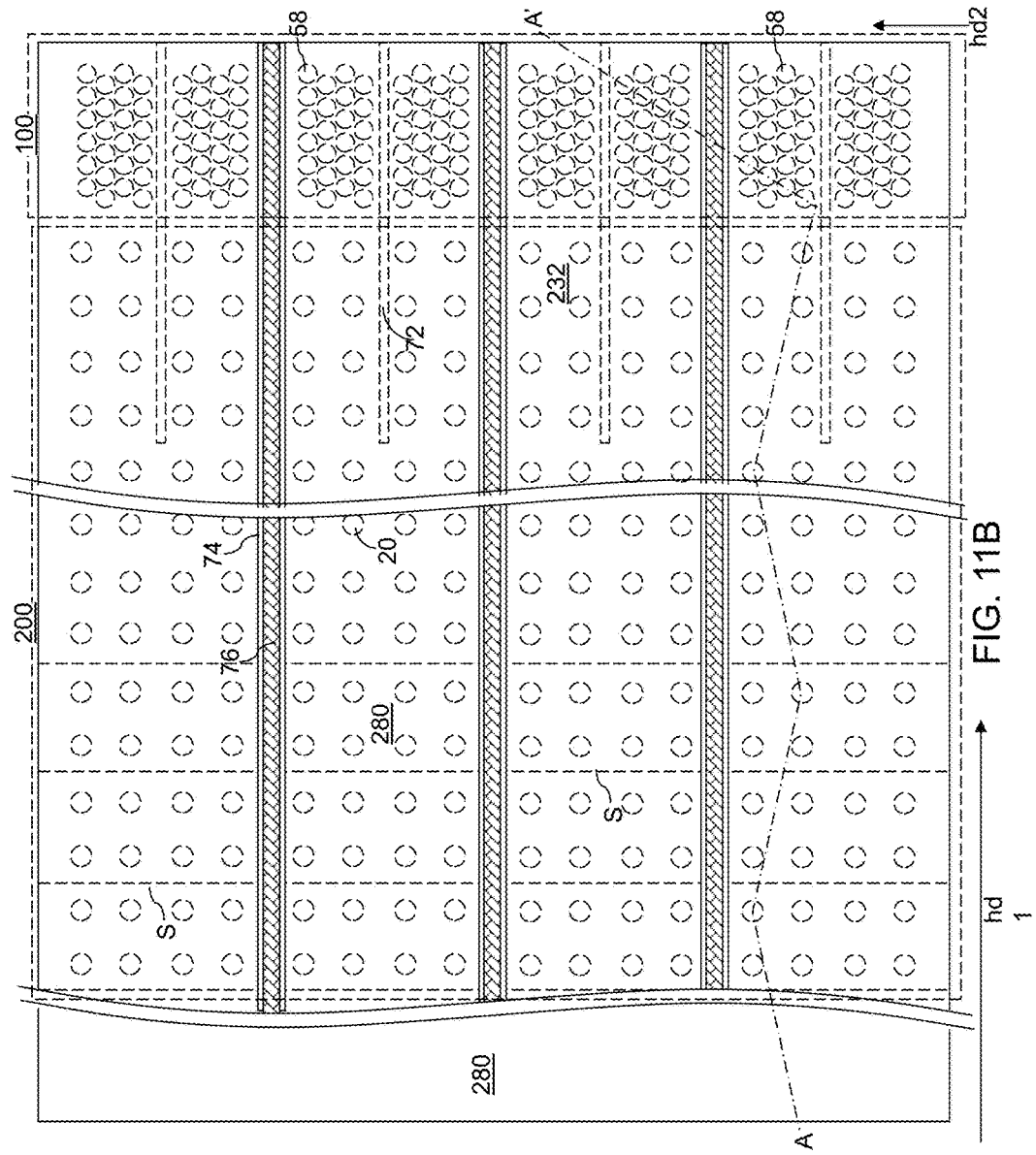
FIG. 11B is a top-down view of the first exemplary structure of FIG. 11A. The zig-zag vertical plane A-A' corresponds to the plane of the vertical cross-sectional view of FIG. 11A.

Referring to FIGS. 11A and 11B, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, employing an isotropic etch process. First backside recesses are formed in volumes from which the first sacrificial material layers 142 are removed. Second backside recesses are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate (8, 9). A backside recess can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown) can be formed around each pedestal channel portion 11 by oxidation of a physically exposed peripheral portion of the pedestal channel portions 11. Further, a semiconductor oxide potion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the planar semiconductor material layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and is laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280. The first contact level dielectric layer 280 can be thinned and removed during a latter part of the planarization process, which may employ chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

Figure 12A:
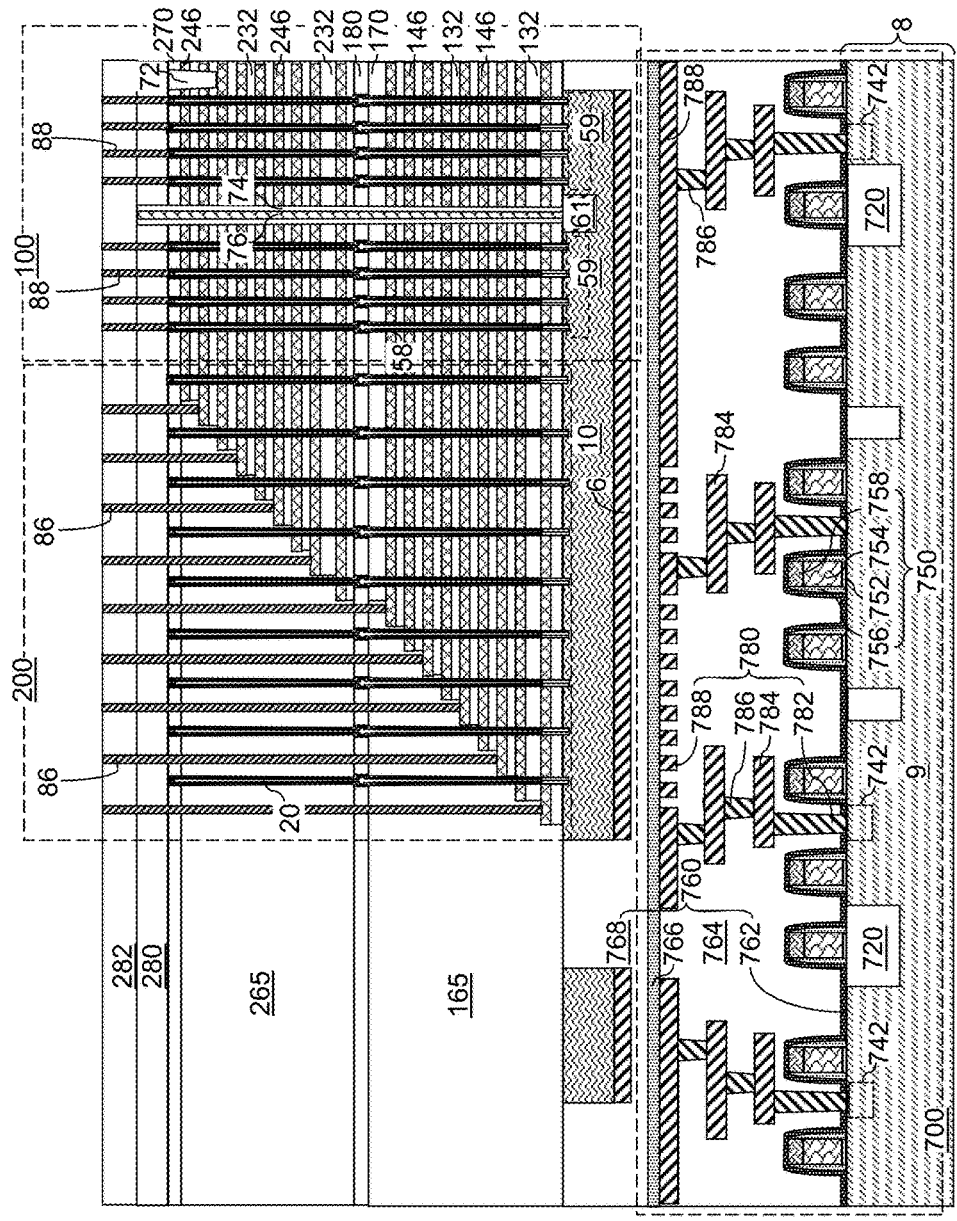
FIG. 12A is a vertical cross-sectional view of the first exemplary structure after formation of drain contact via structures and word line contact via structures according to an embodiment of the present disclosure.
Figure 12B:
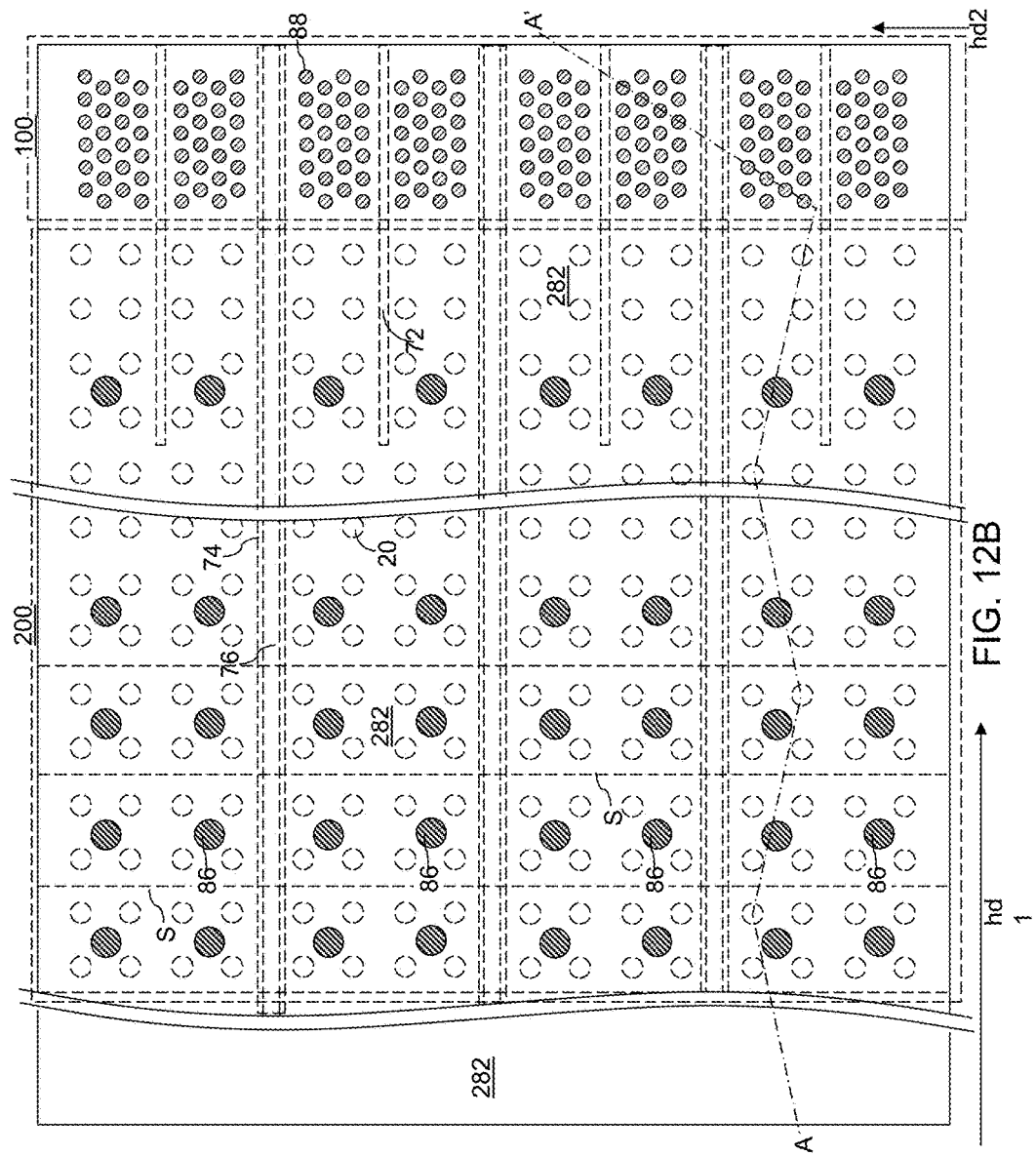
FIG. 12B is a top-down view of the first exemplary structure of FIG. 12A. The zig-zag vertical plane A-A' corresponds to the plane of the vertical cross-sectional view of FIG. 12A.

Referring to FIGS. 12A and 12B, a second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be employed.

Drain contact via structures 88 contacting the drain regions 63 can extend through the contact level dielectric layers (280, 282) and the second insulating cap layer 270 in the memory array region 100. A source connection via structure 91 can extend through the contact level dielectric layers (280, 282) to provide electrical connection to the laterally-elongated contact via structures 76.

Various contact via structures can be formed through the contact level dielectric layers (280, 282) and the retro-stepped dielectric material portions (165, 265). For example, word line contact via structures 86 can be formed in the word line word line contact region 200. A subset of the word line contact via structures 86 contacting the second electrically conductive layers 246 extends through the second-tier retro-stepped dielectric material portion 265 in the word line word line contact region 200, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in the word line word line contact region 200.

Figure 13A:
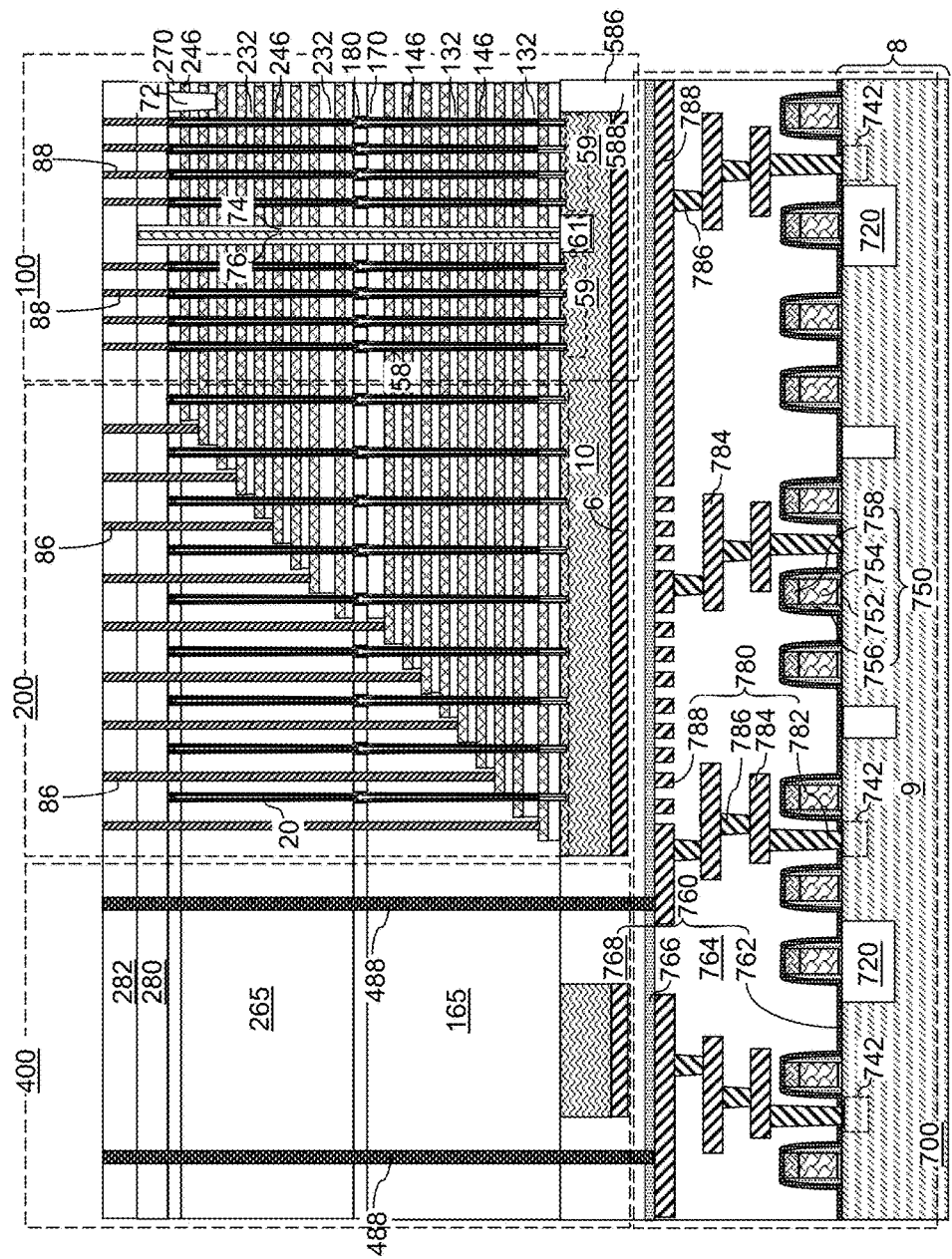
FIG. 13A is a vertical cross-sectional view of the first exemplary structure after formation of through-memory-level contact via structures according to an embodiment of the present disclosure.
Figure 13B:
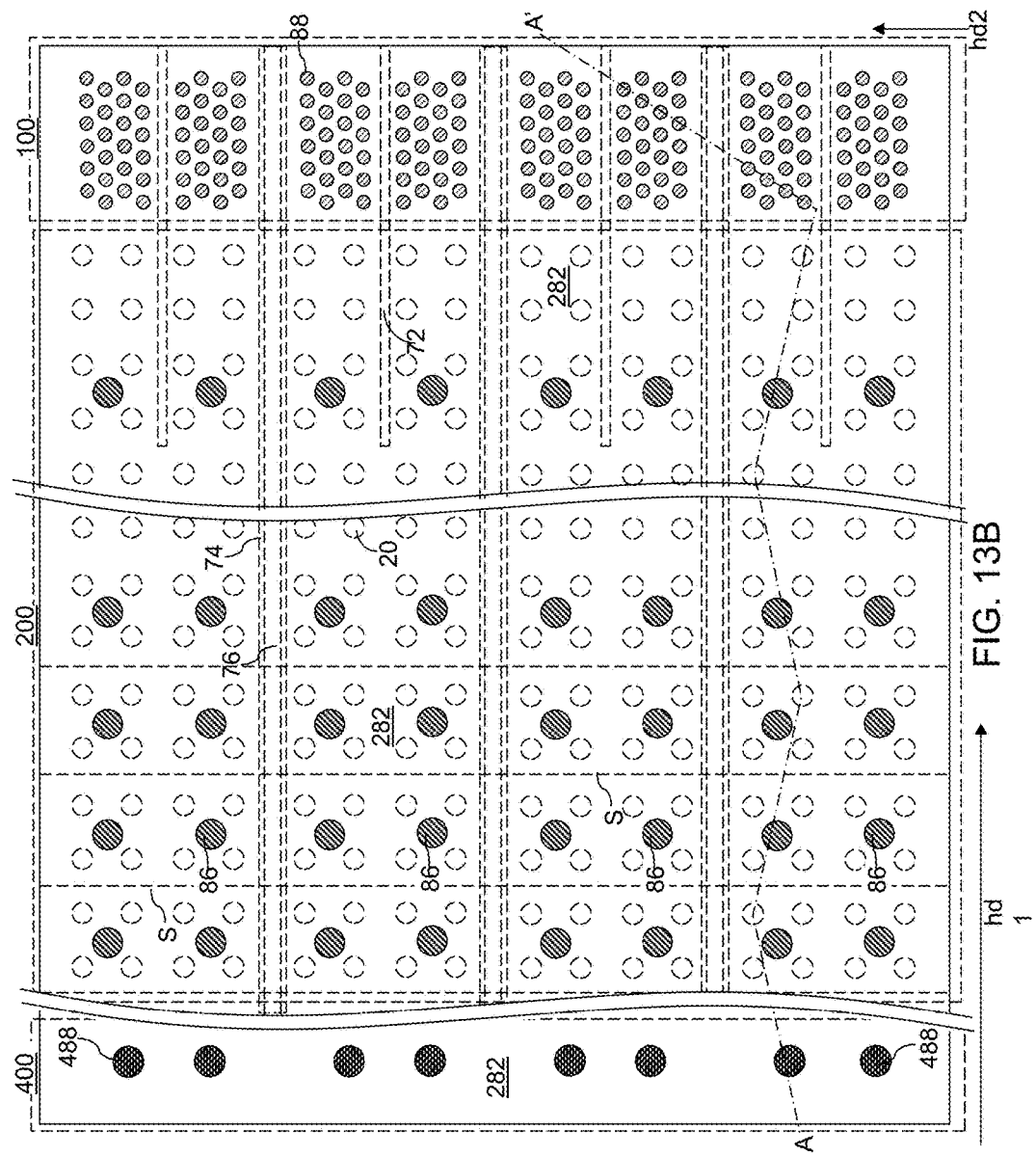
FIG. 13B is a top-down view of the first exemplary structure of FIG. 13A. The zig-zag vertical plane A-A' corresponds to the plane of the vertical cross-sectional view of FIG. 13A.

Referring to FIGS. 13A and 13B, a photoresist layer can be applied over the first exemplary structure, and can be lithographically patterned to form openings in regions overlying openings through the planar semiconductor material layer 10. Through-memory-level via cavities can be formed in the peripheral region 400 through the contact level dielectric layers (280, 282), the retro-stepped dielectric material portions (165, 265), the at least one second dielectric material layer 768, and the silicon nitride layer 766 to a top surface of a respective one of the topmost lower metal liner structures 788. In one embodiment, the through-memory-level via cavities can pass through openings in the planar semiconductor material layer 10 and the optional planar conductive material layer 6. The photoresist layer can be removed, for example, by ashing.

At least one conductive material can be deposited in the through-memory-level via cavities. The at least one conductive material can include, for example, a metallic nitride liner (such as a TiN liner) and a metal fill material (such as W, Cu, Al, Ru, or Co). Excess portions of the at least one conductive material can be removed from outside through-memory-level via cavities. For example, excess portions of the at least one conductive material can be removed from above the top surface of the second contact level dielectric layer 282 by a planarization process such as chemical mechanical planarization and/or a recess etch. Each remaining portion of the at least one conductive material in the through-memory-level via cavities that contacts a top surface of a respective one of the topmost lower metal line structure 788 constitutes a through-memory-level contact via structure 488.

Figure 14:
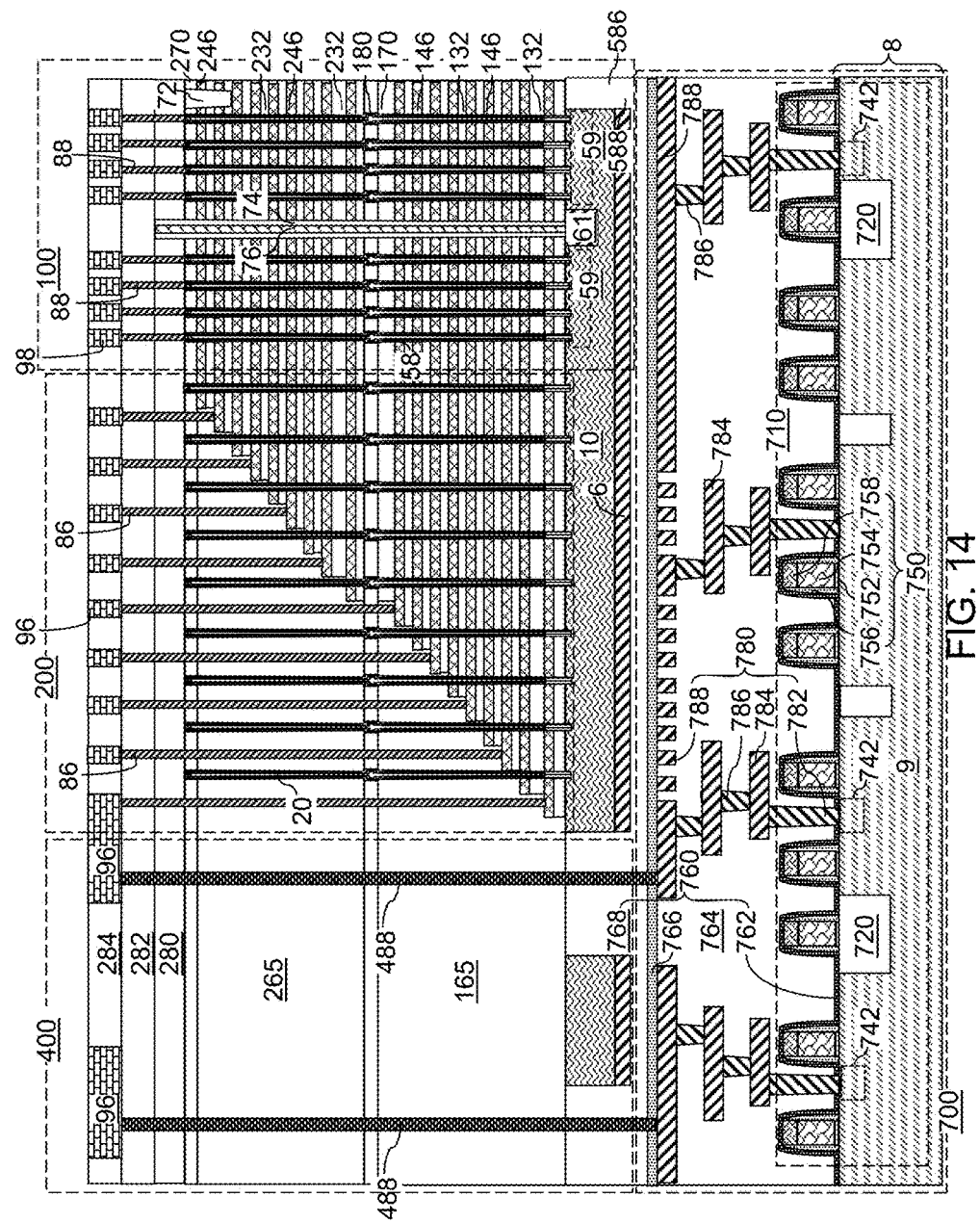
FIG. 14 is a vertical cross-sectional view of the first exemplary structure after formation of upper metal line structures according to an embodiment of the present disclosure.

Referring to FIG. 14, at least one upper interconnect level dielectric layer 284 can be formed over the contact level dielectric layers (280, 282). Various upper interconnect level metal structures can be formed in the at least one upper interconnect level dielectric layer 284. For example, the various upper interconnect level metal structures can include line level metal interconnect structures (96, 98). The line level metal interconnect structures (96, 98) can include upper metal line structures 96 that contact a top surface of a respective one of the through-memory-level contact via structures 488, and bit lines 98 that contact a respective one of the drain contact via structures 88 and extend along the second horizontal direction (e.g., bit line direction) hd2 and perpendicular to the first horizontal direction (e.g., word line direction) hd1. In one embodiment, a subset of the upper metal line structures 96 may contact, or are electrically coupled to, a respective pair of a word line contact via structure 86 and a through-memory-level contact via structure 488.

At least a subset of the upper metal interconnect structures (which include the line level metal interconnect structures (96, 98)) is formed over the three-dimensional memory array. A through-memory-level contact via structure 488 can be provided through the retro-stepped dielectric material portions (165, 265), the at least one second dielectric material layer 768, and the silicon nitride layer 766 and directly on a top surface of another lower metal line structure (e.g., another topmost lower metal line structure 788) of the lower metal interconnect structures 780.

Figure 15A:
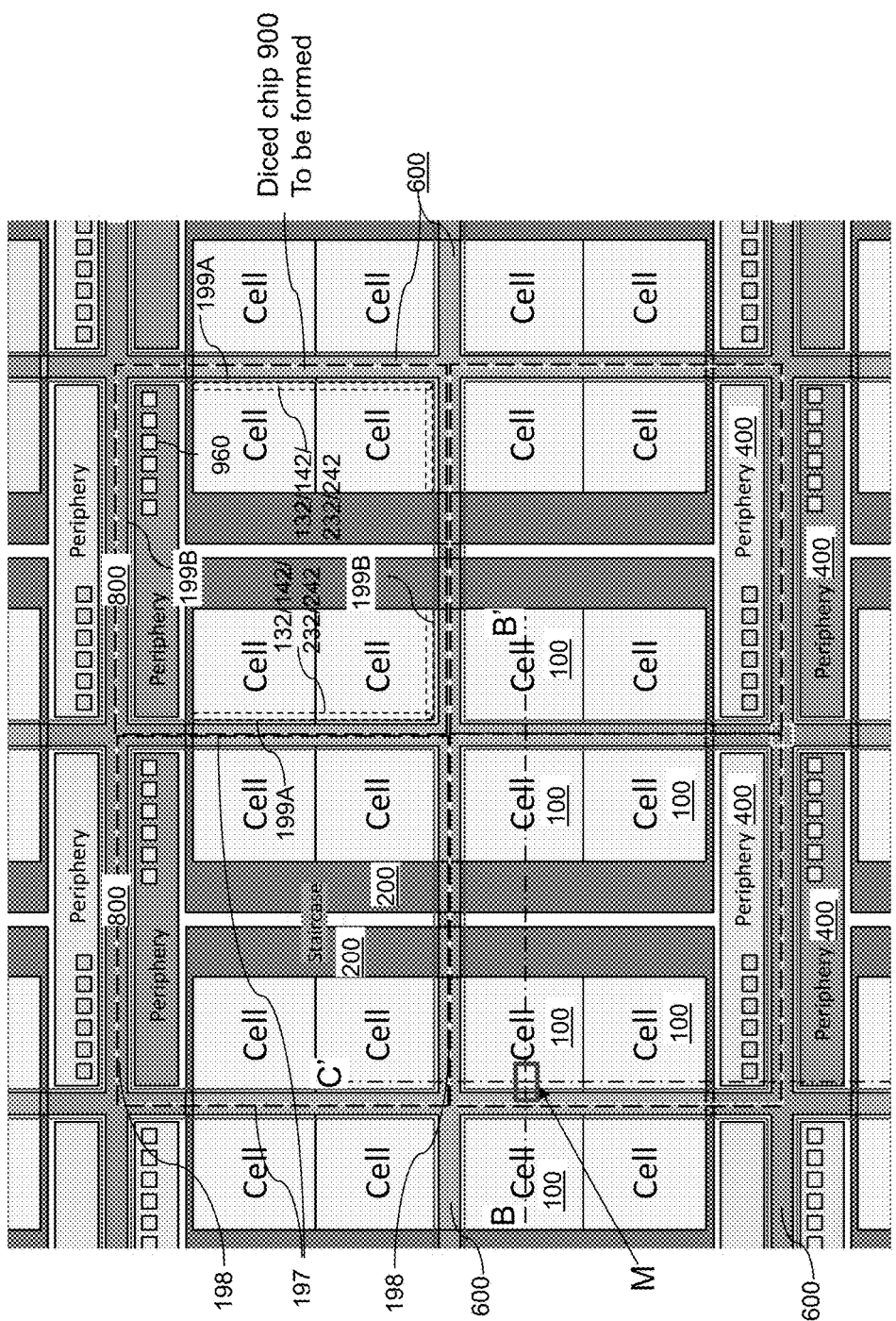
FIG. 15A is a plan view of a first layout for semiconductor die on a semiconductor substrate prior to dicing according to a first embodiment of the present disclosure.
Figure 15B:
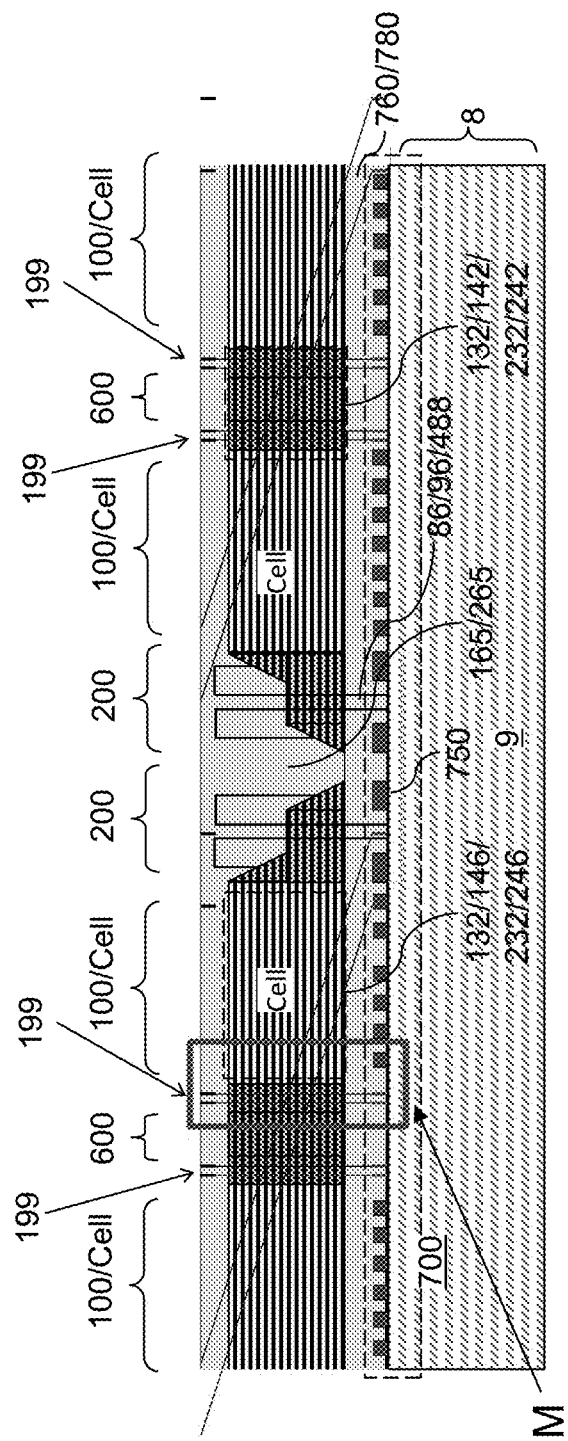
FIG. 15B is a first vertical cross-sectional view of the semiconductor die along the plane B-B' in FIG. 15A.
Figure 15C:
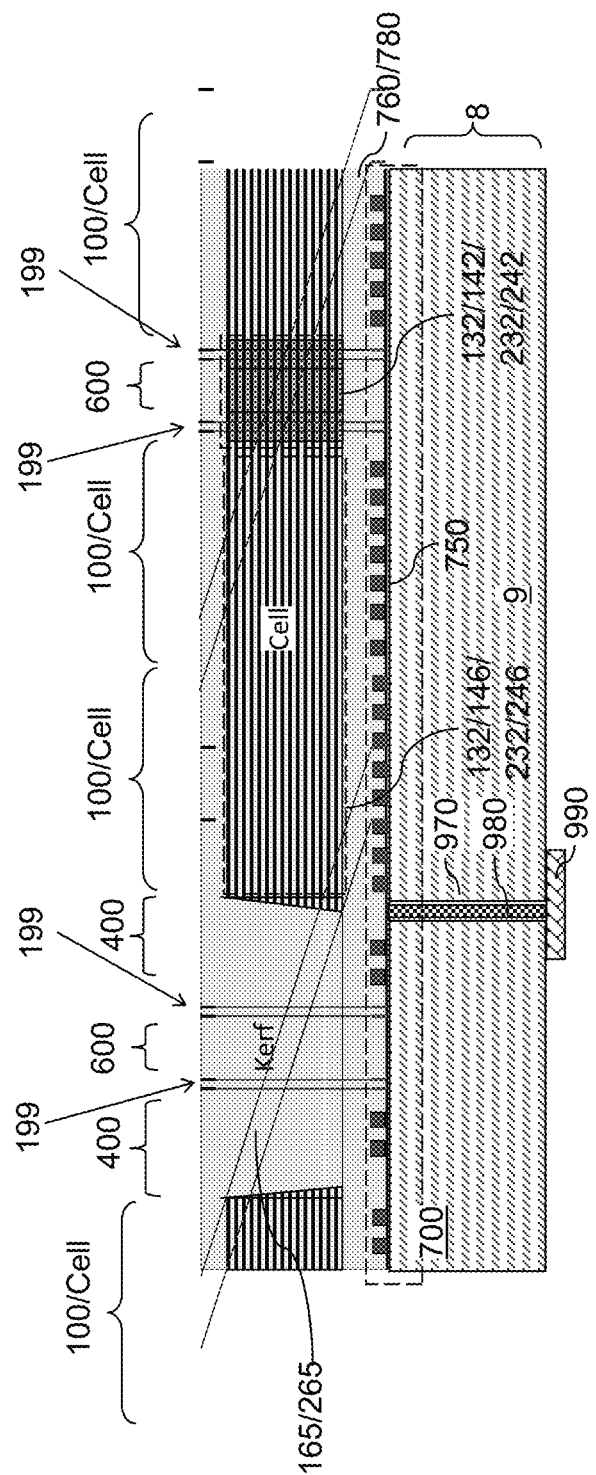
FIG. 15C is a second vertical cross-sectional view of the semiconductor die along the plane C-C' in FIG. 15A.

Referring to FIGS. 15A-15C, a first layout for semiconductor chips on a semiconductor substrate (8, 9) is illustrated prior to dicing according to a first embodiment of the present disclosure. The semiconductor substrate (8, 9) can be provided as a semiconductor wafer, such as a commercially available 12" diameter silicon wafer or a commercially available 8" diameter silicon wafer. Multiple dies 800 can be formed on the semiconductor substrate (8, 9) by employing a lithographic stepper at each lithographic step employed to form the first exemplary structure of FIG. 14. Areas of a single 800 are indicated by dotted rectangles, one of which is marked "diced chip 900 to be formed" to indicate the boundaries of each chip 900 after the dies 800 on the substrate (8, 9) are diced into chips 900. As used herein, "die" 800 is formed on the substrate (8, 9), and the dies 800 are converted to "chips" 900 after dicing the substrate along kerf regions 600 between the dies 800.

Figure 16A:
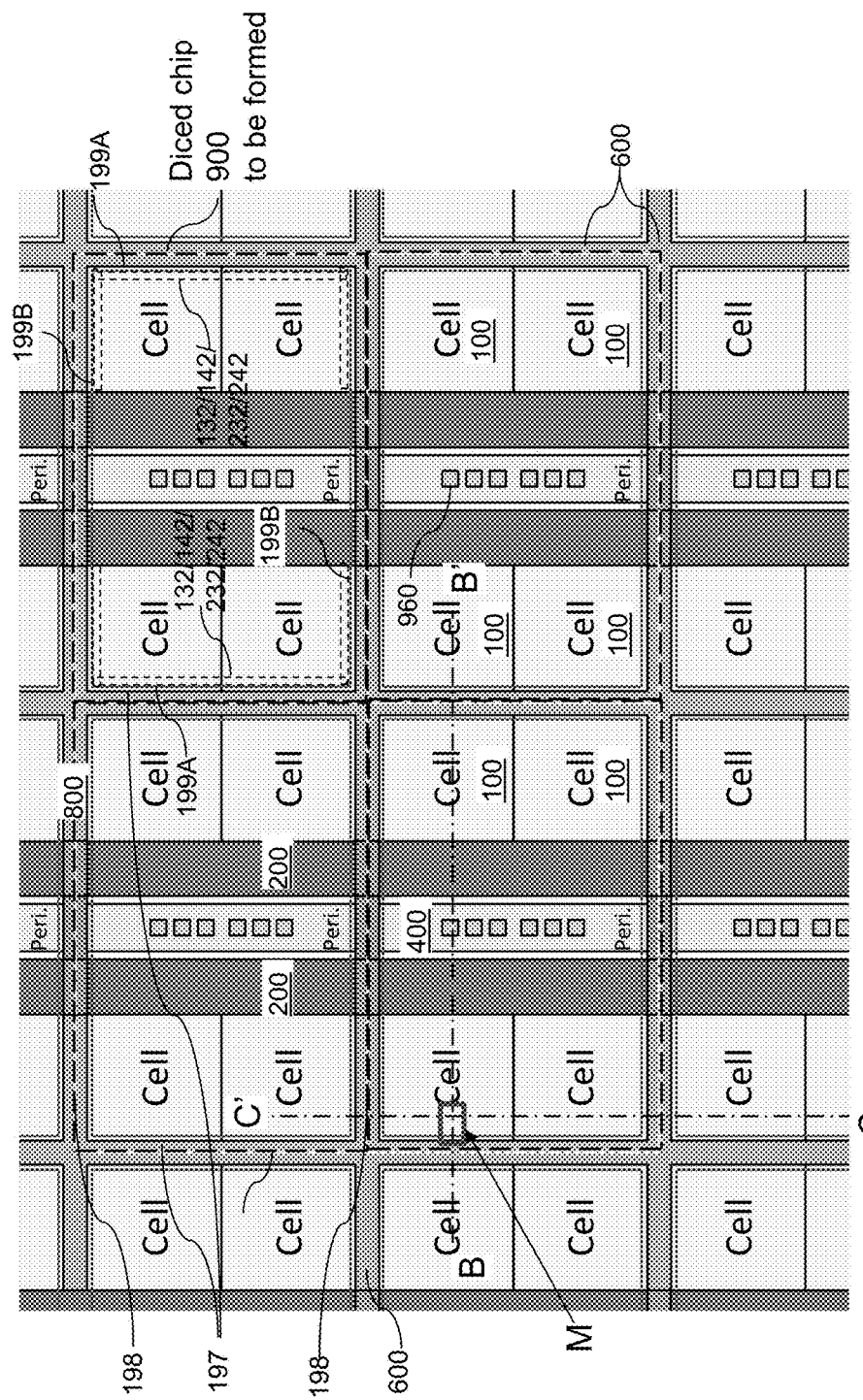
FIG. 16A is a plan view of a second layout for semiconductor die on a semiconductor substrate prior to dicing according to a second embodiment of the present disclosure.
Figure 16B:
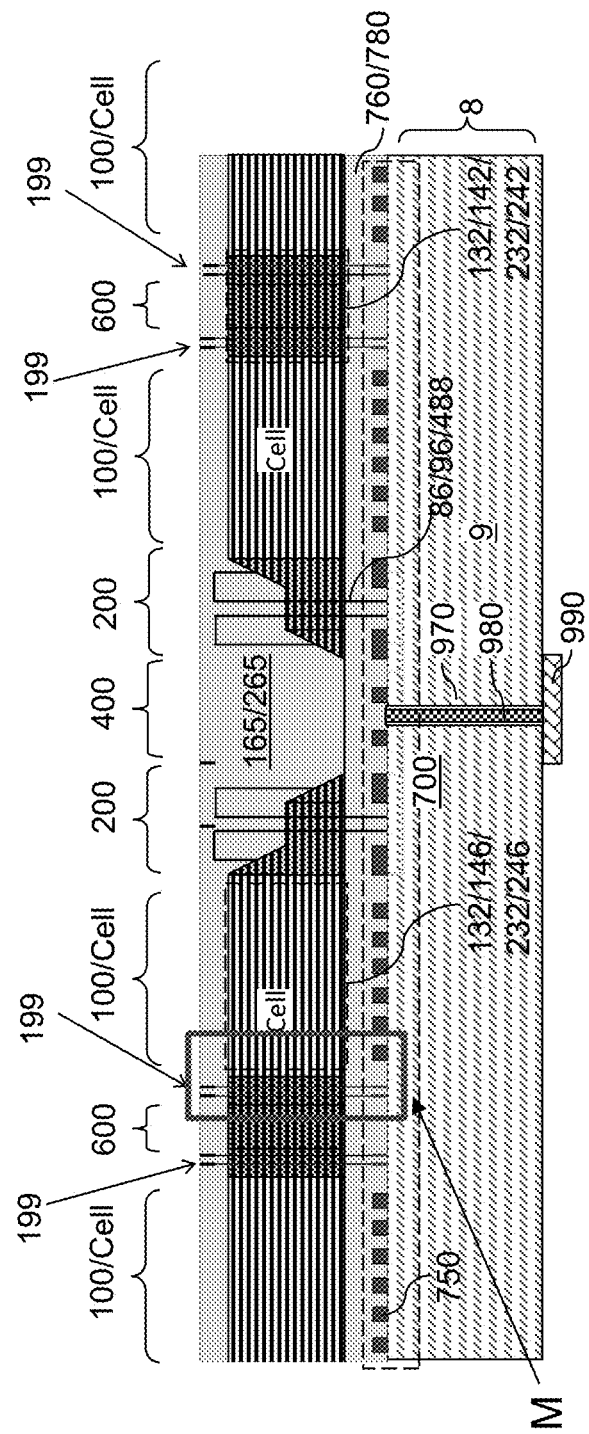
FIG. 16B is a first vertical cross-sectional view of the semiconductor die along the plane B-B' in FIG. 16A.
Figure 16C:
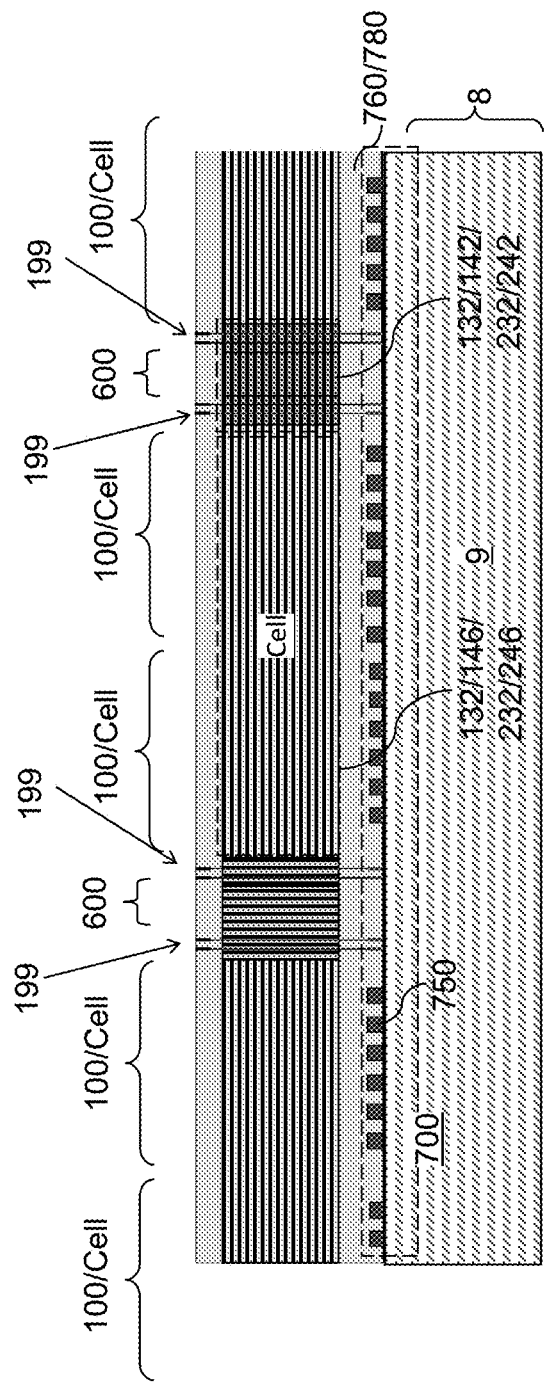
FIG. 16C is a second vertical cross-sectional view of the semiconductor die along the plane C-C' in FIG. 16A.

Referring to FIGS. 16A-16C, a second layout for semiconductor chips on a semiconductor substrate (8, 9) is illustrated prior to dicing according to a second embodiment of the present disclosure. The semiconductor substrate (8, 9) can be provided as a semiconductor wafer, such as a commercially available 12" diameter silicon wafer or a commercially available 8" diameter silicon wafer as in the first embodiment. Multiple dies 800 can be formed on the semiconductor substrate (8, 9) by employing a lithographic stepper at each lithographic step employed to form the first exemplary structure of FIG. 14. Areas of a single 800 are indicated by dotted rectangles, one of which is marked "diced chip 900 to be formed"

Referring to FIGS. 15A-15C and 16A-16C collectively, each area marked as "Cell" corresponds to the memory array region 100 of the first exemplary structure described above. Each memory array region 100 can correspond to one memory plane in one embodiment. Thus, each "Cell" area can correspond to a respective memory plane. For example, each die 800 (and thus each chip 900) may include four memory planes (i.e., memory array regions 100), two contact regions 200 and one peripheral region 400. Each area marked "Staircase" corresponds to the contact region 200 described above. Each area marked "Periphery" corresponds to the peripheral region 400 described above in which alternating stacks (132, 146, 232, 246) or word line contact via structures 86 are not present.

The processing steps for forming the first exemplary structure of FIG. 14 can be performed on the semiconductor substrate with modifications to prevent substitution of a portion of the first and second sacrificial material layers (142, 242) with the first and second electrically conductive layers (146, 246). The sacrificial material layers (142, 242) are provided as dielectric material layers, and alternating stacks of insulating material layers (132, 232) and dielectric material layers (142, 242) is formed at the periphery of each semiconductor chip 900, i.e., each semiconductor die 800 before dicing of the substrate (8, 9).

Additional processing steps for forming additional interconnect level dielectric layers and additional metal interconnect structures can be performed on the exemplary structure of FIG. 14. A passivation layer can be formed as a capping layer on top of the additional interconnect level dielectric layers. Front side bonding pads 960 (shown in FIGS. 15A and 16A) may be formed on the front side through the passivation layer. Alternatively or in addition, through-substrate via (TSV) structures 980 may be formed through the semiconductor substrate (8, 9), and backside bonding pads 990 can be formed on a respective one of the TSV structures 980 over the back side surface of the semiconductor substrate (8, 9) through the peripheral regions 400, as shown in FIGS. 15C and 16B. The backside bonding pads 990 can be electrically isolated from the semiconductor substrate (8, 9) by suitable insulating structures such as insulating spacers 970.

Each semiconductor die 800 can include multiple memory array regions 100 (e.g., memory planes), multiple contact regions 200, and peripheral region 400 and a peripheral device region 700 underlying one or more of the regions (100, 200, 400). Each contiguous set of memory array regions 100, contact regions 200, peripheral region 400 and a peripheral device region 700 can be arranged within a rectangular area, which corresponds to the area of a semiconductor chip 900, i.e., a semiconductor die 800 before dicing the substrate. The regions between the areas of the dies 800 are referred to as kerf regions 600. Each rectangular area of a semiconductor die is spaced apart from the rectangular area of another neighboring semiconductor die 800 by a kerf region 600. The kerf regions 600 can be in the form of a rectangular grid enclosing the rectangular array of semiconductor dies.

According to an aspect of the present disclosure, each of the memory array regions 100 can be located at a periphery of a respective semiconductor die 800, and can be adjoined to the kerf regions 600. In one embodiment, each semiconductor die 800 can include a pair of first straight edges (such as vertically extending edges 197 in FIGS. 15A and 16A) and a pair of second straight edges (such as horizontally extending edges 198 in FIGS. 15A and 16A) such that the four edges define the peripherally of the semiconductor die. In one embodiment, each memory array region 100 can be adjoined to a respective first straight edge 197. In one embodiment, each semiconductor die 800 can include a plurality of memory array regions 100 that contact a pair of first straight edges 197. The plurality of memory array regions 100 for each semiconductor die 800 can include at least one memory array region 100 adjoining one of the first straight edges 197 and at least another memory array region 100 adjoining another of the first straight edges 197 and laterally spaced apart from the at least one memory array region 100 by at least two contact regions 200. For example, each semiconductor die can include two memory array regions 100, four memory array regions 100 (e.g., four memory planes as illustrated in FIGS. 15A and 16A), six memory array regions 100, eight array regions 100, etc. that are laterally spaced apart along the directions of the pair of the first and/or second straight edges (197, 198).

Each contact region 200 can be adjoined to a respective one of the memory array regions 100. The contact regions 200 can adjoin only one of the pair of second straight edges 198 as illustrated in FIG. 15A, or can adjoin both of the pair of second straight edges 198 as illustrated in FIG. 16A. The contact region 200 may have the same lateral dimension as, or may have a greater lateral dimension than, the set of all memory array regions 100 located on a first straight edge of a semiconductor die as illustrated in FIG. 15A. The contact region 200 may have the same lateral dimension as the set of all memory array regions 100 located on a first straight edge of a semiconductor die as illustrated in FIG. 16A. The through-memory-level contact via structures 488 may extend through retro-stepped dielectric material portions (165, 265) in the manner illustrated in the exemplary structure above, or may extend through an area within the peripheral region 400, as illustrated in FIGS. 15C and 16B. The peripheral region 400 can be adjoined to, and can have the same lateral dimension as, a second straight edge 198 as illustrated in FIG. 15A. Alternatively, the peripheral region 400 can be laterally spaced from the first straight edges 197, and can be adjoined to two second straight edges 198 as illustrated in FIG. 16A.

According to an aspect of the present disclosure, the first and second sacrificial material layers (142, 242) can be replaced with electrically conductive layers (146, 246) only within portions of the memory array regions 100 that are laterally offset from the kerf regions 600 and within the contact regions 200, but are not replaced with the electrically conductive layers (146, 246) in the kerf regions 600 and in the peripheral regions 400. The first and second sacrificial material layers (142 242) can be dielectric material layers such as silicon nitride layers. In this case, each border area of the memory array regions 100 that borders the kerf regions 600 can include an alternating stack of insulating layers (132, 232) and dielectric material layers (142, 242). The dielectric material layers (142, 242) can include first sacrificial material layers 142 which are herein referred to as first dielectric material layers 142 and second sacrificial material layers 242 which are herein referred to as second dielectric material layers 242.

Seal ring structures 199 can be formed within, and along, the border of each semiconductor die, and can extend through the alternating stack of insulating layers (132, 232) and dielectric material layers (142, 242) in the peripheral area of the memory array regions 100. Each seal ring structure 199 can include a set of metallic structures vertically extending from the semiconductor substrate (8, 9) to a passivation dielectric layer (i.e., the topmost layer of the semiconductor chip) and laterally enclosing all active components of the semiconductor chip including a contiguous set of memory array regions 100, contact regions 200, and a peripheral region 400. The seal ring structures 199 can include a single seal ring structure 199, or a plurality of seal ring structures 199. In the illustrated examples of FIGS. 15A-15C and 16A-16C, two or three seal ring structures 199 are provided as a nested structure for each semiconductor chip 900. However, one or more than three seal ring structures 199 can be provided.

The semiconductor dies 800 can be diced after formation of front side bonding pads 960 and/or backside binding pads 990 along dicing channels, which extend along the middle of the kerf regions 600 along the lengthwise direction of each kerf region 600. The dicing channels can form a rectangular grid that dissects each kerf region 600 along the lengthwise direction of each kerf region 600. Upon dicing, each diced semiconductor chip 900 has a pair of first die sidewalls 297 and a pair of second die sidewalls 298 that are perpendicular to the pair of first die sidewalls, as shown in FIGS. 31B and 31C. The first die sidewalls 297 can be parallel to the first straight edges 197, and the second die sidewalls 298 can be parallel to the second straight edges 198.

According to an aspect of the present disclosure, a semiconductor die 800 includes a pair of first alternating stacks (as provided within a pair of memory array regions 100 that are spaced apart along the direction of the second straight edges 198 of the semiconductor die 800 as illustrated in FIGS. 15A and 16A) of first portions of insulating layers (132, 232) and electrically conductive layers (146, 246) located over a semiconductor substrate (8, 9), wherein stepped surfaces of layers of the pair of first alternating stacks are provided in a respective terrace region (which can be in a contact region 200). Groups of memory stack structures 55 vertically extend through a respective one of the pair of the first alternating stacks, wherein each of the memory stack structures 55 comprises a memory film 50 and a vertical semiconductor channel 60 laterally surrounded by the memory film 50. A pair of second alternating stacks (132, 142, 232, 242) of second portions of the insulating layers (132, 232) and dielectric material layers (142, 242) are laterally adjoined to a respective one of the first alternating stacks (132, 146, 232, 246). Each second portion of the insulating layers (132, 232) is connected to a respective one of the first portions of the insulating layers (132, 232). At least one seal ring structure 199 laterally encloses and is laterally spaced from, the pair of first alternating stacks (132, 146, 232, 246), and contacts sidewalls of each of the pair of second alternating stacks (132, 142, 232, 242).

In one embodiment, a set of contiguous dielectric material portions (165, 265) are located between the pair of first alternating stacks (132, 146, 232, 246) and overlying the stepped surfaces of the pair of first alternating stacks (132, 146, 232, 246). A first linear section 199A of the at least one seal ring structures 199 contacts the first sidewall of each of the pair of second alternating stacks (132, 142, 232, 242) and does not contact, and is laterally spaced from, the set of contiguous dielectric material portions (165, 265), as illustrated in FIGS. 15A, 15B, 16A and 16B.

In one embodiment, a second linear section of 199B of the at least one seal ring structure 199 contacts the set of contiguous dielectric material portions (165, 265), as shown in FIG. 15C. In another embodiment shown in FIG. 16C, the second linear section 199B of the at least one seal ring structure contacts 199 a second sidewall of each of the pair of second alternating stacks (132, 142, 232, 242) and does not contact the set of contiguous dielectric material portions (165, 265).

In one embodiment, the at least one seal ring structure 199 comprises a moat trench 587 filled with a contact via structure 588 which electrically contacts underlying lower interconnect structures 780. Each second alternating stack (132, 142, 232, 242) may have an L-shape as illustrated in FIG. 15A, or a U-shape as illustrated in FIG. 16A. Each second alternating stack (132, 142, 232, 242) includes a strip portion that extends parallel to a second die sidewall. i.e., a strip portion that extends along the horizontal direction in FIGS. 15A and 16A, such as a strip portion located at a bottom left corner or a strip portion located at a bottom right corner in FIGS. 15A and 16A.

In one embodiment, a second linear section 199B of the one (i.e., the innermost one or the only one) of the at least one seal ring structures 199 contacts another sidewall of each of the pair of second alternating stacks (132, 142, 232, 242), i.e., the sidewalls of strips of the second alternating stacks (132, 142, 232, 242) that extend along the bottom side second die sidewall of each semiconductor chip in FIG. 15A or the sidewalls of strips of the second alternating stacks (132, 142, 232, 242) that extend along the top side second die sidewall 298 or the bottom side second die sidewall 298 of each semiconductor chip in FIG. 16A.

In one embodiment, another second linear section 199B (such as a top side second linear section 199B in FIG. 15A and FIG. 15C) of the innermost, or only, seal ring structure 199 contacts a sidewall of the set of contiguous dielectric material portions (165, 265), and does not contact the pair of second alternating stacks (132, 142, 232, 242). The contiguous dielectric material portions (165, 265) overlie the peripheral region 4000 in FIGS. 15A and 15C.

In one embodiment, the dies 800 are diced into semiconductor chips 900, such as chips 900B or 900C, each of which comprise a pair of first die sidewalls 297 (that extend along the vertical direction in FIG. 31B or FIG. 31C) and a pair of second die sidewalls 298 (that extend along the horizontal direction in FIG. 31B or FIG. 31C) that are perpendicular to the pair of first die sidewalls; each seal ring structure 199 includes first linear sections 199A that laterally extend parallel to the pair of first die sidewalls 297 and second linear sections 199B that laterally extend parallel to the pair of second die sidewalls 298; and each first linear section 199A of one (i.e., an innermost one) of the at least one seal ring structures contacts a sidewall of a respective one of the pair of second alternating stacks (132, 142, 232, 242).

In one embodiment, a continuous interface between the one of the at least one seal ring structures 199 and one of the second alternating stacks (132, 142, 232, 242) extends parallel to the pair of first die sidewalls 297 for a lateral distance that is greater than 80% of a maximum lateral distance of each of the first die sidewalls, and extends parallel to the pair of second die sidewalls 298 for a lateral distance that is less than 50% of a maximum lateral distance of each of the second die sidewalls. In other words, a continuous set of at least one memory array region 100 can extend parallel to the pair of first die sidewalls for a lateral distance that is greater than 80% of a maximum lateral distance of each of the first die sidewalls, and can extend parallel to the pair of second die sidewalls for a lateral distance that is less than 50% of a maximum lateral distance of each of the second die sidewalls. In one embodiment, the continuous set of at least one memory array region 100 can extend parallel to the pair of first die sidewalls for a lateral distance that is less than the maximum lateral distance of each of the first die sidewalls as illustrated in FIG. 15A, or can extend parallel to the pair of first die sidewalls for a lateral distance that is substantially equal to the maximum lateral distance of each of the first die sidewalls as illustrated in FIG. 16A.

In one embodiment, another second linear section 199B of the innermost, or only, seal ring structure 199 contacts yet another sidewall of each of the pair of second alternating stacks (132, 142, 232, 242), as illustrated in FIGS. 16A and 16C.

In one embodiment, a continuous interface between the one of the at least one seal ring structures 199 (i.e., the innermost one of may, or the only one if only a single seal ring structure 199 is provided) and one of the second alternating stacks (132, 142, 232, 242) extends parallel to the pair of first die sidewalls for a lateral distance that is greater than 99% of a maximum lateral distance of each of the first die sidewalls, and extends in proximity to, and parallel to, each of the pair of second die sidewalls for a lateral distance that is less than 50% of a maximum lateral distance of each of the second die sidewalls as illustrated in FIG. 16.

In one embodiment, the at least one seal ring structure 199 can comprise a plurality of seal ring structures 199 arranged as nested structures. Each seal ring structure 199 comprises a moat trench 587 filled with a contact via structure 588 which electrically contacts underlying interconnects 780.

Generally, each semiconductor die 800 can further comprise: semiconductor devices 710 located on a top surface of the semiconductor substrate (8, 9); lower interconnect level dielectric layers 760 located over the semiconductor devices 710 and embedding lower interconnect structures 780 that are electrically connected to a respective one of the semiconductor devices 710, wherein the pair of first alternating stacks (132, 146, 232, 246), the groups of memory stack structures 55, the set of contiguous dielectric material portions (165, 265), and the pair of second alternating stacks (132, 142, 232, 242) are located above the lower interconnect level dielectric layers 760; and upper interconnect level dielectric layers (280, 282, 284, etc.) located over the pair of first alternating stacks (132, 146, 232, 246), the groups of memory stack structures 55, the set of contiguous dielectric material portions (165, 265), and the pair of second alternating stacks (132, 142, 232, 242) and embedding upper interconnect structures (88, 96, 98, etc.) and underlying a passivation dielectric layer, which is the topmost layer of the semiconductor die 800.

In one embodiment, the semiconductor die 800 comprises a monolithic three-dimensional NAND memory device; the electrically conductive layers (146, 246) comprise, or are electrically connected to, a respective word line of the monolithic three-dimensional NAND memory device; bottom ends of the memory stack structures 55 contact a semiconductor material layer (such as a planar semiconductor layer 10); the memory stack structures 55 comprise an array of monolithic three-dimensional NAND strings of the monolithic three-dimensional NAND memory device; and an integrated circuit comprising a driver circuit for monolithic three-dimensional NAND memory device is located on the semiconductor substrate (8, 9) (as a subset of the semiconductor devices).

In one embodiment, the electrically conductive layers (146, 246) comprise a plurality of control gate electrodes having a strip shape extending substantially parallel to the top surface of the semiconductor substrate; and the array of monolithic three-dimensional NAND strings comprises a plurality of semiconductor channels (59, 11, 60), wherein at least one end portion 60 of each of the plurality of semiconductor channels (59, 11, 60) extends substantially perpendicular to a top surface of the semiconductor substrate (8, 9), and a plurality of charge storage elements (as embodied as portions of the charge storage layers 54 located at levels of the electrically conducive layers (146, 246), each charge storage element located adjacent to a respective one of the plurality of semiconductor channels (59, 11, 60).

Processing steps for making structural modifications with respect to the exemplary structure of FIG. 14 in order to provide the second alternating stacks (132, 142, 232, 242) within the semiconductor dies of FIGS. 15A-15C and 16A-16C are described below employing a second exemplary structure. It should be noted that the processing steps for forming the first exemplary structure can be modified in the same manner to provide the second alternating stacks (132, 142, 232, 242). Thus, the use of the second exemplary structure for description of processing steps that form the second alternating stacks (132, 142, 232, 242) is only illustrative, and the same processing steps can be performed on the first exemplary structure (while making necessary alterations while not affecting the main point at issue) to provide the second alternating stacks (132, 142, 232, 242) that can be incorporated into each of the semiconductor dies illustrated in FIGS. 15A-15C and 16A-16C.

Figure 17A:
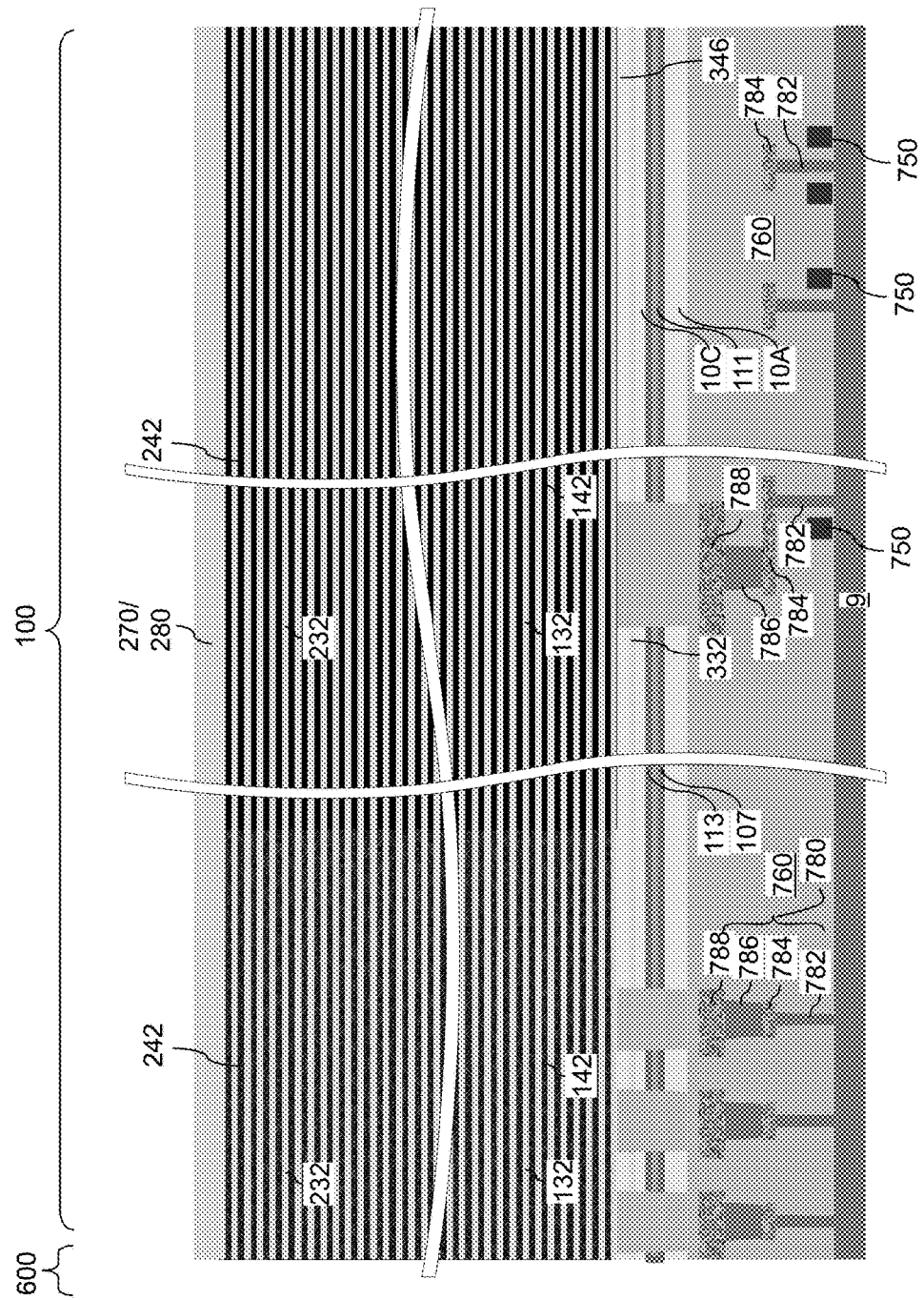
FIG. 17A is a vertical cross-sectional view of a second exemplary structure that may be incorporated into region M in FIGS. 15A and 15B or in FIGS. 16A and 16B after formation of a second insulating cap layer and/or a first contact level dielectric layer according to an embodiment of the present disclosure.
Figure 17B:
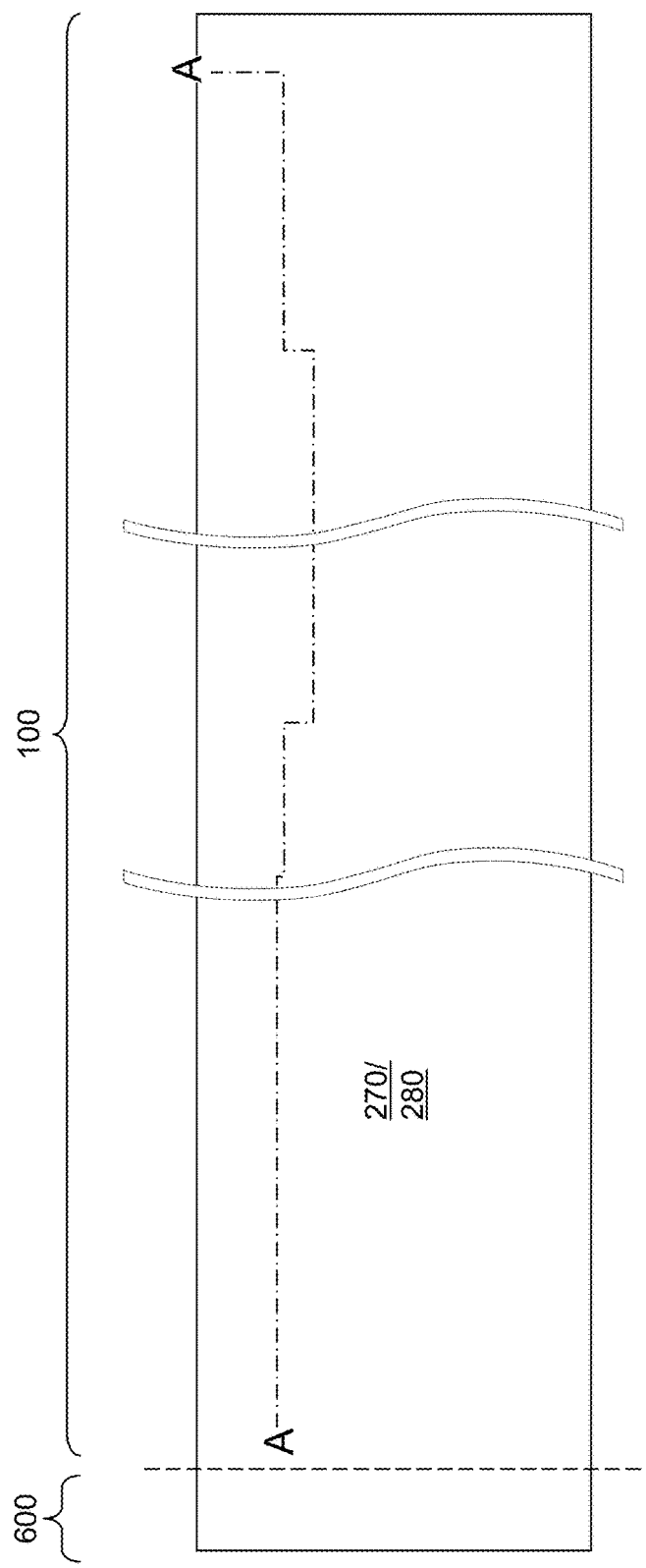
FIG. 17B is a top-down view of the second exemplary structure of FIG. 17A.

Referring to FIGS. 17A and 17B, a vertical cross-sectional view and a top-down view are illustrated for region M in FIGS. 15A and 15B or in FIGS. 16A and 16B after formation of a second insulating cap layer 270 and/or a first contact level dielectric layer 280 according to an embodiment of the present disclosure. The second insulating cap layer 270 and/or the first contact level dielectric layer 280 can be formed as two separate layers, or may be formed as a single integrated layer that performs the functions of the second insulating cap layer 270 and the first contact level dielectric layer 280.

The first exemplary structure of FIG. 1 can be employed to form the second exemplary structure. In one embodiment, a source layer stack (10A, 107, 111, 113, 10C, 332, 346) can be formed in lieu of the planar semiconductor layer 10 in case a buried source layer is to be subsequently formed. The source layer stack (10A, 107, 111, 113, 10C, 332, 346) can include, from bottom to top, a bottom conductive layer 10A (which can be a bottom boron-doped polysilicon or amorphous silicon layer), a lower silicon oxide liner 107, a sacrificial source level layer 111 including a sacrificial material (such as undoped polysilicon or amorphous silicon), an upper silicon oxide liner 113, an upper conductive layer 10C (which can be a top boron-doped polysilicon or amorphous silicon layer), a source isolation dielectric layer 332 (which can include a silicon oxide layer), and a source select level electrically conductive layer 346 (which can include a doped polysilicon or amorphous silicon).

A vertically alternating sequence of continuous insulating layers and continuous dielectric material layers having a different composition than the continuous insulating layers over a semiconductor substrate (8, 9), for example, over the source layer stack (10A, 107, 111, 113, 10C, 332, 346). The vertically alternating sequence can be patterned such that patterned portions of the vertically alternating sequence comprises a pair of in-process alternating stacks of insulating layers (132, 232) and dielectric material layers (242, 242). Each in-process alternating stack of insulating layers (132, 232) and dielectric material layers (242, 242) can be formed within the area of at least one respective memory array region 100, which can be a pair of memory array regions 100 that are laterally spaced apart along the direction of the second straight edges in FIGS. 15A and 15B. Stepped surfaces of layers of the pair of in-process alternating stacks (132, 142, 232, 242) can be provided in a respective terrace region, which can be located within a respective contact region 200 located between the memory array regions 100. A set of contiguous dielectric material portions (165, 265; not expressly illustrated in FIGS. 17A and 17B; see, for example, FIG. 6) can be formed between the pair of in-process alternating stacks (132, 142, 232, 242) and over the stepped surfaces of the pair of in-process alternating stacks (132, 142, 232, 242). The processing steps of FIGS. 1, 2, 3, and 6 can be employed to provide the second exemplary structure of FIGS. 17A and 17B. Processing steps for formation of first-tier memory openings 149, first-tier support openings 119, sacrificial memory opening fill portions 148, and sacrificial support opening fill portions 118, illustrated in FIGS. 4A, 4B, and 5, may, or may not, be performed.

Figure 18A:
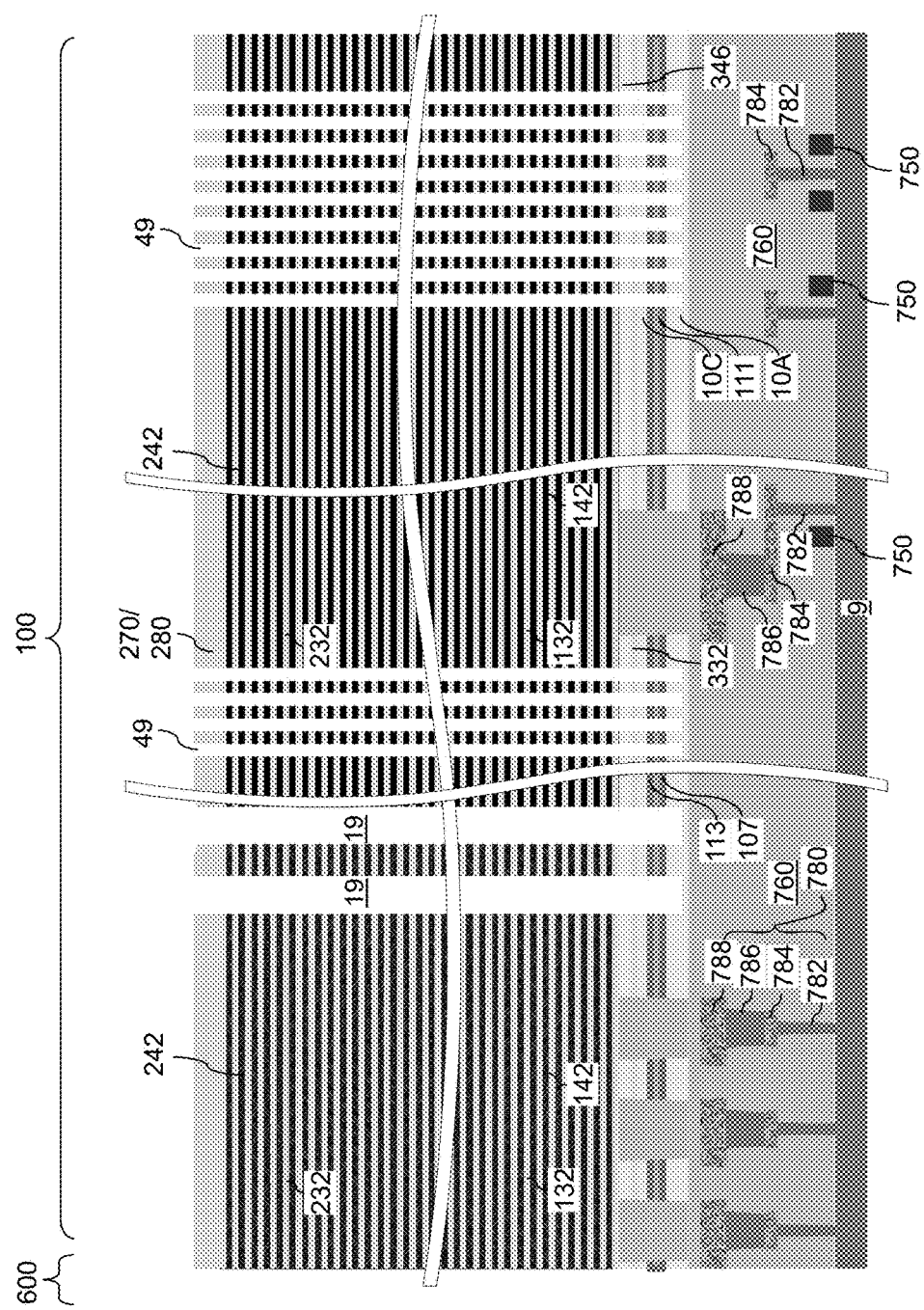
FIG. 18A is a vertical cross-sectional view of the second exemplary structure after formation of inter-tier memory openings and inter-tier support openings according to an embodiment of the present disclosure.
Figure 18B:
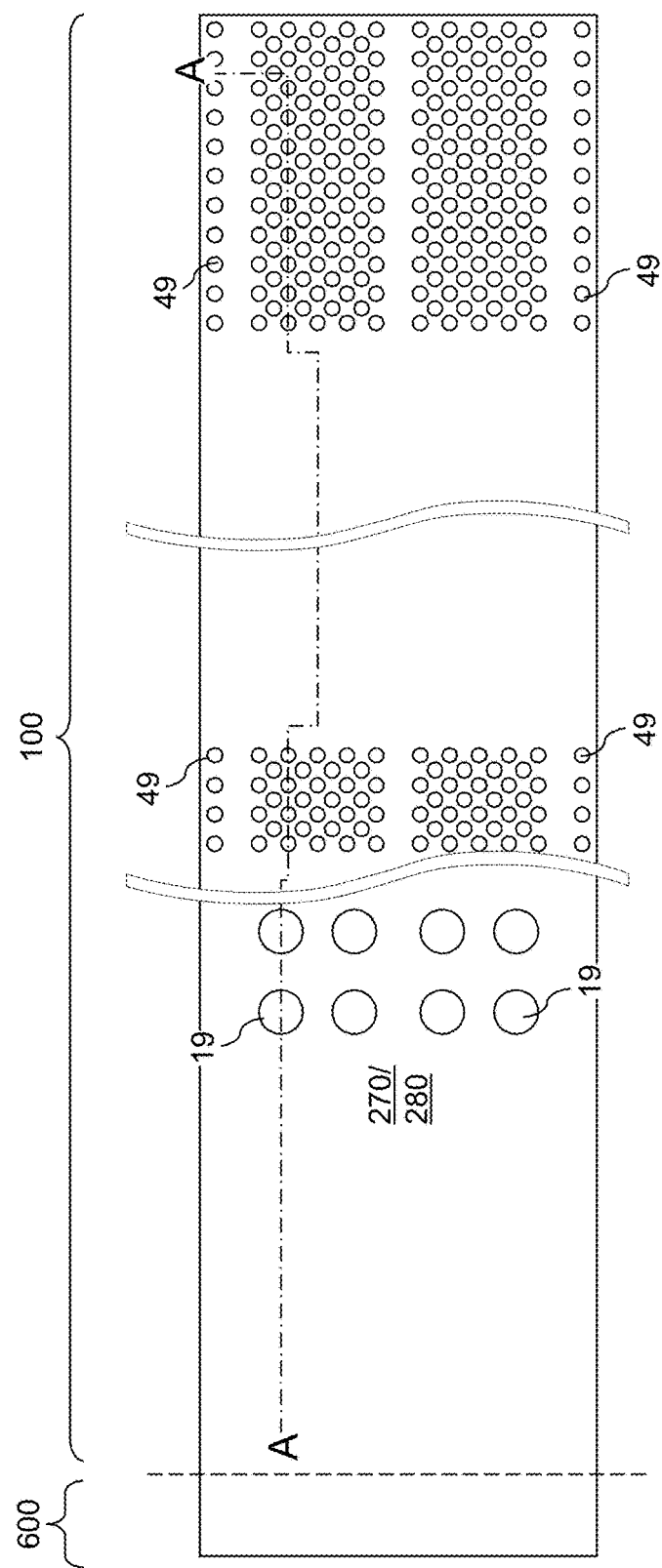
FIG. 18B is a top-down view of the second exemplary structure of FIG. 18A.

Referring to FIGS. 18A and 18B, memory openings 49 (which are also referred to as inter-tier memory openings) and the support openings 19 (which are also referred to as inter-tier support openings, and can be the same as the support openings (119, 219) in the first exemplary structure) can be formed. For example, the processing steps of FIGS. 7A and 7B can be employed.

Figure 19A:
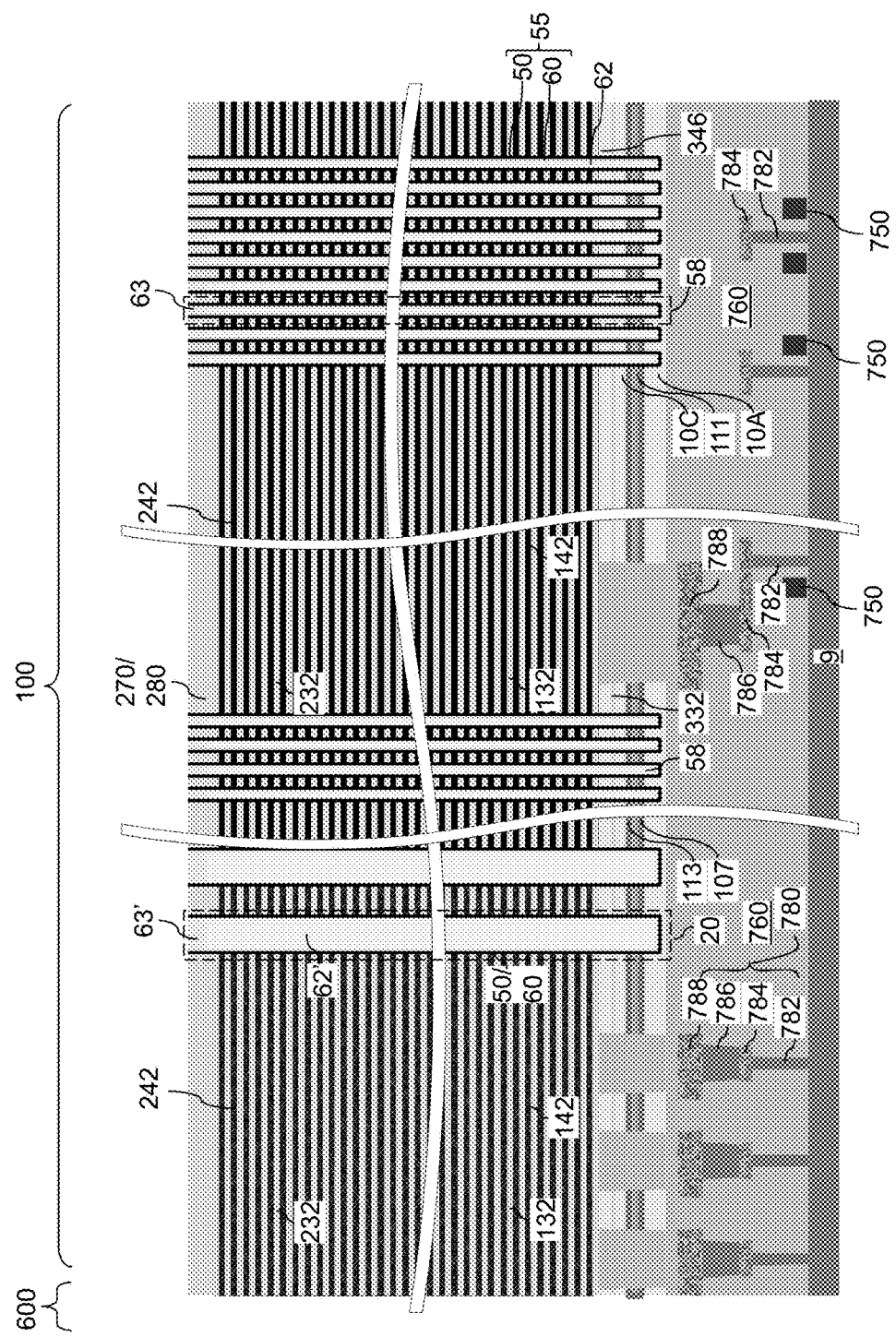
FIG. 19A is a vertical cross-sectional view of the second exemplary structure after formation of memory stack structures and support pillar structures according to an embodiment of the present disclosure.
Figure 19B:
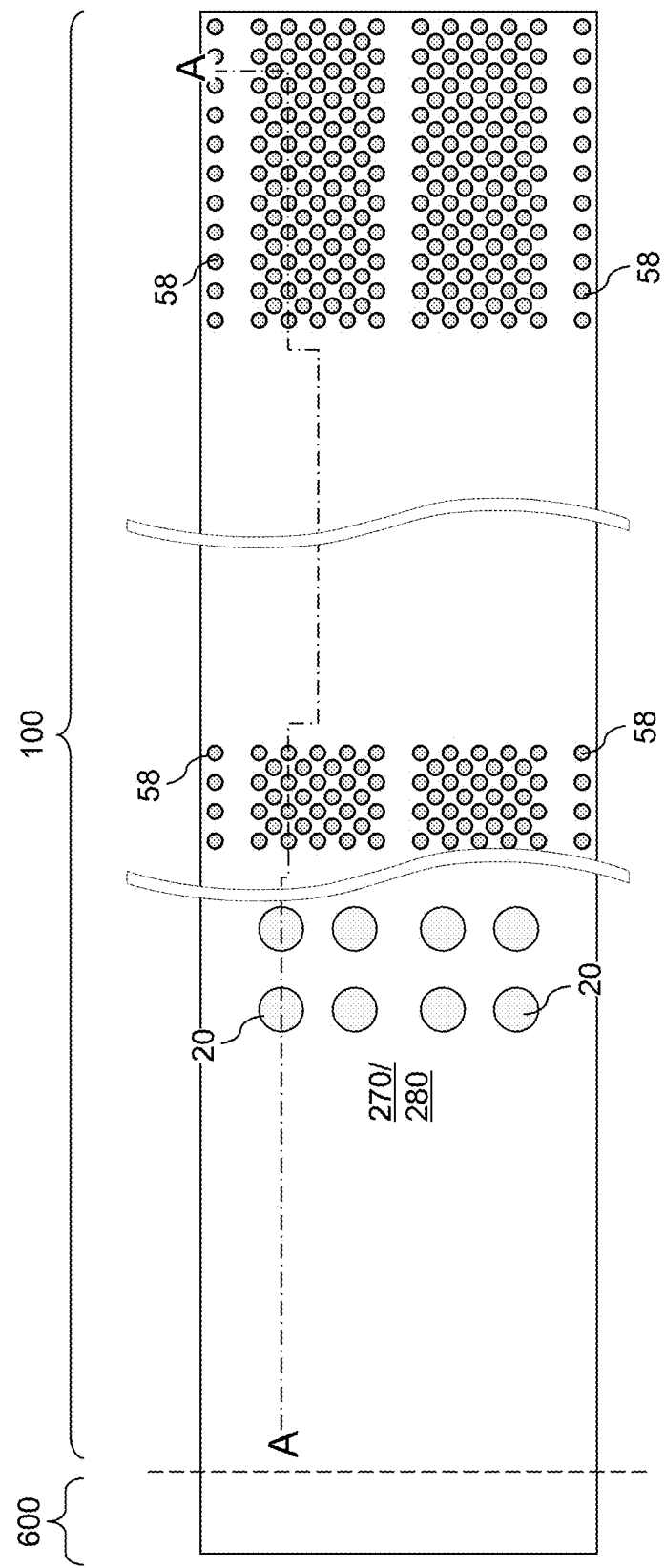
FIG. 19B is a top-down view of the second exemplary structure of FIG. 19A.

Referring to FIGS. 19A and 19B, the processing steps of FIG. 8 can be performed to form memory opening fill structures 58 and support pillar structures 20. Each memory opening fill structure 58 can include a respective memory stack structure 55. Groups of memory stack structures 55 vertically extend through the pair of in-process alternating stacks (132, 142, 232, 242). Each of the memory stack structures 55 comprises a memory film 50 and a vertical semiconductor channel 60 laterally surrounded by the memory film 50. Each support pillar structure 20 can include a dummy drain region 63' having the same material composition as the drain regions 63, but which is not electrically connected to a bit line.

Figure 20A:
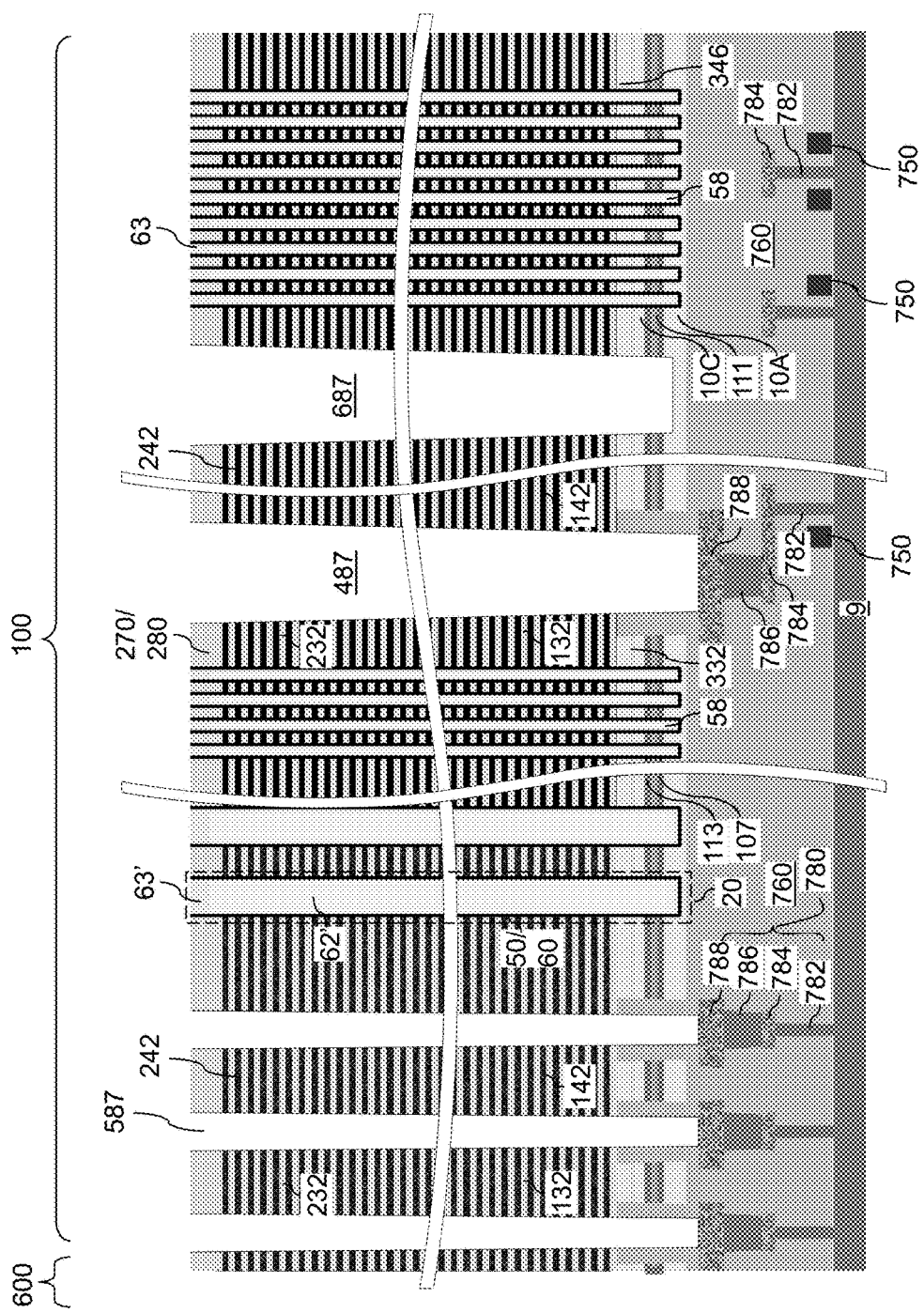
FIG. 20A is a vertical cross-sectional view of the second exemplary structure after formation of various via cavities through the alternating stacks down to top surfaces of lower metal interconnect structures according to an embodiment of the present disclosure.
Figure 20B:
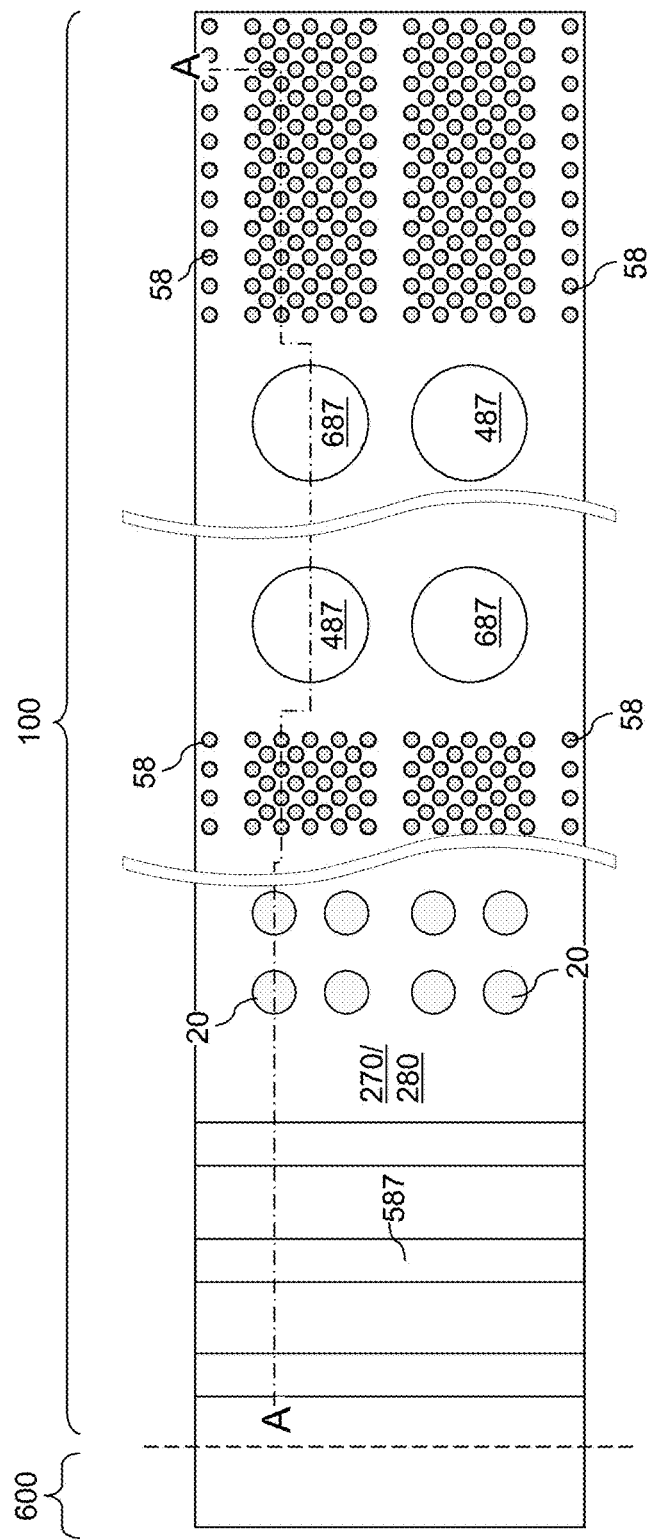
FIG. 20B is a top-down view of the second exemplary structure of FIG. 20A.

Referring to FIGS. 20A and 20B, various cavities (487, 587, 687) vertically extending through the in-process alternating stacks (132, 142, 232, 242) can be formed. The various via cavities (487, 587, 687) can include through-memory-level via cavities 487 that vertically extend through the in-process alternating stacks (132, 142, 232, 242) down to top surfaces of lower metal interconnect structures 780 (such as topmost lower metal line structure 788) within areas of the memory array region 100 including the memory opening fill structures 58 or through the continuous dielectric material portions (such as retro-stepped dielectric material portions (165, 265)) within the contact region 200 or within the peripheral device region. The various via cavities (487, 587, 687) can include source contact via cavities 687 that vertically extend through the in-process alternating stacks (132, 142, 232, 242) and into the bottom conductive layer 10A within the source layer stack (10A, 107, 111, 113, 10C, 332, 346).

The various via cavities (487, 587, 687) can include at least one moat trench 587 that vertically extends through the in-process alternating stacks (132, 142, 232, 242) down to top surfaces of lower metal interconnect structures 780 (such as topmost lower metal line structure 788) along a periphery of, and within, each semiconductor die 800. The at least one moat trench 587 can be a single continuous moat trench that laterally surrounds all devices within the semiconductor die, or may be a plurality of nested moat trenches that laterally surround all devices within the semiconductor die. Lower metal interconnect structures 780 can provide continuous enclosing metal structures at each level of the lower interconnect level dielectric layers 760 to provide a set of gapless enclosing metal structures between the semiconductor substrate (8, 9) and each moat trench 587. As such, each set of gapless enclosing metal structures can include a vertical stack of metal structures laterally enclosing the entirety of the memory array regions 100, the contact regions 200, the peripheral region 400 and the peripheral device region 700 of a semiconductor die 800, and can extend vertically between the semiconductor substrate (8, 9) and a bottom surface of a respective moat trench 587. In the illustrative example, the at least one moat trench can be provided as a nested set of three moat trenches 587.

Figure 21A:
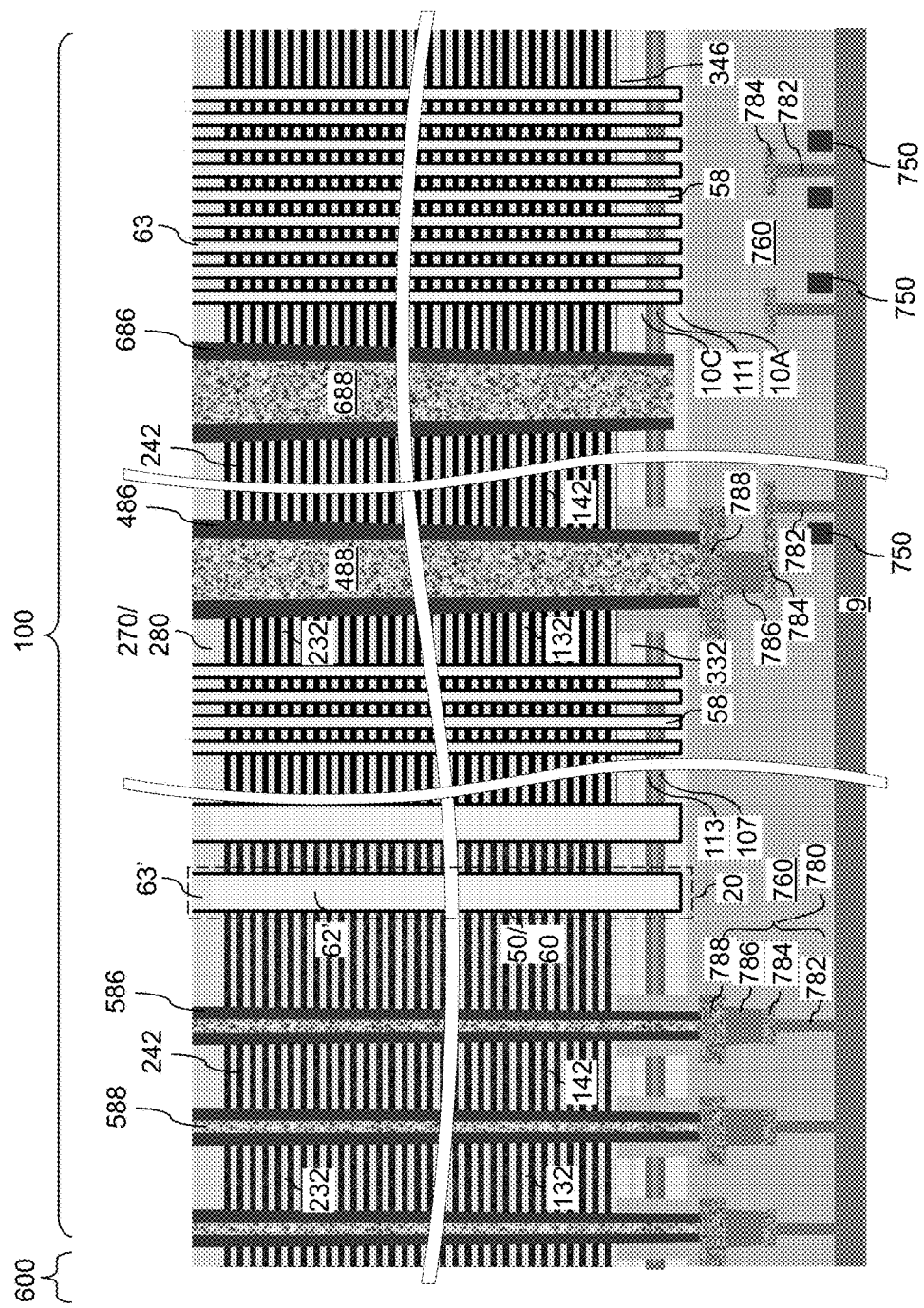
FIG. 21A is a vertical cross-sectional view of the second exemplary structure after formation of various via structures in the via cavities according to an embodiment of the present disclosure.
Figure 21B:
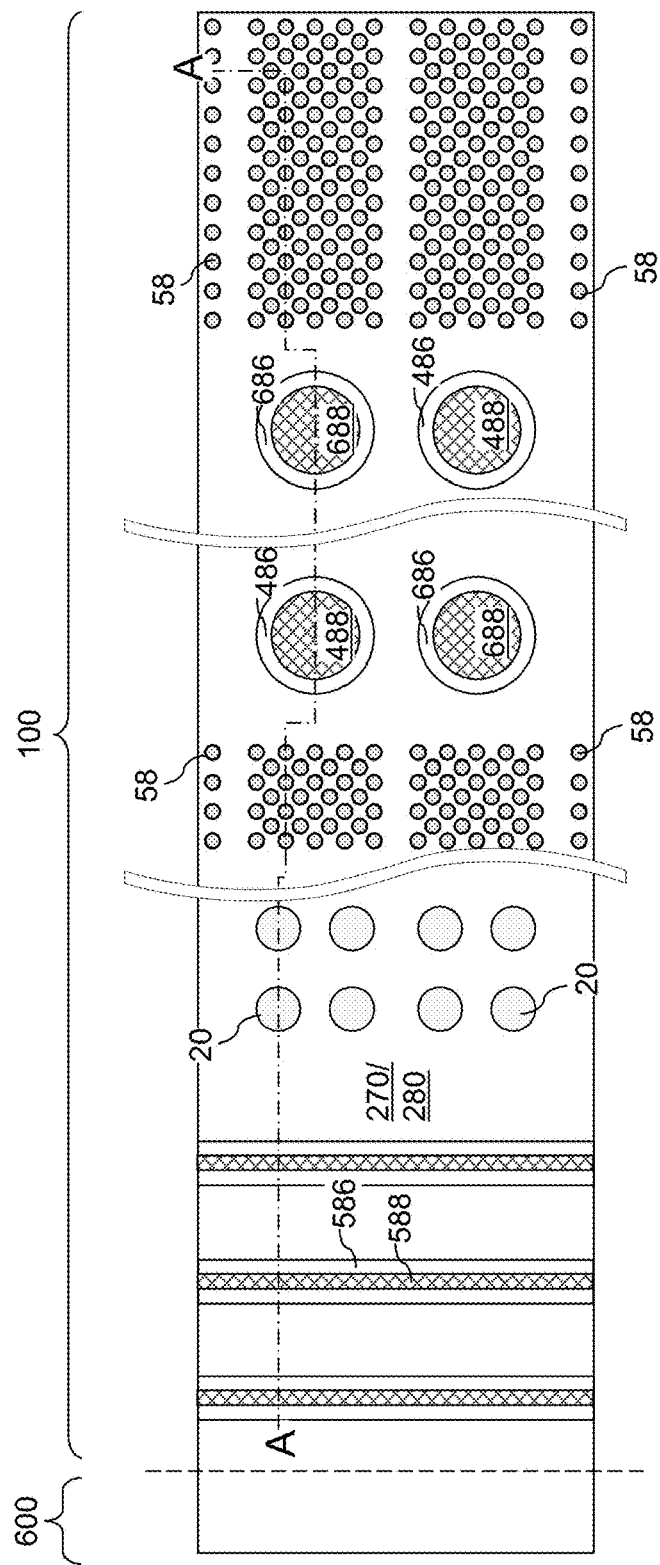
FIG. 21B is a top-down view of the second exemplary structure of FIG. 21A.

Referring to FIGS. 21A and 21B, an insulating liner (486, 586, 686) can be formed within each of the various via cavities (487, 587, 687), for example, by deposition of a conformal dielectric material layer (such as a silicon oxide layer) and an anisotropic etch of the conformal dielectric material layer. At least one conductive material can be deposited in the remaining volumes of the various via cavities (487, 587, 687) to form via structures (488, 588, 688). The via structures (488, 588, 688) include through-memory-level via structures 488 that vertically extend through the in-process alternating stacks (132, 142, 232, 242) and contact top surfaces of lower metal interconnect structures 780 (such as topmost lower metal line structure 788) below the memory array region 100 including the memory opening fill structures 20 or through the continuous dielectric material portions (such as retro-stepped dielectric material portions (165, 265)) within the contact region 200 or within the peripheral region 400. Further, the via structures (488, 588, 688) include source contact via structures 688 that vertically extend through the in-process alternating stacks (132, 142, 232, 242) and contact the bottom conductive layer 10A within the source layer stack (10A, 107, 111, 113, 10C, 332, 346).

Further, the via structures (488, 588, 688) include at least one moat fill via structure 588 that vertically extends through the in-process alternating stacks (132, 142, 232, 242) and contacts top surfaces of lower metal interconnect structures 780 (such as topmost lower metal line structure 788) along a periphery of, and within, each semiconductor die 800. The at least one moat fill via structure 588 can be a single continuous moat fill via structure 588 that laterally surrounds all devices within the semiconductor die, or may be a plurality of nested moat fill via structures 588 that laterally surround all devices within the semiconductor die.

Figure 22A:
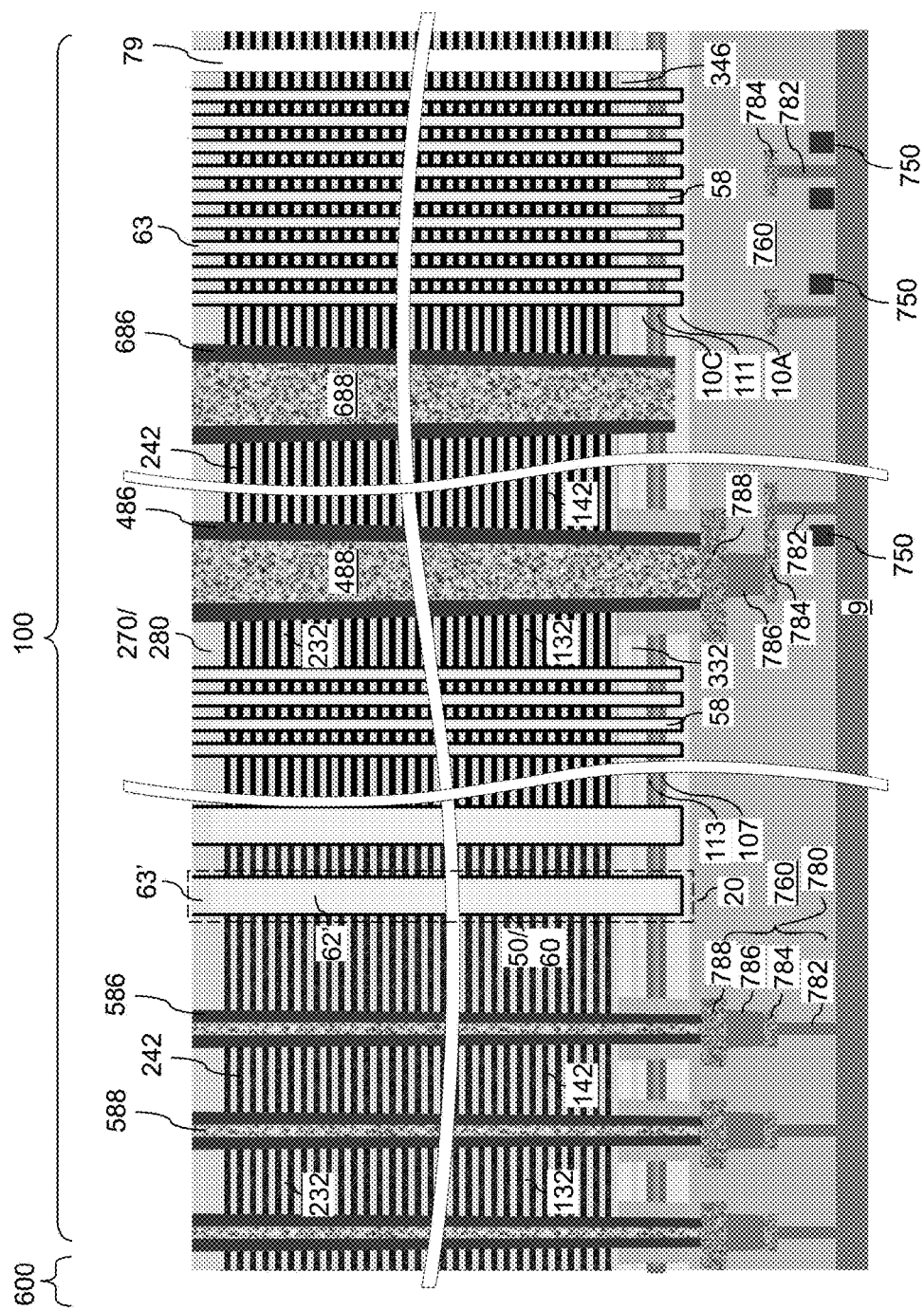
FIG. 22A is a vertical cross-sectional view of the second exemplary structure after formation of backside trenches according to an embodiment of the present disclosure.
Figure 22B:
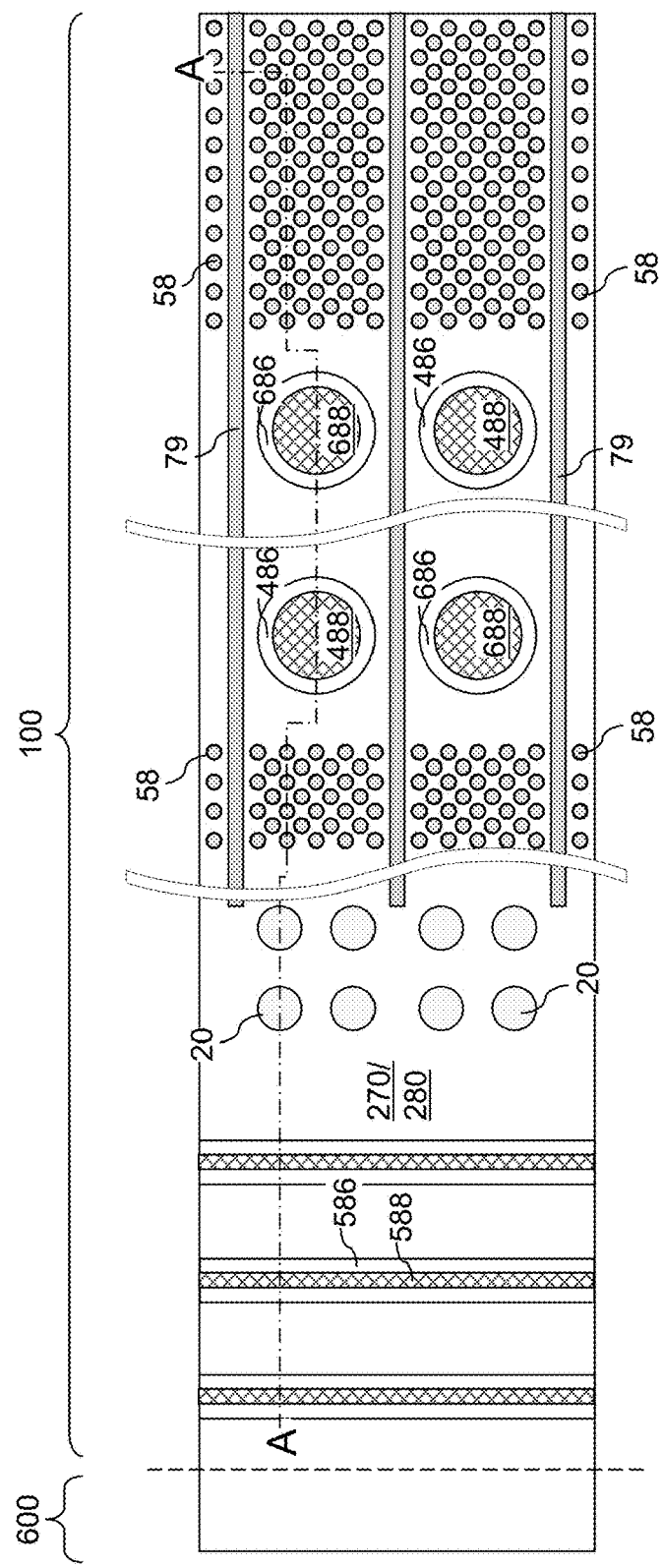
FIG. 22B is a top-down view of the second exemplary structure of FIG. 22A.

Referring to FIGS. 22A and 22B, backside trenches 79 can be formed through the in-process alternating stack (132, 142, 232, 242), the source select level electrically conductive layer 346, the source isolation dielectric layer 332, the upper conductive layer 10C, the upper silicon oxide liner 113, and the sacrificial source level layer 111. The lower silicon oxide liner 107 can be employed as an etch stop layer. The backside trenches 79 do not extend to the border area containing the moat fill via structures 588 in the moat trenches 587

Figure 23A:
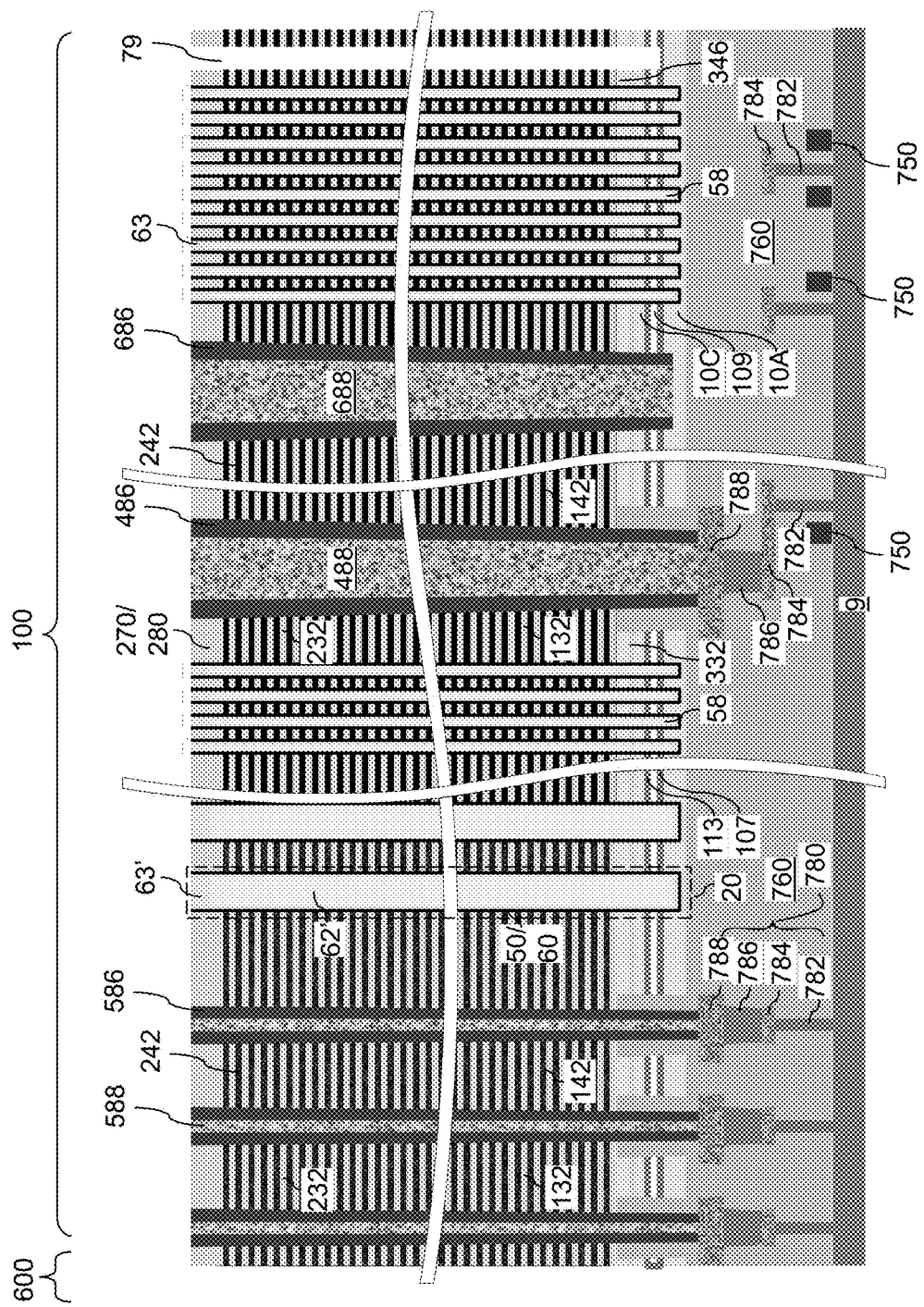
FIG. 23A is a vertical cross-sectional view of the second exemplary structure after removal of a sacrificial source level material layer according to an embodiment of the present disclosure.
Figure 23B:
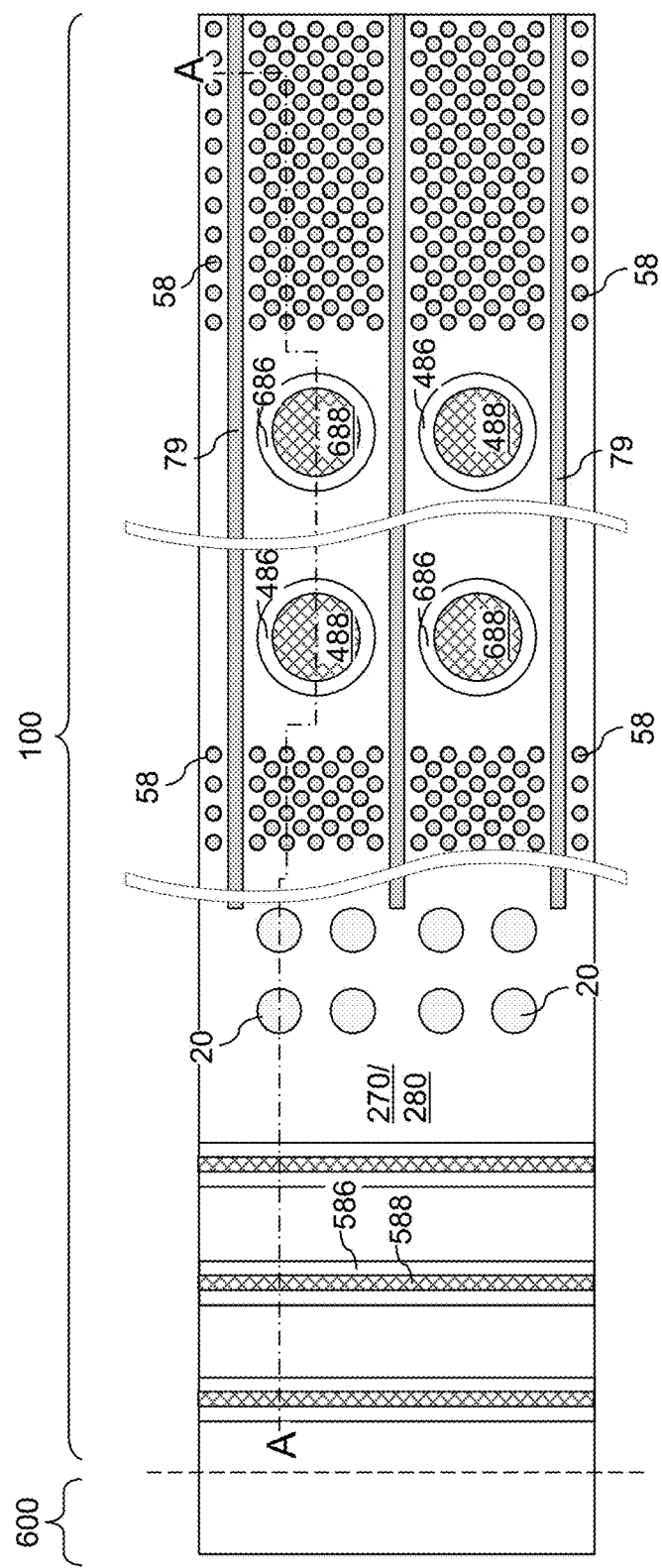
FIG. 23B is a top-down view of the second exemplary structure of FIG. 23A.

Referring to FIGS. 23A and 23B, an isotropic etch process that etches the material of the sacrificial source level layer 111 selective to the materials of the lower silicon oxide liner 107, the upper silicon oxide liner 113, the source select level electrically conductive layer 346, the source isolation dielectric layer 332, and the upper conductive layer 10C can be performed to form a source cavity 109 in the volume from which the sacrificial source level layer 111 is removed. For example, if the source select level electrically conductive layer 346 and the upper conductive layer 10C include boron doped polysilicon having a boron concentration of at least $5.0 \times 10^{19}/cm^3$, and if the sacrificial source level layer 111 includes undoped polysilicon, a wet etch employing a trimethyl(2-hydroxyethyl)ammonium hydroxide (TMY) can be employed to remove the sacrificial source level layer 111 selective to the source select level electrically conductive layer 346 and the upper conductive layer 10C.

Figure 24A:
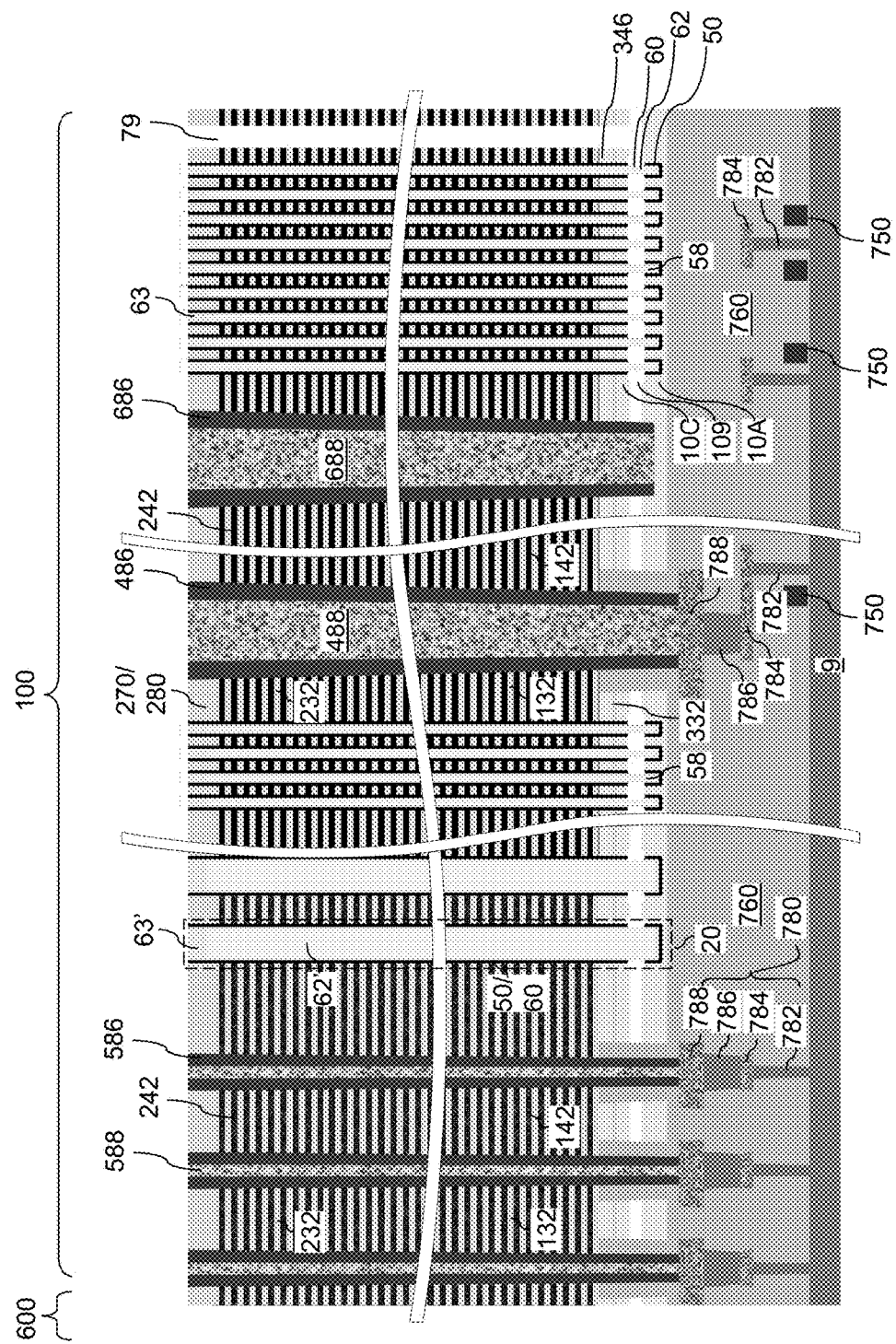
FIG. 24A is a vertical cross-sectional view of the second exemplary structure after removal of sacrificial source level liners and physically exposed portions of memory films according to an embodiment of the present disclosure.
Figure 24B:
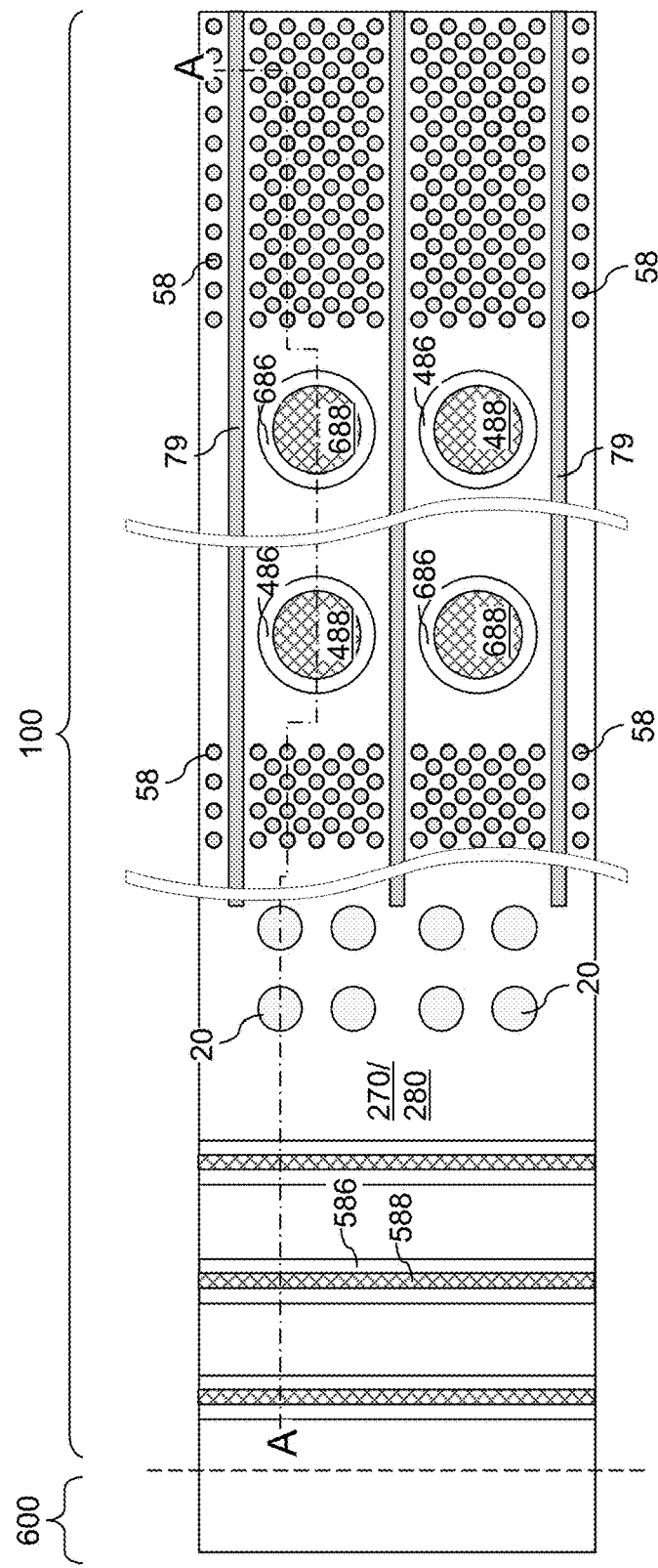
FIG. 24B is a top-down view of the second exemplary structure of FIG. 24A.

Referring to FIGS. 24A and 24B, an isotropic etch can be performed to remove the lower silicon oxide liner 107, the upper silicon oxide liner 113, and physically exposed portions of the memory films 50 at the level of the source cavity 109. A cylindrical surface of each vertical semiconductor channel 60 can be physically exposed to a respective source cavity 109. The isotropic etch can include a wet etch process that removes the materials of the lower silicon oxide liner 107, the upper silicon oxide liner 113, and the memory films 50. The various layers within each memory film 50 can be sequentially etched from outside to inside to physically expose cylindrical surfaces of the vertical semiconductor channels 60 at the level of the source cavity 109.

Figure 25B:
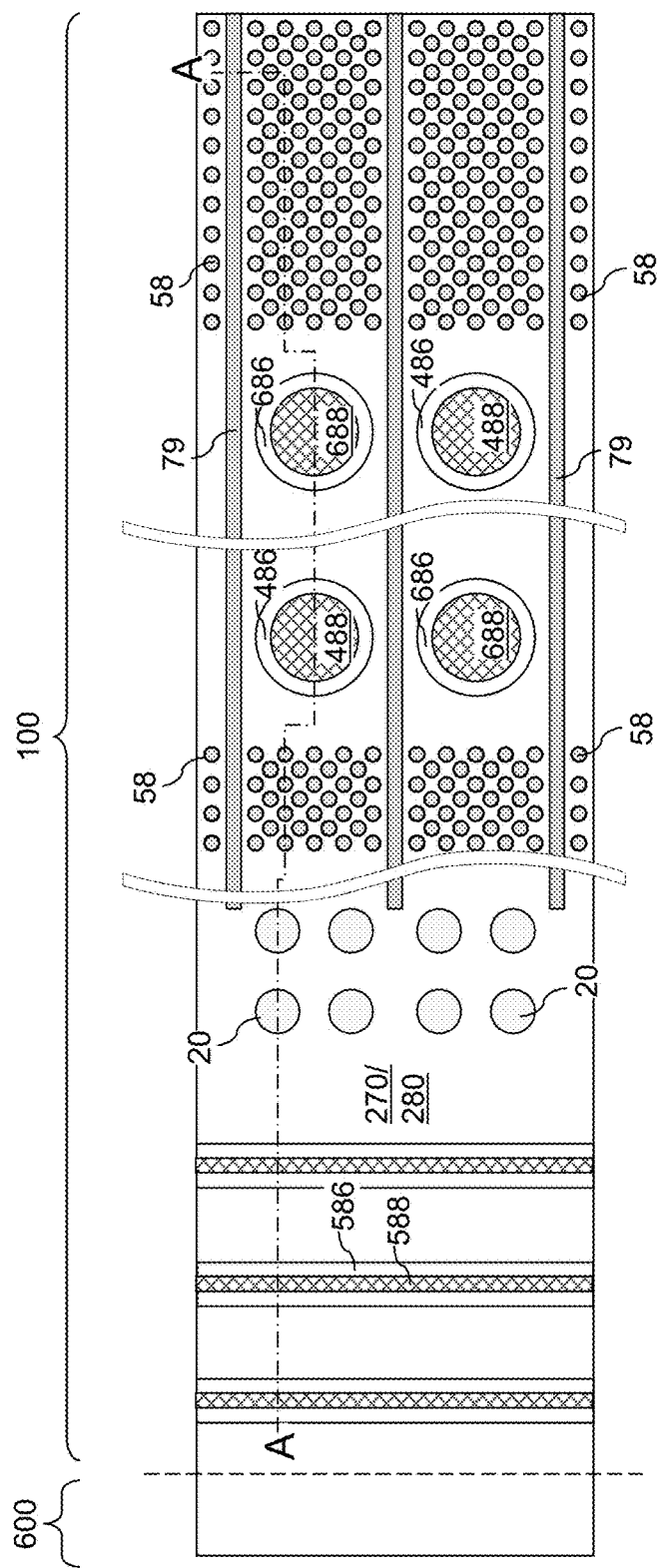
FIG. 25B is a top-down view of the second exemplary structure of FIG. 25A.

Referring to FIGS. 25A and 25B, a selective semiconductor deposition process (such as selective epitaxy) can be performed to deposit a doped semiconductor material in the source cavity 109. The doped semiconductor material grows only from physically exposed semiconductor surfaces (e.g., polysilicon surfaces) of the semiconductor channels 60 in the source cavity 109 while growth of the doped semiconductor material from dielectric surfaces is suppressed during the selective semiconductor deposition process. A selectively deposited doped semiconductor layer 10B can be formed in the source cavity 109 by the selective semiconductor deposition process. In one embodiment, the selectively deposited doped semiconductor layer 10B can include boron doped polysilicon. The upper conductive layer 10C, the selectively deposited doped semiconductor layer 10B, and the lower conductive layer 10A collectively constitute a buried source layer 14 (e.g., a direct strap contact which electrically contacts the via structure 688).

Subsequently, an isotropic etchant can be introduced into the backside trenches 79 to etch the materials of the first and second sacrificial material layers (142, 242) selective to the materials of the first and second insulating layers (132, 232), the first contact level dielectric layer 270, the first and second insulating cap layers (170, 270), the source select level electrically conductive layer 346, the source isolation dielectric layer 332, and the buried source layer 14.

The duration of the isotropic etch process can be selected such that portions of the first and second dielectric material layers (142, 242) proximal to the backside trenches 79 are removed, while portions of the first and second dielectric material layers (142, 242) that are distal from the backside trenches 79 are not removed. In one embodiment, the processing steps of FIGS. 11A and 11B can be performed with a controlled etch duration to remove portions of the first and second dielectric material layers (142, 242) from areas of the memory stack structures 55 in the memory array regions 100 and from the contact regions 200 without removing portions of the first and second dielectric material layers (142, 242) from areas proximal to the kerf regions 600. First backside recesses 143 are formed in volumes from which the first dielectric material layers 142 are removed, and second backside recesses 243 are formed in volumes from which the second dielectric material layers 242 are removed.

Figure 26A:
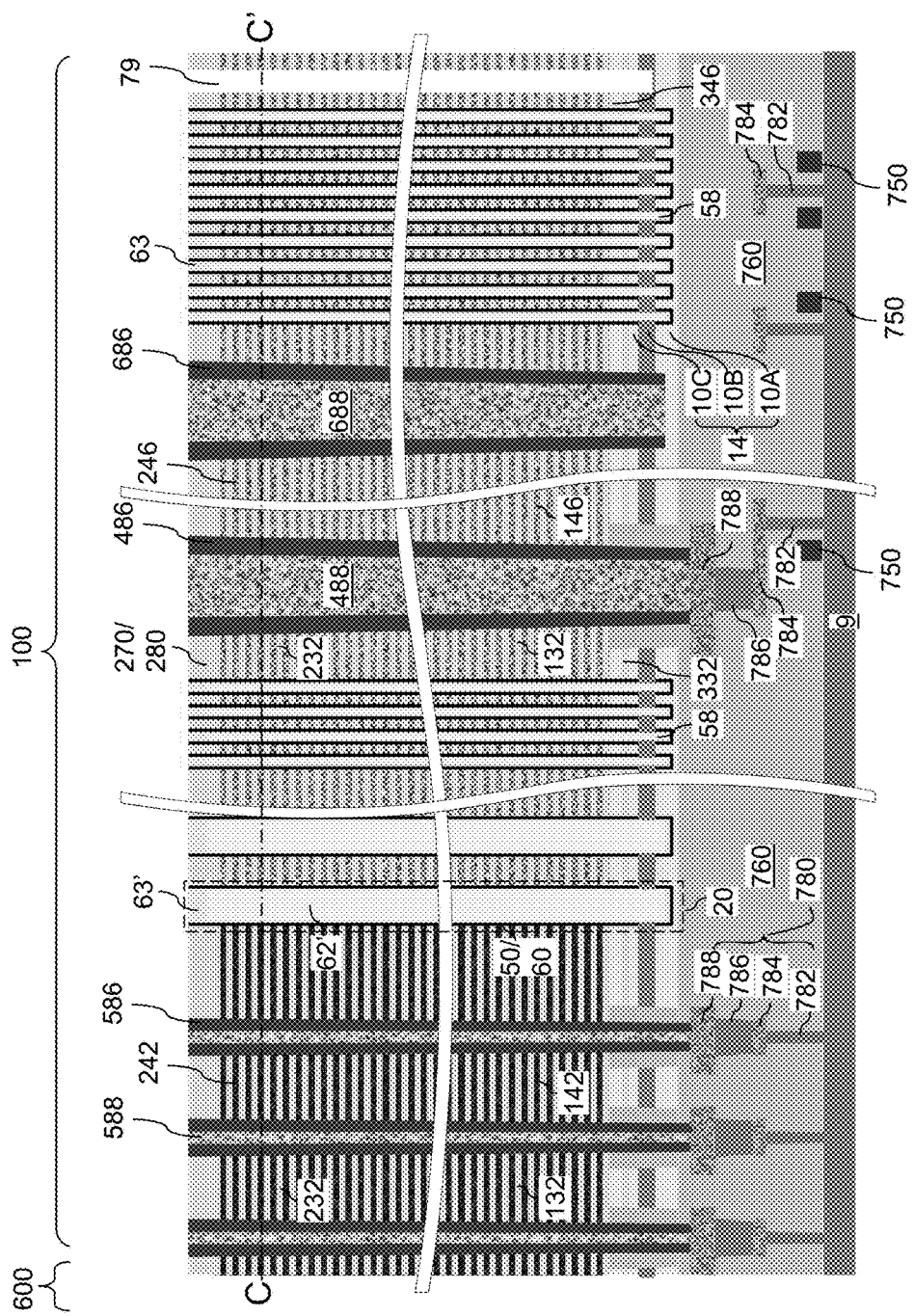
FIG. 26A is a vertical cross-sectional view of the second exemplary structure after formation of electrically conductive layers in the backside recesses according to an embodiment of the present disclosure.
Figure 26B:
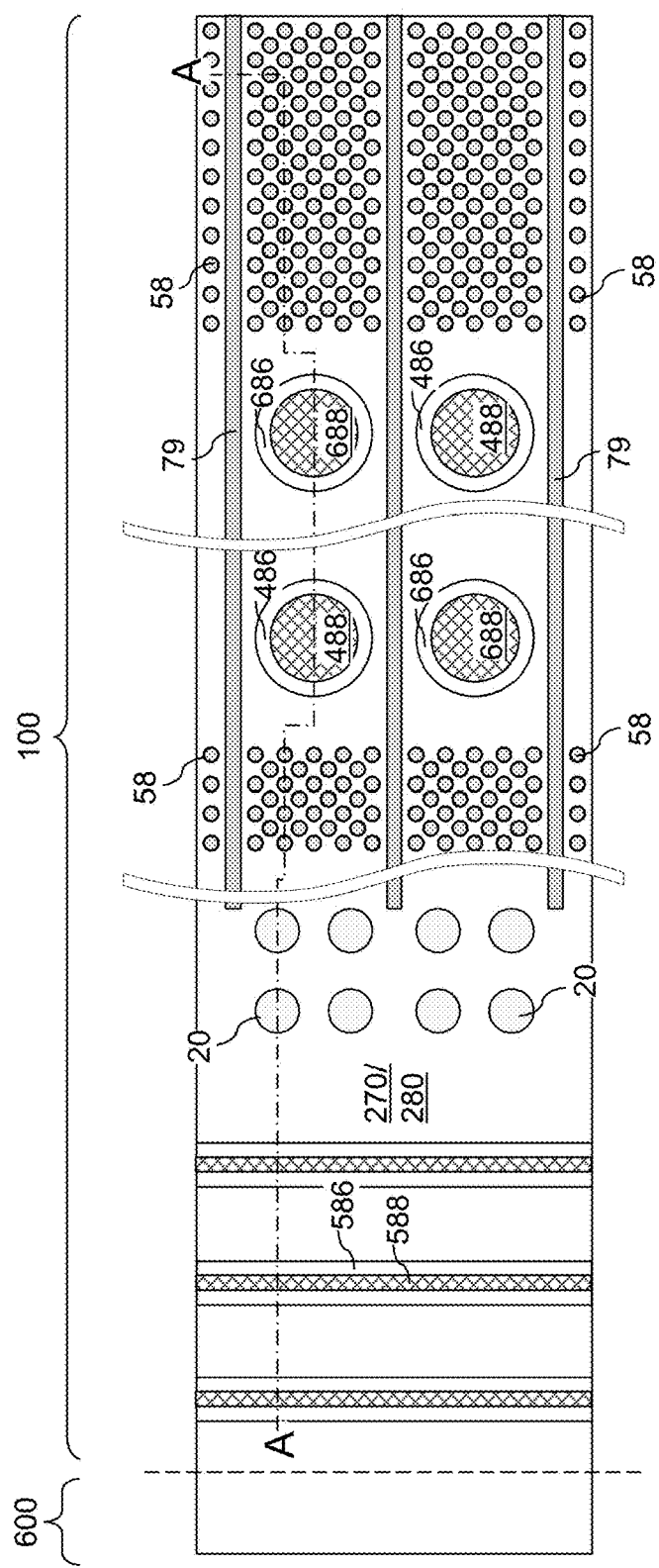
FIG. 26B is a top-down view of the second exemplary structure of FIG. 26A.
Figure 26C:
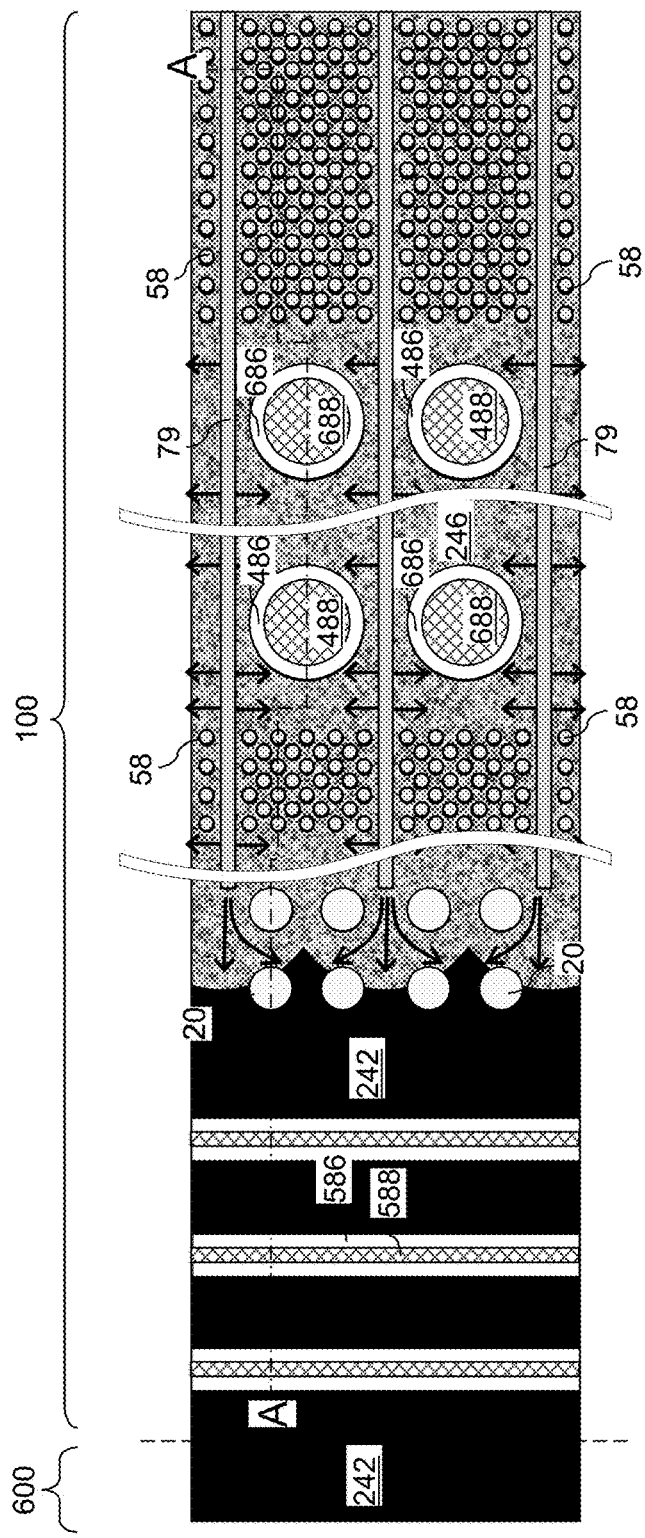
FIG. 26C is a horizontal cross-sectional view along the horizontal plane C-C' of the second exemplary structure of FIG. 26A.

Referring to FIGS. 26A-26C, first and second electrically conductive layers (146, 246) are formed in the first and second backside recesses (143, 243) by deposition of at least one conductive material. Processing steps of FIGS. 11A and 11B can be performed to form the first and second electrically conductive layers (146, 246). The electrically conductive layers (146, 246) can include first electrically conductive layers 146 that are formed in the first backside recesses 143 and second electrically conductive layers 246 that are formed in the second backside recesses 243. The directions of the metal fill within the backside recesses (143, 243) are illustrated by arrows in FIG. 26C. Since the first and second dielectric material layers (142, 242) that are distal from the backside trenches 79 are not removed, the backside recesses (143, 243) do not extend to the border areas containing the moat fill contact via structures 588 proximal to the kerf region 600. Therefore, in one embodiment, the sealing ring structures 199 containing the moat contact via structures 588 do not extend through the electrically conductive layers (146, 246) (e.g., word lines of NAND devices), and instead the sealing ring structures 199 extend through the second alternating stacks of insulating layers (132, 232) and dielectric material layers (142, 242).

Generally, portions of the dielectric material layers (142, 242) in the pair of in-process alternating stacks (132, 142, 232, 242) in the memory array regions 100 can be replaced with electrically conductive layers (146, 246) within each semiconductor die. The pair of in-process alternating stacks (132, 142, 232, 242) is converted into a pair of first alternating stacks (132, 146, 232, 246) of first portions of the insulating layers (132, 232) and the electrically conductive layers (146, 246) and including respective stepped surfaces in the terrace regions (within the contact regions 200) and a pair of second alternating stacks (132, 142, 232, 242) of second portions of the insulating layers (132, 232) and remaining portions of dielectric material layers (142, 242) laterally adjoined to a respective one of the first alternating stacks (132, 146, 232, 246). Each second portion of the insulating layers (132, 232) can be connected to a respective one of the first portions of the insulating layers (132, 232).

Figure 27A:
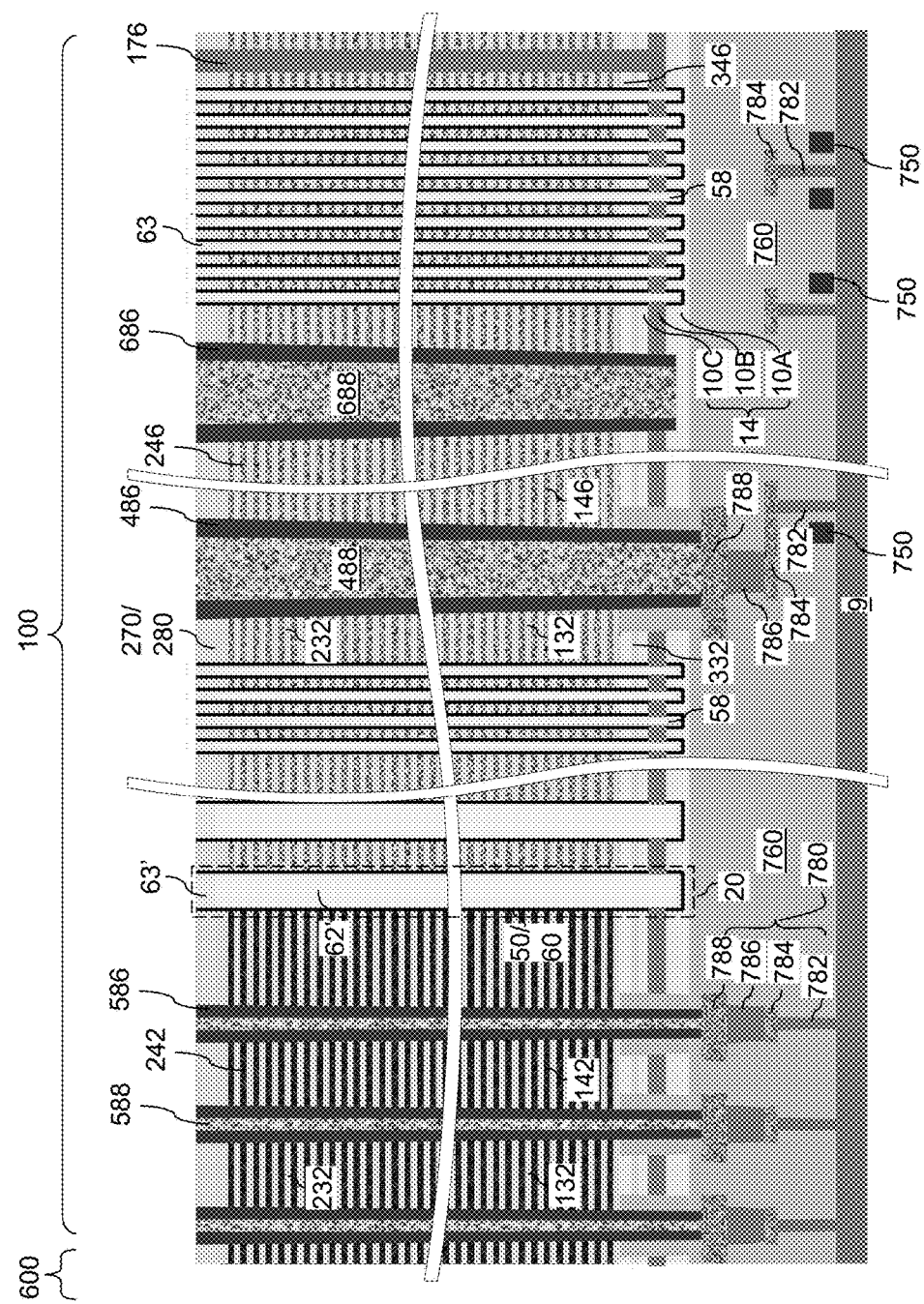
FIG. 27A is a vertical cross-sectional view of the second exemplary structure after formation of an insulating wall structure in each backside trench according to an embodiment of the present disclosure.
Figure 27B:
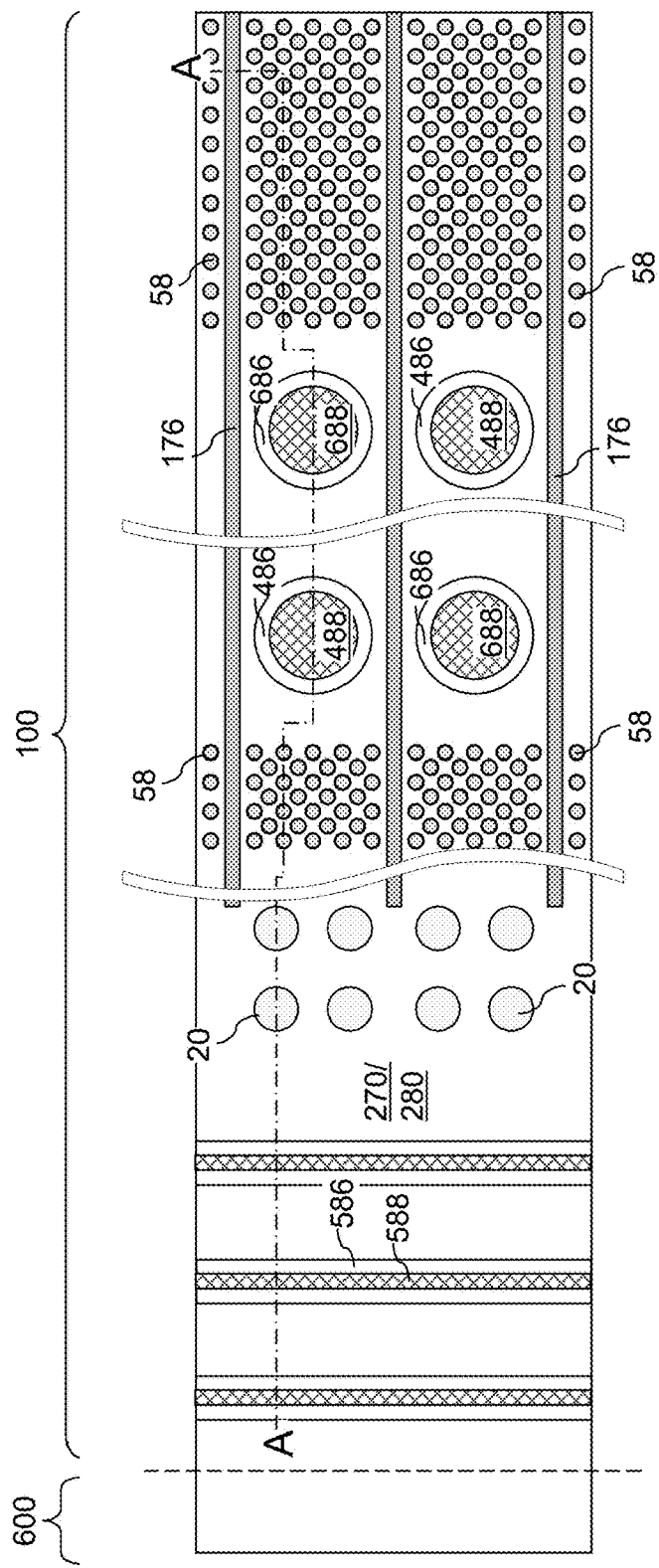
FIG. 27B is a top-down view of the second exemplary structure of FIG. 27A.

Referring to FIGS. 27A and 27B, an insulating material can be deposited in each backside trench 79. An insulating wall structure 176 can be formed in each backside trench 79.

Figure 28:
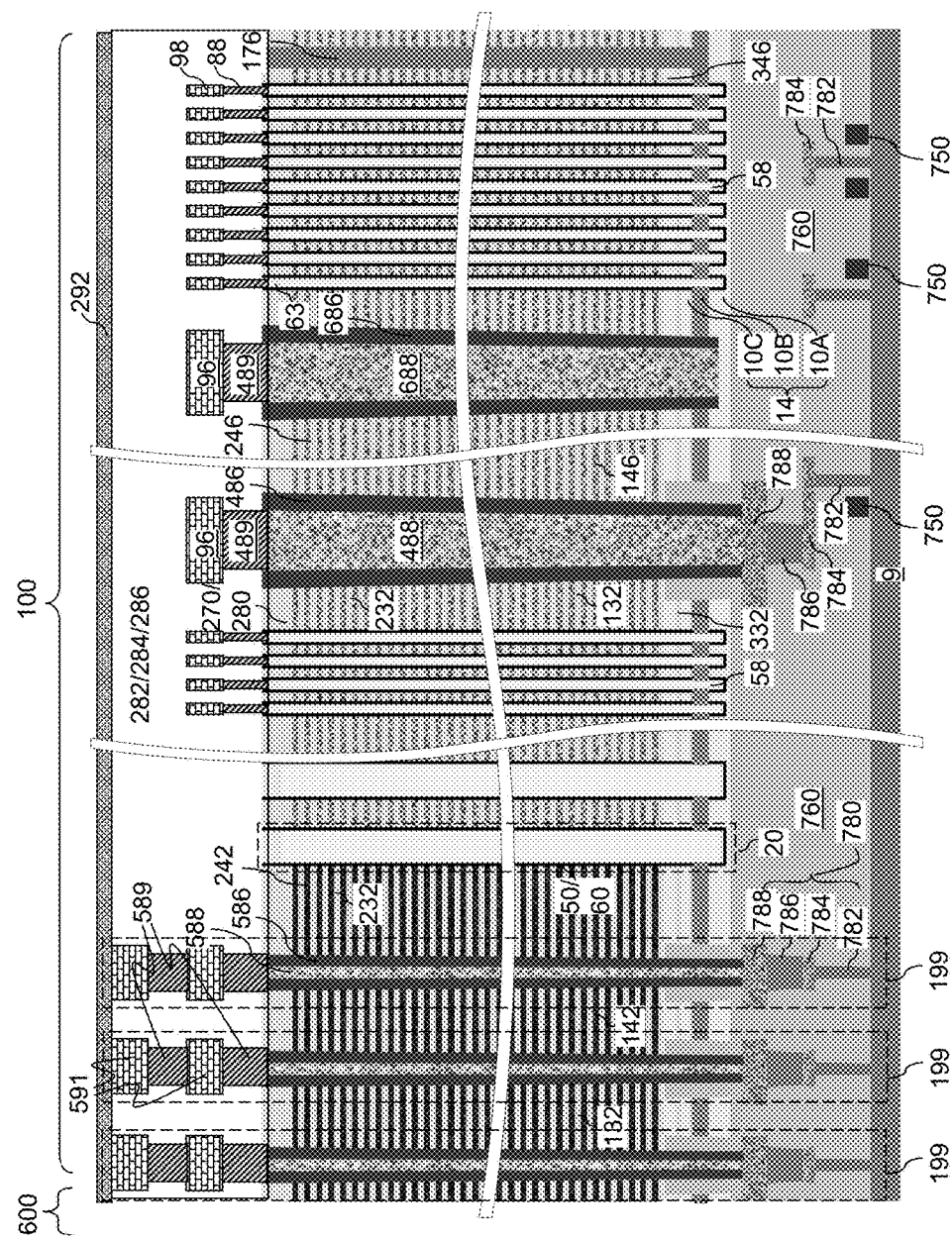
FIG. 28 is a vertical cross-sectional view of the second exemplary structure after formation of upper interconnect level dielectric layers, upper metal interconnect structures, and a passivation dielectric layer according to an embodiment of the present disclosure.

Referring to FIG. 28, upper interconnect level dielectric layers (282, 284, 286) and upper metal interconnect structures (88, 98, 489, 96, 589, 591) can be formed over the first alternating stacks (132, 146, 232, 246) of first portions of the insulating layers (132, 232) and the electrically conductive layers (146, 246). The upper interconnect level dielectric layers (282, 284, 286) can include, for example, a second contact level dielectric layer 282, at least one upper interconnect level dielectric layer 284, and optional additional upper interconnect level dielectric layers 286. The upper metal interconnect structures (88, 98, 489, 96, 589, 591) can include drain contact via structures 88, bit lines 98, contact extension via structures 489, upper metal line structures 96, moat via structures 589, and moat line structures 591. Each drain contact via structure 88 contacts a top surface of a respective one of the drain structures 63. The bit lines 98 can be electrically connected to a respective subset of drain regions 63 through a respective subset of the drain contact via structures 88. The contact extension via structures 489 can contact a top surface of a respective one of the through-memory-level via structures 488 or a respective one of the source contact via structures 688 that contacts a respective buried source layer 14. The upper metal line structures 96 may be electrically connected to a respective one of the through-memory-level via structures 488, the source contact via structures 688, and/or the word line contact via structures 86 (shown in FIG. 14).

The moat via structures 589 can be located at each via level of the upper interconnect level dielectric layers (282, 284, 286), and can include first continuous enclosing metal structures that laterally enclose the entire area of semiconductor devices within a respective semiconductor chip or die. The moat line structures 591 can be located at each line level of the upper interconnect level dielectric layers (282, 284, 296), and can include second continuous enclosing metal structures that laterally enclose the entire area of semiconductor devices within a respective semiconductor chip or die.

A passivation dielectric layer 292 comprising a diffusion-blocking material (such as silicon nitride) can be formed over an entire area of the semiconductor substrate (8, 9) (and thus, over the entire area of each semiconductor chip) prior to dicing. Front side metal contact pads 960 (shown in FIGS. 15A and 16A) can be formed through the passivation dielectric layer 292. Through-substrate-via structures 980 and backside metal contact pads 990 (shown in FIGS. 15C and 16B) can be optionally formed on the back side.

A set of at least one seal ring structure 199 is formed at a periphery of a combination of the pair of first alternating stacks (132, 146, 232, 246), the set of contiguous dielectric material portions (165, 265), and the pair of second alternating stacks (132, 142, 232, 242). Each of the at least one seal ring structure 199 extends from a top surface of the semiconductor substrate (8, 9) to a bottom surface of the passivation dielectric layer 292 to provide a diffusion barrier structure for the semiconductor chip. Each seal ring structure 199 comprises a moat fill via structure 588, a subset of the lower metal interconnect structures 780 that includes continuous enclosing metal structures at each level of the lower interconnect level dielectric layers 760 between the semiconductor substrate (8, 9) and the moat fill via structure 588 and laterally enclosing all semiconductor devices in a semiconductor chip, a set of moat via structures 589, and a set of moat line structures 591. Each seal ring structure 199 can continuously extend from a top surface of the semiconductor substrate (8, 9) to a bottom surface of the passivation dielectric layer 592.

Subsequently, the first or second exemplary structure can be diced through remaining portions of the vertically alternating sequence (132, 242, 232, 242) and/or the set of contiguous dielectric material portions (165, 265) that are located outside an area enclosed by the set of at least one seal ring structure 199 and through the semiconductor substrate (8, 9) to provide a diced structure. A semiconductor chip 900 can comprise the diced structure.

Each diced semiconductor chip 900 can include a pair of first die sidewalls 297 and a pair of second die sidewalls 298 between a top surface and a bottom surface. In each diced semiconductor chip, the passivation dielectric layer 292 laterally extends continuously between the pair of first die sidewalls and between the pair of second die sidewalls. The passivation dielectric layer 292 can overlie each of the pair of first alternating stacks (132, 146, 232, 246), the groups of memory stack structures 55, and the set of contiguous dielectric material portions (165, 265). Each of the at least one seal ring structure 199 extends from a top surface of the semiconductor substrate (8, 9) to a bottom surface of the passivation dielectric layer 292 to provide a diffusion barrier structure for the semiconductor chip.

Figure 29A:
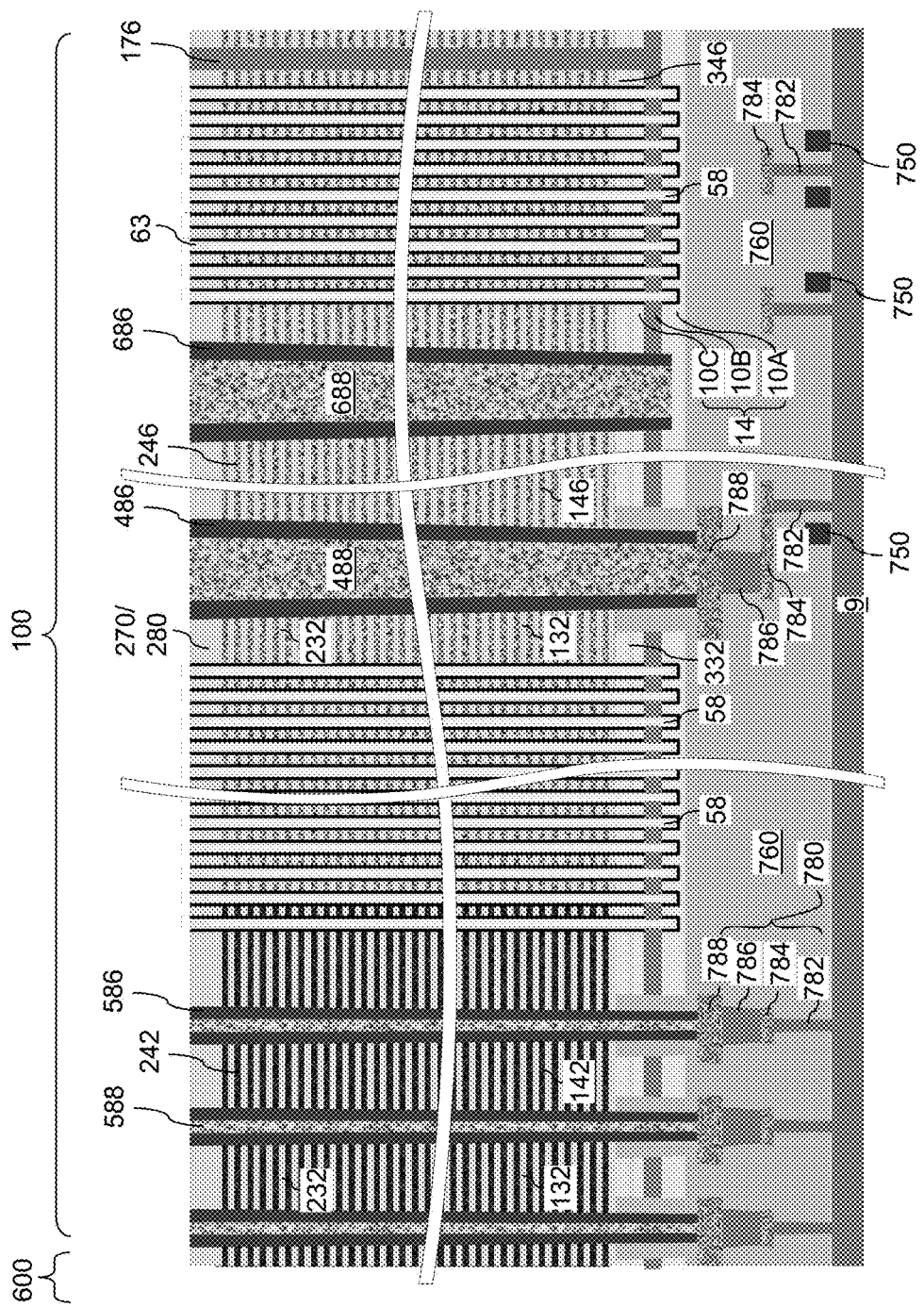
FIG. 29A is a vertical cross-sectional view of an alternate embodiment of the second exemplary structure after formation of an insulating wall structure in each backside trench according to an embodiment of the present disclosure.
Figure 29B:
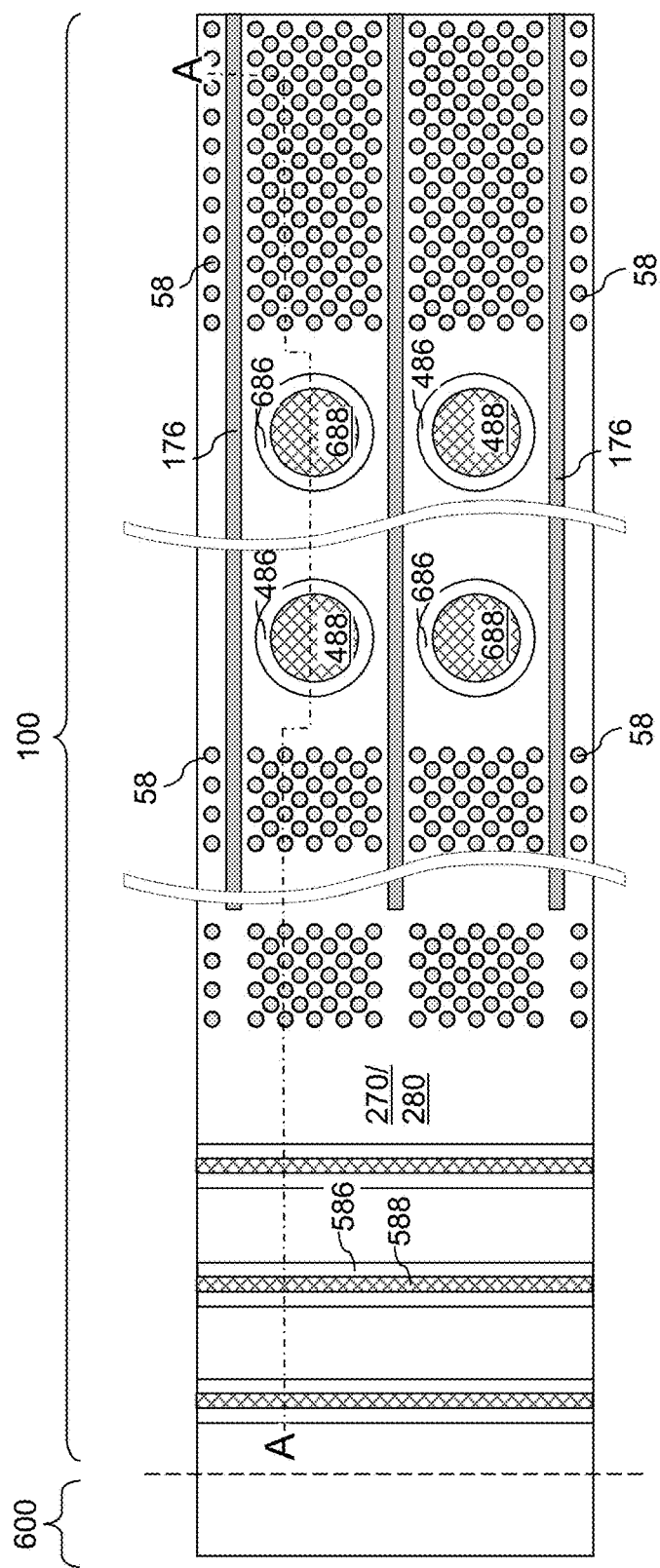
FIG. 29B is a top-down view of the second exemplary structure of FIG. 29A.

Referring to FIGS. 29A and 29B, an alternate embodiment of the second exemplary structure is illustrated after formation of an insulating wall structure 176 in each backside trench 79. In this embodiment, the support pillar structures 20 can be omitted and additional memory opening fill structures 58 can be formed in the region occupied by the support pillar structures 20 in the prior embodiment.

Figure 30:
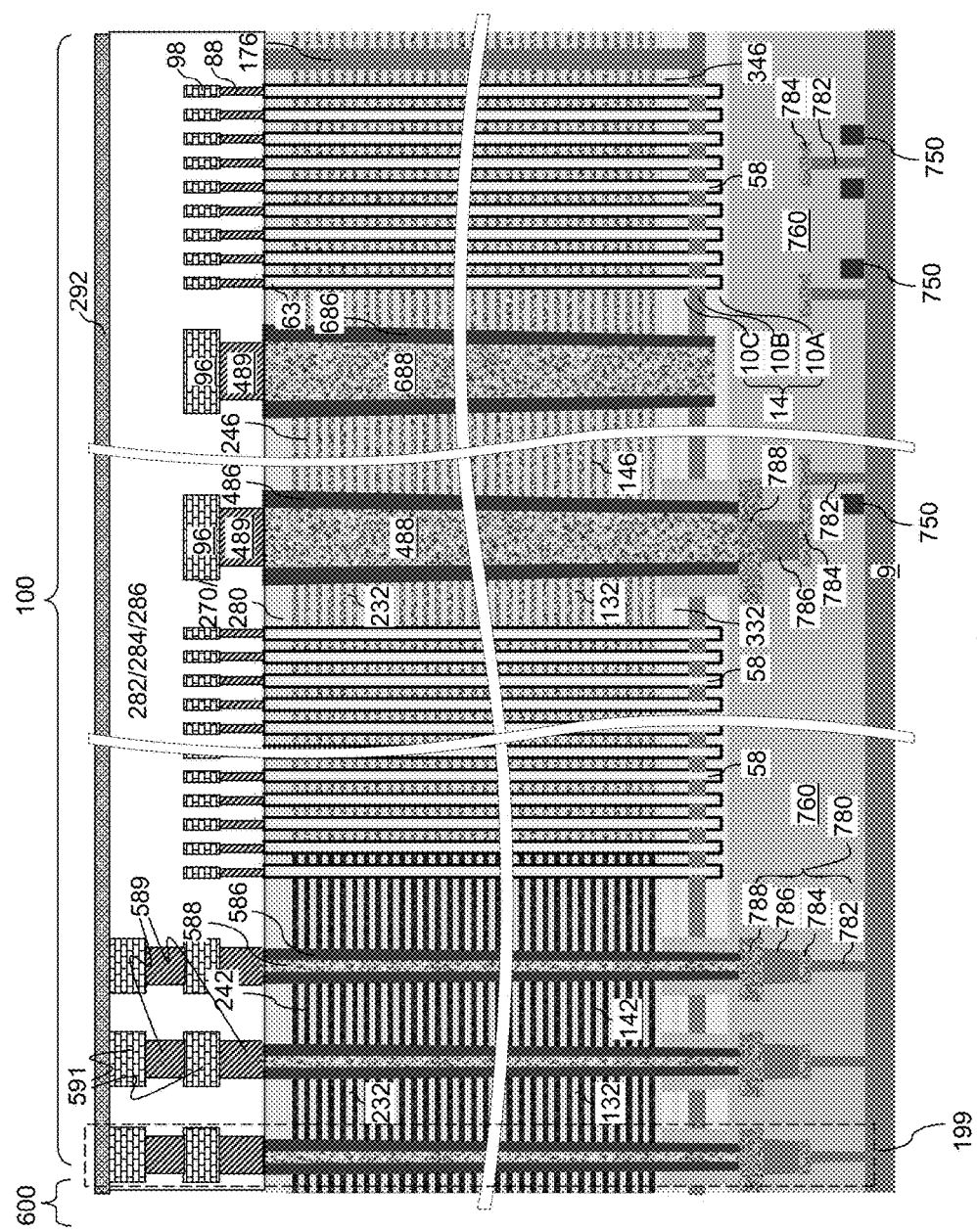
FIG. 30 is a vertical cross-sectional view of an alternate embodiment of the second exemplary structure after formation of upper interconnect level dielectric layers, upper metal interconnect structures, and a passivation dielectric layer according to an embodiment of the present disclosure.

Referring to FIG. 30, the alternative embodiment of the second exemplary structure is illustrated after formation of upper interconnect level dielectric layers (282, 284, 286), upper metal interconnect structures (88, 98, 489, 96, 589, 591), and a passivation dielectric layer 292.

Referring to FIGS. 15A-15C and 16A-16C, the various structures and methods of the present disclosure can provide at least one seal ring structure 199 that extends through an alternating stack of insulating layers (132, 232) and dielectric material layers (142, 242) that are remaining portions of sacrificial material layers (142, 242). The remaining portions of sacrificial material layers (142, 242) extend into the kerf regions 600. Thus, alternating stacks of material layers need not be patterned at the borders between the memory array regions 100 and the kerf regions 600.

Figure 31A:
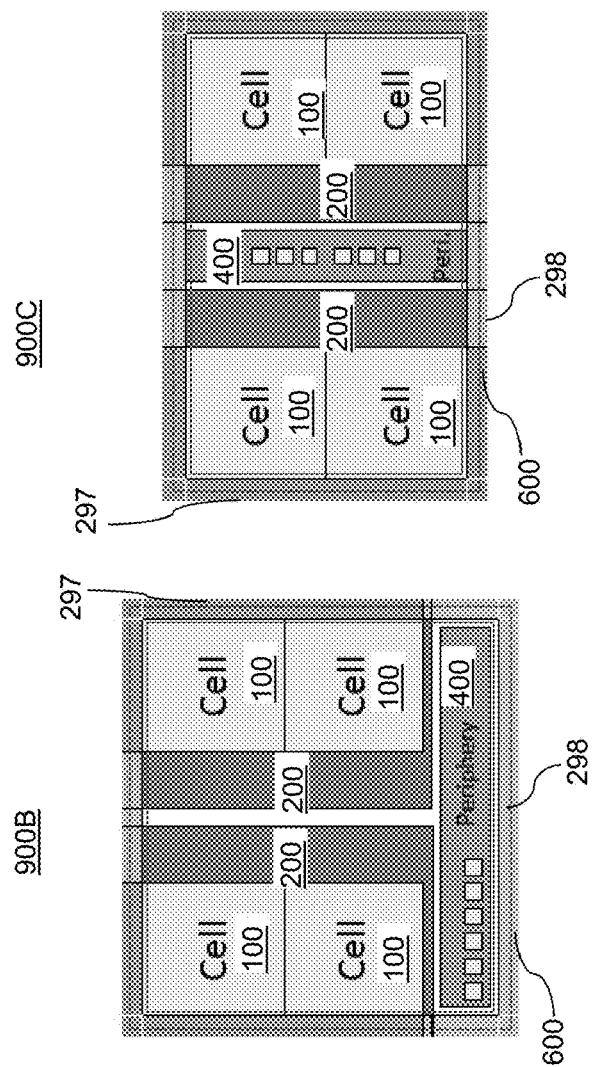
FIG. 31A is a plan view of a comparative diced semiconductor chip.
Figure 31B:
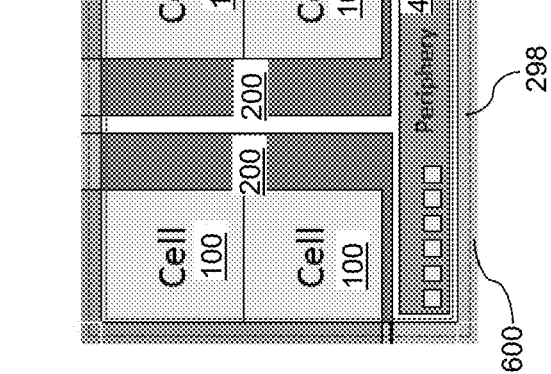
FIG. 31B is a plan view of a first layout of a diced semiconductor chip according to the first embodiment of the present disclosure.
Figure 31C:
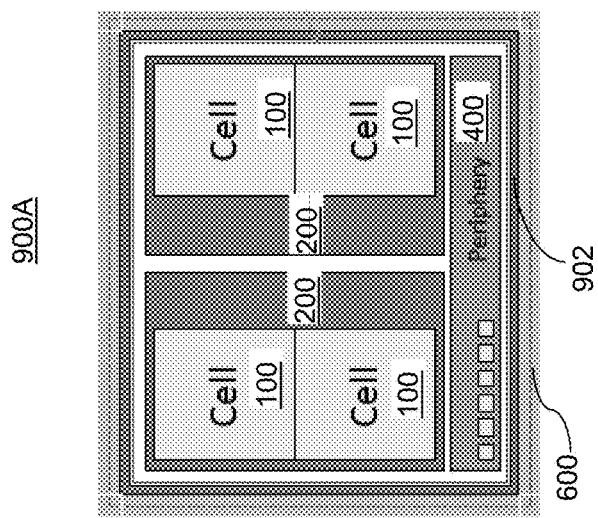
FIG. 31C is a plan view of a second layout of a diced semiconductor chip according to the second embodiment of the present disclosure.

FIG. 31A is a plan view of a comparative diced semiconductor chip 900A, FIG. 31B is a plan view of a first layout of a diced semiconductor chip 900B which corresponds to one die 800 of FIG. 15A according to the first embodiment of the present disclosure, and FIG. 31C is a plan view of a second layout of a diced semiconductor chip 900C which correspond to one die 800 of FIG. 16A according to the second embodiment of the present disclosure. As shown in FIG. 31 the comparative semiconductor chip 900A is surrounded by a dummy staircase 902. Thus, any sealing ring structures would extend through the dummy staircase 902, which decreases useful active device area. In contrast, a compact chip (900B, 900C) layout can be provided by allowing the at least one seal ring structure 199 to be formed through remaining portions of in-process alternating stack of insulating layers (132, 232) and sacrificial material layers (142, 242). It has been estimated that the layout of semiconductor chip 900B shown in FIG. 31B can reduce a chip area by about 3% relative to the comparative semiconductor chip 900A of FIG. 31A in which alternating stacks of material layers are patterned to provide kerf regions that contain dummy staircases 902. Further, it has been estimated that the layout of the semiconductor chip 900C shown in FIG. 31C can further reduce a chip area by additional 3% relative to the to the comparative semiconductor chip 900A of FIG. 31A. Therefore, in one embodiment, the sealing ring structures 199 of the embodiment semiconductor chips (900B, 900C) of FIGS. 31B and 31C do not extend through a staircase region, such as a dummy staircase region 902 of FIG. 31A. Thus, compact semiconductor chips can be provided by the methods of the present disclosure.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor die, comprising:
   a pair of first alternating stacks of first portions of insulating layers and electrically conductive layers located over a semiconductor substrate;
   groups of memory stack structures vertically extending through a respective one of the pair of the first alternating stacks, wherein each of the memory stack structures comprises a memory film and a vertical semiconductor channel laterally surrounded by the memory film;
   a pair of second alternating stacks of second portions of the insulating layers and dielectric material layers laterally adjoined to a respective one of the first alternating stacks, wherein each second portion of the insulating layers is connected to a respective one of the first portions of the insulating layers; and
   at least one seal ring structure laterally enclosing, and laterally spaced from, the pair of first alternating stacks, and contacting at least a first sidewall of each of the pair of second alternating stacks.

2. The semiconductor die of claim 1, further comprising:
   stepped surfaces of layers of the pair of first alternating stacks located in a respective terrace region; and a set of contiguous dielectric material portions located between the pair of first alternating stacks and overlying the stepped surfaces of the pair of first alternating stacks.

3. The semiconductor die of claim 1, wherein the at least one seal ring structure comprises a moat trench filled with a contact via structure which electrically contacts underlying lower interconnect structures.

4. The semiconductor die of claim 1, further comprising a passivation dielectric layer comprising a diffusion-blocking material overlying each of the pair of first alternating stacks and the groups of memory stack structures, wherein the at least one seal ring structure extends from a top surface of the semiconductor substrate to a bottom surface of the passivation dielectric layer to provide a diffusion barrier structure for the semiconductor die.

5. The semiconductor die of claim 1, wherein:
the semiconductor die comprises a monolithic three-dimensional NAND memory device;
the electrically conductive layers comprise, or are electrically connected to, a respective word line of the monolithic three-dimensional NAND memory device;
bottom ends of the memory stack structures contact a semiconductor material layer;
the memory stack structures comprise an array of monolithic three-dimensional NAND strings of the monolithic three-dimensional NAND memory device;
an integrated circuit comprising a driver circuit for monolithic three-dimensional NAND memory device is located on the semiconductor substrate;
the electrically conductive layers comprise a plurality of control gate electrodes having a strip shape extending substantially parallel to the top surface of the semiconductor substrate; and
the array of monolithic three-dimensional NAND strings comprises:
a plurality of semiconductor channels, wherein at least one end portion of each of the plurality of semiconductor channels extends substantially perpendicular to a top surface of the semiconductor substrate, and
a plurality of charge storage elements, each charge storage element located adjacent to a respective one of the plurality of semiconductor channels.

6. The semiconductor die of claim 1, wherein the at least one sealing ring structure does not extend through a dummy staircase region.

7. A diced semiconductor chip, comprising the die of claim 1.

8. The diced semiconductor chip of claim 7, wherein:
the diced semiconductor chip comprises a pair of first die sidewalls and a pair of second die sidewalls that are perpendicular to the pair of first die sidewalls; and
the at least one seal ring structure comprises first linear sections that laterally extend parallel to the pair of first die sidewalls and second linear sections that laterally extend parallel to the pair of second die sidewalls.

9. The semiconductor die of claim 2, wherein a first linear section of the least one seal ring structure contacts the first sidewall of each of the pair of second alternating stacks and does not contact the set of contiguous dielectric material portions, and a second linear section of the at least one seal ring structure contacts the set of contiguous dielectric material portions.

10. The semiconductor die of claim 2, wherein a first linear section of the least one seal ring structure contacts the first sidewall of each of the pair of second alternating stacks and does not contact the set of contiguous dielectric material portions, and a second linear section of the at least one seal ring structure contacts a second sidewall of each of the pair of second alternating stacks and does not contact the set of contiguous dielectric material portions.

11. The semiconductor die of claim 4, further comprising:
semiconductor devices located on a top surface of the semiconductor substrate;
lower interconnect level dielectric layers located over the semiconductor devices and embedding lower interconnect structures that are electrically connected to a respective one of the semiconductor devices, wherein the pair of first alternating stacks, the groups of memory stack structures, and the pair of second alternating stacks are located above the lower interconnect level dielectric layers; and
upper interconnect level dielectric layers located over the pair of first alternating stacks, the groups of memory stack structures, and the pair of second alternating stacks and embedding upper interconnect structures and underlying the passivation dielectric layer.

12. The semiconductor chip of claim 8, wherein a continuous interface between the at least one seal ring structure and one of the second alternating stacks extends parallel to the pair of first die sidewalls for a lateral distance that is greater than 80% of a maximum lateral distance of each of the first die sidewalls, and extends parallel to the pair of second die sidewalls for a lateral distance that is less than 50% of a maximum lateral distance of each of the second die sidewalls.

13. The semiconductor chip of claim 8, wherein a continuous interface between the at least one seal ring structure and one of the second alternating stacks extends parallel to the pair of first die sidewalls for a lateral distance that is greater than 99% of a maximum lateral distance of each of the first die sidewalls, and extends in proximity to, and parallel to, each of the pair of second die sidewalls for a lateral distance that is less than 50% of a maximum lateral distance of each of the second die sidewalls.

14. A method of manufacturing a semiconductor die, comprising:
forming a vertically alternating sequence of continuous insulating layers and continuous dielectric material layers having a different composition than the continuous insulating layers over a semiconductor substrate;
patterning the vertically alternating sequence such that patterned portions of the vertically alternating sequence comprise a pair of in-process alternating stacks of insulating layers and dielectric material layers and such that stepped surfaces of layers of the pair of in-process alternating stacks are provided in a respective terrace region;
forming a set of contiguous dielectric material portions between the pair of in-process alternating stacks and over the stepped surfaces of the pair of first alternating stacks;
forming groups of memory stack structures vertically extending through the pair of in-process alternating stacks, wherein each of the memory stack structures comprises a memory film and a vertical semiconductor channel laterally surrounded by the memory film;
replacing portions of the dielectric material layers in the pair of in-process alternating stacks with electrically conductive layers, wherein the pair of in-process alternating stacks is converted into a pair of first alternating stacks of first portions of the insulating layers and the electrically conductive layers and including respective stepped surfaces in the terrace regions, and a pair of second alternating stacks of second portions of the insulating layers and remaining portions of dielectric material layers laterally adjoined to a respective one of the first alternating stacks, wherein each second portion of the insulating layers is connected to a respective one of the first portions of the insulating layers; and forming at least one seal ring structure through the pair of second alternating stacks, and surrounding of the pair of first alternating stacks.

15. The method of claim 14, further comprising dicing through the pair of second alternating stacks and through the semiconductor substrate to provide diced structures, wherein each of the diced structures comprises a semiconductor chip.

16. The method of claim 15, further comprising forming a passivation dielectric layer comprising a diffusion-blocking material over an entire area of the semiconductor die prior to the dicing, wherein the at least one seal ring structure extends from a top surface of the semiconductor substrate to a bottom surface of the passivation dielectric layer to provide a diffusion barrier structure for the semiconductor chip.

17. The method of claim 15, wherein:
the semiconductor chip has a rectangular shape in a plan view;
the semiconductor chip comprises a pair of first die sidewalls and a pair of second die sidewalls that are perpendicular to the pair of first die sidewalls;
the at least one seal ring structure includes first linear sections that laterally extend parallel to the pair of first die sidewalls and second linear sections that laterally extend parallel to the pair of second die sidewalls; and each first linear section of one of the at least one seal ring structure contacts a sidewall of a respective one of the pair of second alternating stacks.

18. The method of claim 17, wherein a second linear section of the at least one seal ring structure contacts another sidewall of each of the pair of second alternating stacks.

19. The method of claim 17, wherein a second linear section of the at least one seal ring structure contacts the set of contiguous dielectric material portions, and does not contact the pair of second alternating stacks.

20. The method of claim 16, further comprising:
forming semiconductor devices on a top surface of the semiconductor substrate;
forming lower interconnect level dielectric layers embedding lower interconnect structures that are electrically connected to a respective one of the semiconductor devices over the semiconductor devices, wherein the pair of first alternating stacks, the groups of memory stack structures, the set of contiguous dielectric material portions, and the pair of second alternating stacks are formed above the lower interconnect level dielectric layers; and
forming upper interconnect level dielectric layers located over the pair of first alternating stacks, the groups of memory stack structures, the set of contiguous dielectric material portions, and the pair of second alternating stacks and embedding upper interconnect structures, wherein the passivation dielectric layer is formed over the upper interconnect level dielectric layers.

* * * * *